United States Patent
Chaji et al.

(10) Patent No.: US 10,996,258 B2
(45) Date of Patent: May 4, 2021

(54) DEFECT DETECTION AND CORRECTION OF PIXEL CIRCUITS FOR AMOLED DISPLAYS

(71) Applicant: Ignis Innovation Inc., Waterloo (CA)

(72) Inventors: Gholamrezà Chaji, Waterloo (CA); Jaimal Soni, Waterloo (CA); Jonathan Jekir, Waterloo (CA); Allyson Giannikouris, Kitchener (CA)

(73) Assignee: Ignis Innovation Inc., Waterloo (CA)

( * ) Notice: Subject to any disclaimer, the term of this patent is extended or adjusted under 35 U.S.C. 154(b) by 128 days.

(21) Appl. No.: 14/291,231

(22) Filed: May 30, 2014

(65) Prior Publication Data

US 2014/0329339 A1    Nov. 6, 2014

Related U.S. Application Data

(63) Continuation-in-part of application No. 13/890,926, filed on May 9, 2013, which is a continuation-in-part
(Continued)

(30) Foreign Application Priority Data

Nov. 30, 2009    (CA) .................................. CA 2688870

(51) Int. Cl.
   *G01R 31/26*     (2020.01)
   *G09G 3/00*      (2006.01)
   *G09G 3/3233*    (2016.01)

(52) U.S. Cl.
   CPC .............. *G01R 31/26* (2013.01); *G09G 3/006* (2013.01); *G09G 3/3233* (2013.01);
(Continued)

(58) Field of Classification Search
   CPC ...... G01R 31/26; G09G 3/006; G09G 3/3233; G09G 2300/0842; G09G 2320/0285;
(Continued)

(56) References Cited

U.S. PATENT DOCUMENTS 3,506,851 A    4/1970    Polkinghorn et al.
3,774,055 A    11/1973   Bapat et al.
(Continued)

FOREIGN PATENT DOCUMENTS

CA    1 294 034    1/1992
CA    2 109 951    11/1992
(Continued)

OTHER PUBLICATIONS

Ahnood et al.: "Effect of threshold voltage instability on field effect mobility in thin film transistors deduced from constant current measurements"; dated Aug. 2009.
(Continued)

*Primary Examiner* — Alexander Satanovsky
(74) *Attorney, Agent, or Firm* — Stratford Managers Corporation

(57) ABSTRACT

A method of testing an array-based semiconductor device for defects during fabrication of the semiconductor device detects defects in said entities forming the semiconductor device at an intermediate stage in the fabrication of multiple types of entities forming the semiconductor device; determines whether the detected defects exceed preselected thresholds for the types of entities in which said detects are detected; if the detected defects do not exceed said preselected thresholds, continues the fabrication of the semiconductor device; and if the detected defects exceed said preselected thresholds, identifies the types of defects detected, repairs the identified defects, and continues the fabrication of the semiconductor device.

8 Claims, 24 Drawing Sheets

Related U.S. Application Data of application No. 13/869,399, filed on Apr. 24, 2013, which is a continuation-in-part of application No. 12/956,842, filed on Nov. 30, 2010, now Pat. No. 8,914,246, application No. 14/291,231, which is a continuation-in-part of application No. 14/257,113, filed on Apr. 21, 2014.

(60) Provisional application No. 61/861,614, filed on Aug. 2, 2013, provisional application No. 61/814,580, filed on Apr. 22, 2013.

(52) U.S. Cl.
CPC ............ G09G 2300/0842 (2013.01); G09G 2320/029 (2013.01); G09G 2320/0285 (2013.01); G09G 2320/0295 (2013.01); G09G 2320/045 (2013.01)

(58) Field of Classification Search
CPC ..... G09G 2320/029; G09G 2320/0295; G09G 2320/043; G09G 2320/045
See application file for complete search history.

(56) References Cited

U.S. PATENT DOCUMENTS

| | | |
|---|---|---|
| 4,090,096 A | 5/1978 | Nagami |
| 4,160,934 A | 7/1979 | Kirsch |
| 4,354,162 A | 10/1982 | Wright |
| 4,943,956 A | 7/1990 | Noro |
| 4,996,523 A | 2/1991 | Bell et al. |
| 5,153,420 A | 10/1992 | Hack et al. |
| 5,198,803 A | 3/1993 | Shie et al. |
| 5,204,661 A | 4/1993 | Hack et al. |
| 5,266,515 A | 11/1993 | Robb et al. |
| 5,489,918 A | 2/1996 | Mosier |
| 5,498,880 A | 3/1996 | Lee et al. |
| 5,557,342 A | 9/1996 | Eto et al. |
| 5,572,444 A | 11/1996 | Lentz et al. |
| 5,589,847 A | 12/1996 | Lewis |
| 5,619,033 A | 4/1997 | Weisfield |
| 5,648,276 A | 7/1997 | Hara et al. |
| 5,670,973 A | 9/1997 | Bassetti et al. |
| 5,691,783 A | 11/1997 | Numao et al. |
| 5,714,968 A | 2/1998 | Ikeda |
| 5,723,950 A | 3/1998 | Wei et al. |
| 5,744,824 A | 4/1998 | Kousai et al. |
| 5,745,660 A | 4/1998 | Kolpatzik et al. |
| 5,748,160 A | 5/1998 | Shieh et al. |
| 5,815,303 A | 9/1998 | Berlin |
| 5,870,071 A | 2/1999 | Kawahata |
| 5,874,803 A | 2/1999 | Garbuzov et al. |
| 5,880,582 A | 3/1999 | Sawada |
| 5,903,248 A | 5/1999 | Irwin |
| 5,917,280 A | 6/1999 | Burrows et al. |
| 5,923,794 A | 7/1999 | McGrath et al. |
| 5,945,972 A | 8/1999 | Okumura et al. |
| 5,949,398 A | 9/1999 | Kim |
| 5,952,789 A | 9/1999 | Stewart et al. |
| 5,952,991 A | 9/1999 | Akiyama et al. |
| 5,982,104 A | 11/1999 | Sasaki et al. |
| 5,990,629 A | 11/1999 | Yamada et al. |
| 6,023,259 A | 2/2000 | Howard et al. |
| 6,069,365 A | 5/2000 | Chow et al. |
| 6,091,203 A | 7/2000 | Kawashima et al. |
| 6,097,360 A | 8/2000 | Holloman |
| 6,144,222 A | 11/2000 | Ho |
| 6,177,915 B1 | 1/2001 | Beeteson et al. |
| 6,229,506 B1 | 5/2001 | Dawson et al. |
| 6,229,508 B1 | 5/2001 | Kane |
| 6,246,180 B1 | 6/2001 | Nishigaki |
| 6,252,248 B1 | 6/2001 | Sano et al. |
| 6,259,424 B1 | 7/2001 | Kurogane |
| 6,262,589 B1 | 7/2001 | Tamukai |
| 6,271,825 B1 | 8/2001 | Greene et al. |
| 6,274,978 B1 * | 8/2001 | Roach et al. ............... 313/483 |
| 6,288,696 B1 | 9/2001 | Holloman |
| 6,304,039 B1 | 10/2001 | Appelberg et al. |
| 6,307,322 B1 | 10/2001 | Dawson et al. |
| 6,310,962 B1 | 10/2001 | Chung et al. |
| 6,320,325 B1 | 11/2001 | Cok et al. |
| 6,323,631 B1 | 11/2001 | Juang |
| 6,356,029 B1 | 3/2002 | Hunter |
| 6,373,454 B1 | 4/2002 | Knapp et al. |
| 6,392,617 B1 | 5/2002 | Gleason |
| 6,414,661 B1 | 7/2002 | Shen et al. |
| 6,417,825 B1 | 7/2002 | Stewart et al. |
| 6,433,488 B1 | 8/2002 | Bu |
| 6,437,106 B1 | 8/2002 | Stoner et al. |
| 6,445,369 B1 | 9/2002 | Yang et al. |
| 6,475,845 B2 | 11/2002 | Kimura |
| 6,501,098 B2 | 12/2002 | Yamazaki |
| 6,501,466 B1 | 12/2002 | Yamagishi et al. |
| 6,518,962 B2 | 2/2003 | Kimura et al. |
| 6,522,315 B2 | 2/2003 | Ozawa et al. |
| 6,525,683 B1 | 2/2003 | Gu |
| 6,531,827 B2 | 3/2003 | Kawashima |
| 6,542,138 B1 | 4/2003 | Shannon et al. |
| 6,555,420 B1 | 4/2003 | Yamazaki |
| 6,580,408 B1 | 6/2003 | Bae et al. |
| 6,580,657 B2 | 6/2003 | Sanford et al. |
| 6,583,398 B2 | 6/2003 | Harkin |
| 6,583,775 B1 | 6/2003 | Sekiya et al. |
| 6,594,606 B2 | 7/2003 | Everitt |
| 6,618,030 B2 | 9/2003 | Kane et al. |
| 6,639,244 B1 | 10/2003 | Yamazaki et al. |
| 6,668,645 B1 | 12/2003 | Gilmour et al. |
| 6,677,713 B1 | 1/2004 | Sung |
| 6,680,580 B1 | 1/2004 | Sung |
| 6,687,266 B1 | 2/2004 | Ma et al. |
| 6,690,000 B1 | 2/2004 | Muramatsu et al. |
| 6,690,344 B1 | 2/2004 | Takeuchi et al. |
| 6,693,388 B2 | 2/2004 | Oomura |
| 6,693,610 B2 | 2/2004 | Shannon et al. |
| 6,697,057 B2 | 2/2004 | Koyama et al. |
| 6,720,942 B2 | 4/2004 | Lee et al. |
| 6,724,151 B2 | 4/2004 | Yoo |
| 6,724,476 B1 * | 4/2004 | Phan ............... G01N 21/9501 356/237.3 |
| 6,734,636 B2 | 5/2004 | Sanford et al. |
| 6,738,034 B2 | 5/2004 | Kaneko et al. |
| 6,738,035 B1 | 5/2004 | Fan |
| 6,753,655 B2 | 6/2004 | Shih et al. |
| 6,753,834 B2 | 6/2004 | Mikami et al. |
| 6,756,741 B2 | 6/2004 | Li |
| 6,756,952 B1 | 6/2004 | Decaux et al. |
| 6,756,985 B1 | 6/2004 | Furuhashi et al. |
| 6,771,028 B1 | 8/2004 | Winters |
| 6,777,712 B2 | 8/2004 | Sanford et al. |
| 6,777,888 B2 | 8/2004 | Kondo |
| 6,781,567 B2 | 8/2004 | Kimura |
| 6,806,497 B2 | 10/2004 | Jo |
| 6,806,638 B2 | 10/2004 | Lin et al. |
| 6,806,857 B2 | 10/2004 | Sempel et al. |
| 6,809,706 B2 | 10/2004 | Shimoda |
| 6,815,975 B2 | 11/2004 | Nara et al. |
| 6,828,950 B2 | 12/2004 | Koyama |
| 6,853,371 B2 | 2/2005 | Miyajima et al. |
| 6,859,193 B1 | 2/2005 | Yumoto |
| 6,873,117 B2 | 3/2005 | Ishizuka |
| 6,876,346 B2 | 4/2005 | Anzai et al. |
| 6,885,356 B2 | 4/2005 | Hashimoto |
| 6,900,485 B2 | 5/2005 | Lee |
| 6,903,734 B2 | 6/2005 | Eu |
| 6,909,243 B2 | 6/2005 | Inukai |
| 6,909,419 B2 | 6/2005 | Zavracky et al. |
| 6,911,960 B1 | 6/2005 | Yokoyama |
| 6,911,964 B2 | 6/2005 | Lee et al. |
| 6,914,448 B2 | 7/2005 | Jinno |
| 6,919,871 B2 | 7/2005 | Kwon |
| 6,924,602 B2 | 8/2005 | Komiya |
| 6,937,215 B2 | 8/2005 | Lo |
| 6,937,220 B2 | 8/2005 | Kitaura et al. |

(56) References Cited

U.S. PATENT DOCUMENTS

| | | |
|---|---|---|
| 6,940,214 B1 | 9/2005 | Komiya et al. |
| 6,943,500 B2 | 9/2005 | LeChevalier |
| 6,947,022 B2 | 9/2005 | McCartney |
| 6,954,194 B2 | 10/2005 | Matsumoto et al. |
| 6,956,547 B2 | 10/2005 | Bae et al. |
| 6,975,142 B2 | 12/2005 | Azami et al. |
| 6,975,332 B2 | 12/2005 | Arnold et al. |
| 6,995,510 B2 | 2/2006 | Murakami et al. |
| 6,995,519 B2 | 2/2006 | Arnold et al. |
| 7,023,408 B2 | 4/2006 | Chen et al. |
| 7,027,015 B2 | 4/2006 | Booth, Jr. et al. |
| 7,027,078 B2 | 4/2006 | Reihl |
| 7,034,793 B2 | 4/2006 | Sekiya et al. |
| 7,038,392 B2 | 5/2006 | Libsch et al. |
| 7,057,359 B2 | 6/2006 | Hung et al. |
| 7,061,263 B1 | 6/2006 | Ong |
| 7,061,451 B2 | 6/2006 | Kimura |
| 7,064,733 B2 | 6/2006 | Cok et al. |
| 7,071,932 B2 | 7/2006 | Libsch et al. |
| 7,088,051 B1 | 8/2006 | Cok |
| 7,088,052 B2 | 8/2006 | Kimura |
| 7,092,337 B2 * | 8/2006 | Butler ............... G11B 23/00 369/100 |
| 7,102,378 B2 | 9/2006 | Kuo et al. |
| 7,106,285 B2 | 9/2006 | Naugler |
| 7,112,820 B2 | 9/2006 | Chang et al. |
| 7,116,058 B2 | 10/2006 | Lo et al. |
| 7,119,493 B2 | 10/2006 | Fryer et al. |
| 7,122,835 B1 | 10/2006 | Ikeda et al. |
| 7,127,380 B1 | 10/2006 | Iverson et al. |
| 7,129,914 B2 | 10/2006 | Knapp et al. |
| 7,164,417 B2 | 1/2007 | Cok |
| 7,193,589 B2 | 3/2007 | Yoshida et al. |
| 7,224,332 B2 | 5/2007 | Cok |
| 7,227,519 B1 | 6/2007 | Kawase et al. |
| 7,245,277 B2 | 7/2007 | Ishizuka |
| 7,248,236 B2 | 7/2007 | Nathan et al. |
| 7,262,753 B2 | 8/2007 | Tanghe et al. |
| 7,274,363 B2 | 9/2007 | Ishizuka et al. |
| 7,310,092 B2 | 12/2007 | Imamura |
| 7,315,295 B2 | 1/2008 | Kimura |
| 7,321,348 B2 | 1/2008 | Cok et al. |
| 7,339,560 B2 | 3/2008 | Sun |
| 7,355,574 B1 | 4/2008 | Leon et al. |
| 7,358,941 B2 | 4/2008 | Ono et al. |
| 7,368,868 B2 | 5/2008 | Sakamoto |
| 7,411,571 B2 | 8/2008 | Huh |
| 7,414,600 B2 | 8/2008 | Nathan et al. |
| 7,423,617 B2 | 9/2008 | Giraldo et al. |
| 7,474,285 B2 | 1/2009 | Kimura |
| 7,502,000 B2 | 3/2009 | Yuki et al. |
| 7,528,812 B2 | 5/2009 | Tsuge et al. |
| 7,535,449 B2 | 5/2009 | Miyazawa |
| 7,554,512 B2 | 6/2009 | Steer |
| 7,569,849 B2 | 8/2009 | Nathan et al. |
| 7,576,718 B2 | 8/2009 | Miyazawa |
| 7,580,012 B2 | 8/2009 | Kim et al. |
| 7,589,707 B2 | 9/2009 | Chou |
| 7,609,239 B2 | 10/2009 | Chang |
| 7,619,594 B2 | 11/2009 | Hu |
| 7,619,597 B2 | 11/2009 | Nathan et al. |
| 7,633,470 B2 | 12/2009 | Kane |
| 7,656,370 B2 | 2/2010 | Schneider et al. |
| 7,800,558 B2 | 9/2010 | Routley et al. |
| 7,847,764 B2 | 12/2010 | Cok et al. |
| 7,859,492 B2 | 12/2010 | Kohno |
| 7,868,859 B2 | 1/2011 | Tomida et al. |
| 7,876,294 B2 | 1/2011 | Sasaki et al. |
| 7,924,249 B2 | 4/2011 | Nathan et al. |
| 7,932,883 B2 | 4/2011 | Klompenhouwer et al. |
| 7,969,390 B2 | 6/2011 | Yoshida |
| 7,978,187 B2 | 7/2011 | Nathan et al. |
| 7,994,712 B2 | 8/2011 | Sung et al. |
| 8,026,876 B2 | 9/2011 | Nathan et al. |
| 8,049,420 B2 | 11/2011 | Tamura et al. |
| 8,077,123 B2 | 12/2011 | Naugler, Jr. |
| 8,115,707 B2 | 2/2012 | Nathan et al. |
| 8,208,084 B2 | 6/2012 | Lin |
| 8,223,177 B2 | 7/2012 | Nathan et al. |
| 8,232,939 B2 | 7/2012 | Nathan et al. |
| 8,259,044 B2 | 9/2012 | Nathan et al. |
| 8,264,431 B2 | 9/2012 | Bulovic et al. |
| 8,279,143 B2 | 10/2012 | Nathan et al. |
| 8,339,386 B2 | 12/2012 | Leon et al. |
| 9,332,228 B2 * | 5/2016 | Lee ............... H04N 7/17318 |
| 2001/0002703 A1 | 6/2001 | Koyama |
| 2001/0009283 A1 | 7/2001 | Arao et al. |
| 2001/0024181 A1 | 9/2001 | Kubota |
| 2001/0024186 A1 | 9/2001 | Kane et al. |
| 2001/0026257 A1 | 10/2001 | Kimura |
| 2001/0026725 A1 | 10/2001 | Petteruti et al. |
| 2001/0030323 A1 | 10/2001 | Ikeda |
| 2001/0035863 A1 | 11/2001 | Kimura |
| 2001/0040541 A1 | 11/2001 | Yoneda et al. |
| 2001/0043173 A1 | 11/2001 | Troutman |
| 2001/0045929 A1 | 11/2001 | Prache |
| 2001/0052606 A1 | 12/2001 | Sempel et al. |
| 2001/0052940 A1 | 12/2001 | Hagihara et al. |
| 2002/0000576 A1 | 1/2002 | Inukai |
| 2002/0011796 A1 | 1/2002 | Koyama |
| 2002/0011799 A1 | 1/2002 | Kimura |
| 2002/0012057 A1 | 1/2002 | Kimura |
| 2002/0014851 A1 * | 2/2002 | Tai et al. ............... 315/169.3 |
| 2002/0018034 A1 | 2/2002 | Ohki et al. |
| 2002/0030190 A1 | 3/2002 | Ohtani et al. |
| 2002/0047565 A1 | 4/2002 | Nara et al. |
| 2002/0052086 A1 | 5/2002 | Maeda |
| 2002/0067134 A1 | 6/2002 | Kawashima |
| 2002/0084463 A1 | 7/2002 | Sanford et al. |
| 2002/0101172 A1 | 8/2002 | Bu |
| 2002/0105279 A1 | 8/2002 | Kimura |
| 2002/0117722 A1 | 8/2002 | Osada et al. |
| 2002/0122308 A1 | 9/2002 | Ikeda |
| 2002/0158587 A1 | 10/2002 | Komiya |
| 2002/0158666 A1 | 10/2002 | Azami et al. |
| 2002/0158823 A1 | 10/2002 | Zavracky et al. |
| 2002/0167474 A1 | 11/2002 | Everitt |
| 2002/0176013 A1 * | 11/2002 | Itoh ............... 348/243 |
| 2002/0180369 A1 | 12/2002 | Koyama |
| 2002/0180721 A1 | 12/2002 | Kimura et al. |
| 2002/0181276 A1 | 12/2002 | Yamazaki |
| 2002/0186214 A1 | 12/2002 | Siwinski |
| 2002/0190924 A1 | 12/2002 | Asano et al. |
| 2002/0190971 A1 | 12/2002 | Nakamura et al. |
| 2002/0195967 A1 | 12/2002 | Kim et al. |
| 2002/0195968 A1 | 12/2002 | Sanford et al. |
| 2003/0020413 A1 | 1/2003 | Oomura |
| 2003/0030603 A1 | 2/2003 | Shimoda |
| 2003/0043088 A1 | 3/2003 | Booth et al. |
| 2003/0057895 A1 | 3/2003 | Kimura |
| 2003/0058226 A1 | 3/2003 | Bertram et al. |
| 2003/0062524 A1 | 4/2003 | Kimura |
| 2003/0063081 A1 | 4/2003 | Kimura et al. |
| 2003/0071821 A1 | 4/2003 | Sundahl et al. |
| 2003/0076048 A1 | 4/2003 | Rutherford |
| 2003/0090447 A1 | 5/2003 | Kimura |
| 2003/0090481 A1 | 5/2003 | Kimura |
| 2003/0107560 A1 | 6/2003 | Yumoto et al. |
| 2003/0111966 A1 | 6/2003 | Mikami et al. |
| 2003/0122745 A1 | 7/2003 | Miyazawa |
| 2003/0122813 A1 | 7/2003 | Ishizuki et al. |
| 2003/0142088 A1 | 7/2003 | LeChevalier |
| 2003/0151569 A1 | 8/2003 | Lee et al. |
| 2003/0156101 A1 | 8/2003 | Le Chevalier |
| 2003/0174152 A1 | 9/2003 | Noguchi |
| 2003/0179626 A1 | 9/2003 | Sanford et al. |
| 2003/0185438 A1 | 10/2003 | Osawa et al. |
| 2003/0197663 A1 | 10/2003 | Lee et al. |
| 2003/0210256 A1 | 11/2003 | Mori et al. |
| 2003/0230141 A1 | 12/2003 | Gilmour et al. |
| 2003/0230980 A1 | 12/2003 | Forrest et al. |
| 2003/0231148 A1 | 12/2003 | Lin et al. |
| 2004/0032382 A1 | 2/2004 | Cok et al. |
| 2004/0066357 A1 | 4/2004 | Kawasaki |

(56) References Cited

U.S. PATENT DOCUMENTS

| | | |
|---|---|---|
| 2004/0070557 A1 | 4/2004 | Asano et al. |
| 2004/0070565 A1 | 4/2004 | Nayar et al. |
| 2004/0090186 A1 | 5/2004 | Kanauchi et al. |
| 2004/0090400 A1 | 5/2004 | Yoo |
| 2004/0095297 A1 | 5/2004 | Libsch et al. |
| 2004/0100427 A1 | 5/2004 | Miyazawa |
| 2004/0108518 A1 | 6/2004 | Jo |
| 2004/0135749 A1 | 7/2004 | Kondakov et al. |
| 2004/0140982 A1 | 7/2004 | Pate |
| 2004/0145547 A1 | 7/2004 | Oh |
| 2004/0150592 A1 | 8/2004 | Mizukoshi et al. |
| 2004/0150594 A1 | 8/2004 | Koyama et al. |
| 2004/0150595 A1 | 8/2004 | Kasai |
| 2004/0155841 A1 | 8/2004 | Kasai |
| 2004/0174347 A1 | 9/2004 | Sun et al. |
| 2004/0174354 A1 | 9/2004 | Ono et al. |
| 2004/0178743 A1 | 9/2004 | Miller et al. |
| 2004/0183759 A1 | 9/2004 | Stevenson et al. |
| 2004/0196275 A1 | 10/2004 | Hattori |
| 2004/0207615 A1 | 10/2004 | Yumoto |
| 2004/0227697 A1 | 11/2004 | Mori |
| 2004/0239596 A1 | 12/2004 | Ono et al. |
| 2004/0252089 A1 | 12/2004 | Ono et al. |
| 2004/0257313 A1 | 12/2004 | Kawashima et al. |
| 2004/0257353 A1 | 12/2004 | Imamura et al. |
| 2004/0257355 A1 | 12/2004 | Naugler |
| 2004/0263437 A1 | 12/2004 | Hattori |
| 2004/0263444 A1 | 12/2004 | Kimura |
| 2004/0263445 A1 | 12/2004 | Inukai et al. |
| 2004/0263541 A1 | 12/2004 | Takeuchi et al. |
| 2005/0007355 A1 | 1/2005 | Miura |
| 2005/0007357 A1 | 1/2005 | Yamashita et al. |
| 2005/0007392 A1 | 1/2005 | Kasai et al. |
| 2005/0017650 A1 | 1/2005 | Fryer et al. |
| 2005/0024081 A1 | 2/2005 | Kuo et al. |
| 2005/0024393 A1 | 2/2005 | Kondo et al. |
| 2005/0030267 A1 | 2/2005 | Tanghe et al. |
| 2005/0048862 A1* | 3/2005 | Phelan et al. .................. 445/24 |
| 2005/0057484 A1 | 3/2005 | Diefenbaugh et al. |
| 2005/0057580 A1 | 3/2005 | Yamano et al. |
| 2005/0067943 A1 | 3/2005 | Sakaguchi |
| 2005/0067970 A1 | 3/2005 | Libsch et al. |
| 2005/0067971 A1 | 3/2005 | Kane |
| 2005/0068270 A1 | 3/2005 | Awakura |
| 2005/0068275 A1 | 3/2005 | Kane |
| 2005/0073264 A1 | 4/2005 | Matsumoto |
| 2005/0083323 A1 | 4/2005 | Suzuki et al. |
| 2005/0088103 A1 | 4/2005 | Kageyama et al. |
| 2005/0110420 A1 | 5/2005 | Arnold et al. |
| 2005/0110807 A1 | 5/2005 | Chang |
| 2005/0140598 A1 | 6/2005 | Kim et al. |
| 2005/0140610 A1 | 6/2005 | Smith et al. |
| 2005/0145891 A1* | 7/2005 | Abe .................. G09G 3/3241 257/288 |
| 2005/0156831 A1 | 7/2005 | Yamazaki et al. |
| 2005/0162079 A1 | 7/2005 | Sakamoto |
| 2005/0168416 A1 | 8/2005 | Hashimoto et al. |
| 2005/0179626 A1 | 8/2005 | Yuki et al. |
| 2005/0179628 A1 | 8/2005 | Kimura |
| 2005/0185200 A1 | 8/2005 | Tobol |
| 2005/0200575 A1 | 9/2005 | Kim et al. |
| 2005/0206590 A1 | 9/2005 | Sasaki et al. |
| 2005/0212787 A1 | 9/2005 | Noguchi et al. |
| 2005/0219184 A1 | 10/2005 | Zehner et al. |
| 2005/0248515 A1 | 11/2005 | Naugler et al. |
| 2005/0254045 A1* | 11/2005 | Weiss .................. G01N 21/95 356/237.5 |
| 2005/0269959 A1 | 12/2005 | Uchino et al. |
| 2005/0269960 A1 | 12/2005 | Ono et al. |
| 2005/0280615 A1 | 12/2005 | Cok et al. |
| 2005/0280766 A1 | 12/2005 | Johnson et al. |
| 2005/0285822 A1 | 12/2005 | Reddy et al. |
| 2005/0285825 A1 | 12/2005 | Eom et al. |
| 2006/0001613 A1 | 1/2006 | Routley et al. |
| 2006/0007072 A1 | 1/2006 | Choi et al. |
| 2006/0007249 A1 | 1/2006 | Reddy et al. |
| 2006/0012310 A1 | 1/2006 | Chen et al. |
| 2006/0012311 A1 | 1/2006 | Ogawa |
| 2006/0022305 A1 | 2/2006 | Yamashita |
| 2006/0027807 A1 | 2/2006 | Nathan et al. |
| 2006/0030084 A1 | 2/2006 | Young |
| 2006/0038758 A1 | 2/2006 | Routley et al. |
| 2006/0038762 A1 | 2/2006 | Chou |
| 2006/0066533 A1 | 3/2006 | Sato et al. |
| 2006/0077135 A1 | 4/2006 | Cok et al. |
| 2006/0077142 A1 | 4/2006 | Kwon |
| 2006/0082523 A1 | 4/2006 | Guo et al. |
| 2006/0092185 A1 | 5/2006 | Jo et al. |
| 2006/0097628 A1 | 5/2006 | Suh et al. |
| 2006/0097631 A1 | 5/2006 | Lee |
| 2006/0103611 A1 | 5/2006 | Choi |
| 2006/0149493 A1 | 7/2006 | Sambandan et al. |
| 2006/0170623 A1 | 8/2006 | Naugler, Jr. et al. |
| 2006/0176250 A1 | 8/2006 | Nathan et al. |
| 2006/0208961 A1 | 9/2006 | Nathan et al. |
| 2006/0208971 A1 | 9/2006 | Deane |
| 2006/0214888 A1 | 9/2006 | Schneider et al. |
| 2006/0226865 A1* | 10/2006 | Gallarda et al. .............. 324/770 |
| 2006/0232522 A1 | 10/2006 | Roy et al. |
| 2006/0244697 A1 | 11/2006 | Lee et al. |
| 2006/0261841 A1 | 11/2006 | Fish |
| 2006/0273997 A1 | 12/2006 | Nathan et al. |
| 2006/0279481 A1 | 12/2006 | Haruna et al. |
| 2006/0284801 A1 | 12/2006 | Yoon et al. |
| 2006/0284895 A1 | 12/2006 | Marcu et al. |
| 2006/0290618 A1 | 12/2006 | Goto |
| 2007/0001937 A1 | 1/2007 | Park et al. |
| 2007/0001939 A1 | 1/2007 | Hashimoto et al. |
| 2007/0008251 A1 | 1/2007 | Kohno et al. |
| 2007/0008268 A1 | 1/2007 | Park et al. |
| 2007/0008297 A1 | 1/2007 | Bassetti |
| 2007/0057873 A1 | 3/2007 | Uchino et al. |
| 2007/0057874 A1 | 3/2007 | Le Roy et al. |
| 2007/0069998 A1 | 3/2007 | Naugler et al. |
| 2007/0075727 A1 | 4/2007 | Nakano et al. |
| 2007/0076226 A1 | 4/2007 | Klompenhouwer et al. |
| 2007/0080905 A1 | 4/2007 | Takahara |
| 2007/0080906 A1 | 4/2007 | Tanabe |
| 2007/0080908 A1 | 4/2007 | Nathan et al. |
| 2007/0097038 A1 | 5/2007 | Yamazaki et al. |
| 2007/0097041 A1 | 5/2007 | Park et al. |
| 2007/0103419 A1 | 5/2007 | Uchino et al. |
| 2007/0115221 A1 | 5/2007 | Buchhauser et al. |
| 2007/0152672 A1* | 7/2007 | Lee .................. 324/403 |
| 2007/0164664 A1 | 7/2007 | Ludwicki et al. |
| 2007/0182671 A1 | 8/2007 | Nathan et al. |
| 2007/0236440 A1 | 10/2007 | Wacyk et al. |
| 2007/0236517 A1 | 10/2007 | Kimpe |
| 2007/0241999 A1 | 10/2007 | Lin |
| 2007/0273294 A1 | 11/2007 | Nagayama |
| 2007/0285359 A1 | 12/2007 | Ono |
| 2007/0290958 A1 | 12/2007 | Cok |
| 2007/0296672 A1 | 12/2007 | Kim et al. |
| 2008/0001525 A1 | 1/2008 | Chao et al. |
| 2008/0001544 A1 | 1/2008 | Murakami et al. |
| 2008/0030518 A1 | 2/2008 | Higgins et al. |
| 2008/0036708 A1 | 2/2008 | Shirasaki |
| 2008/0042942 A1 | 2/2008 | Takahashi |
| 2008/0042948 A1 | 2/2008 | Yamashita et al. |
| 2008/0048951 A1 | 2/2008 | Naugler, Jr. et al. |
| 2008/0055209 A1 | 3/2008 | Cok |
| 2008/0055211 A1 | 3/2008 | Takashi |
| 2008/0074413 A1 | 3/2008 | Ogura |
| 2008/0088549 A1 | 4/2008 | Nathan et al. |
| 2008/0088648 A1 | 4/2008 | Nathan et al. |
| 2008/0111766 A1 | 5/2008 | Uchino et al. |
| 2008/0116787 A1 | 5/2008 | Hsu et al. |
| 2008/0117144 A1 | 5/2008 | Nakano et al. |
| 2008/0150845 A1 | 6/2008 | Masahito et al. |
| 2008/0150847 A1 | 6/2008 | Kim et al. |
| 2008/0158115 A1 | 7/2008 | Cordes et al. |
| 2008/0158648 A1 | 7/2008 | Cummings |
| 2008/0198103 A1 | 8/2008 | Toyomura et al. |
| 2008/0211749 A1 | 9/2008 | Weitbruch et al. |

(56) References Cited

U.S. PATENT DOCUMENTS

| | | |
|---|---|---|
| 2008/0231558 A1 | 9/2008 | Naugler |
| 2008/0231562 A1 | 9/2008 | Kwon |
| 2008/0231625 A1 | 9/2008 | Minami et al. |
| 2008/0252223 A1 | 10/2008 | Hirokuni et al. |
| 2008/0252571 A1 | 10/2008 | Hente et al. |
| 2008/0259020 A1 | 10/2008 | Fisekovic et al. |
| 2008/0290805 A1 | 11/2008 | Yamada et al. |
| 2008/0297055 A1 | 12/2008 | Miyake et al. |
| 2009/0058772 A1 | 3/2009 | Lee |
| 2009/0109142 A1 | 4/2009 | Hiroshi |
| 2009/0121994 A1 | 5/2009 | Miyata |
| 2009/0146926 A1 | 6/2009 | Sung et al. |
| 2009/0160743 A1 | 6/2009 | Tomida et al. |
| 2009/0174628 A1 | 7/2009 | Wang et al. |
| 2009/0184901 A1 | 7/2009 | Kwon |
| 2009/0195483 A1 | 8/2009 | Naugler, Jr. et al. |
| 2009/0201281 A1 | 8/2009 | Routley et al. |
| 2009/0206764 A1 | 8/2009 | Schemmann et al. |
| 2009/0213046 A1 | 8/2009 | Nam |
| 2009/0244046 A1 | 10/2009 | Seto |
| 2010/0004891 A1 | 1/2010 | Ahlers et al. |
| 2010/0039422 A1 | 2/2010 | Seto |
| 2010/0039458 A1 | 2/2010 | Nathan et al. |
| 2010/0060911 A1 | 3/2010 | Marcu et al. |
| 2010/0079419 A1 | 4/2010 | Shibusawa |
| 2010/0165002 A1 | 7/2010 | Ahn |
| 2010/0194670 A1 | 8/2010 | Cok |
| 2010/0207960 A1 | 8/2010 | Kimpe et al. |
| 2010/0225630 A1 | 9/2010 | Levey et al. |
| 2010/0251295 A1 | 9/2010 | Amento et al. |
| 2010/0277400 A1 | 11/2010 | Jeong |
| 2010/0315319 A1 | 12/2010 | Cok et al. |
| 2011/0063197 A1 | 3/2011 | Chung et al. |
| 2011/0069051 A1 | 3/2011 | Nakamura et al. |
| 2011/0069089 A1 | 3/2011 | Kopf et al. |
| 2011/0074750 A1 | 3/2011 | Leon et al. |
| 2011/0130981 A1 | 6/2011 | Chaji |
| 2011/0149166 A1 | 6/2011 | Botzas et al. |
| 2011/0181630 A1 | 7/2011 | Smith et al. |
| 2011/0199395 A1 | 8/2011 | Nathan et al. |
| 2011/0227964 A1 | 9/2011 | Chaji et al. |
| 2011/0228262 A1* | 9/2011 | Hamamatsu ......... G01N 21/956 356/237.2 |
| 2011/0273399 A1 | 11/2011 | Lee |
| 2011/0293480 A1 | 12/2011 | Mueller |
| 2012/0056558 A1 | 3/2012 | Toshiya et al. |
| 2012/0062565 A1 | 3/2012 | Fuchs et al. |
| 2012/0191496 A1* | 7/2012 | Muench ............. G06Q 10/0631 705/7.13 |
| 2012/0262184 A1 | 10/2012 | Shen |
| 2012/0299978 A1 | 11/2012 | Chaji |
| 2012/0306939 A1* | 12/2012 | Choi ...................... G09G 3/006 345/690 |
| 2013/0027381 A1 | 1/2013 | Nathan et al. |
| 2013/0057595 A1 | 3/2013 | Nathan et al. |
| 2013/0078883 A1* | 3/2013 | Hiraoka ............... H01L 27/3244 445/2 |
| 2013/0112960 A1 | 5/2013 | Chaji et al. |
| 2013/0135272 A1 | 5/2013 | Park |
| 2013/0309821 A1 | 11/2013 | Yoo et al. |
| 2013/0321671 A1 | 12/2013 | Cote et al. |

FOREIGN PATENT DOCUMENTS

| | | |
|---|---|---|
| CA | 2 249 592 | 7/1998 |
| CA | 2 368 386 | 9/1999 |
| CA | 2 242 720 | 1/2000 |
| CA | 2 354 018 | 6/2000 |
| CA | 2 432 530 | 7/2002 |
| CA | 2 436 451 | 8/2002 |
| CA | 2 438 577 | 8/2002 |
| CA | 2 463 653 | 1/2004 |
| CA | 2 498 136 | 3/2004 |
| CA | 2 522 396 | 11/2004 |
| CA | 2 443 206 | 3/2005 |
| CA | 2 472 671 | 12/2005 |
| CA | 2 567 076 | 1/2006 |
| CA | 2 526 782 | 4/2006 |
| CA | 2 541 531 | 7/2006 |
| CA | 2 550 102 | 4/2008 |
| CA | 2 773 699 | 10/2013 |
| CN | 1381032 | 11/2002 |
| CN | 1448908 | 10/2003 |
| CN | 1760945 | 4/2006 |
| CN | 1886774 | 12/2006 |
| CN | 102656621 | 9/2012 |
| CN | 102725786 A | 10/2012 |
| CN | 103336586 A | 10/2013 |
| EP | 0 158 366 | 10/1985 |
| EP | 1 028 471 | 8/2000 |
| EP | 1 111 577 | 6/2001 |
| EP | 1 130 565 A1 | 9/2001 |
| EP | 1 194 013 | 4/2002 |
| EP | 1 335 430 A1 | 8/2003 |
| EP | 1 372 136 | 12/2003 |
| EP | 1 381 019 | 1/2004 |
| EP | 1 418 566 | 5/2004 |
| EP | 1 429 312 A | 6/2004 |
| EP | 145 0341 A | 8/2004 |
| EP | 1 465 143 A | 10/2004 |
| EP | 1 469 448 A | 10/2004 |
| EP | 1 521 203 A2 | 4/2005 |
| EP | 1 594 347 | 11/2005 |
| EP | 1 784 055 A2 | 5/2007 |
| EP | 1854338 A1 | 11/2007 |
| EP | 1 879 169 A1 | 1/2008 |
| EP | 1 879 172 | 1/2008 |
| GB | 2 389 951 | 12/2003 |
| JP | 1272298 | 10/1989 |
| JP | 4-042619 | 2/1992 |
| JP | 6-314977 | 11/1994 |
| JP | 8-340243 | 12/1996 |
| JP | 09-090405 | 4/1997 |
| JP | 10-254410 | 9/1998 |
| JP | 11-202295 | 7/1999 |
| JP | 11-219146 | 8/1999 |
| JP | 11 231805 | 8/1999 |
| JP | 11-282419 | 10/1999 |
| JP | 2000-056847 | 2/2000 |
| JP | 2000-81607 | 3/2000 |
| JP | 2001-134217 | 5/2001 |
| JP | 2001-195014 | 7/2001 |
| JP | 2002-055654 | 2/2002 |
| JP | 2002-91376 | 3/2002 |
| JP | 2002-514320 | 5/2002 |
| JP | 2002-278513 | 9/2002 |
| JP | 2002-333862 | 11/2002 |
| JP | 2003-076331 | 3/2003 |
| JP | 2003-124519 | 4/2003 |
| JP | 2003-177709 | 6/2003 |
| JP | 2003-271095 | 9/2003 |
| JP | 2003-308046 | 10/2003 |
| JP | 2003-317944 | 11/2003 |
| JP | 2004-004675 | 1/2004 |
| JP | 2004-145197 | 5/2004 |
| JP | 2004-287345 | 10/2004 |
| JP | 2005-057217 | 3/2005 |
| JP | 2007-65015 | 3/2007 |
| JP | 2008102335 | 5/2008 |
| JP | 4-158570 | 10/2008 |
| KR | 2004-0100887 | 12/2004 |
| TW | 342486 | 10/1998 |
| TW | 473622 | 1/2002 |
| TW | 485337 | 5/2002 |
| TW | 502233 | 9/2002 |
| TW | 538650 | 6/2003 |
| TW | 1221268 | 9/2004 |
| TW | 1223092 | 11/2004 |
| TW | 200727247 | 7/2007 |
| WO | WO 1998/48403 | 10/1998 |
| WO | WO 1999/48079 | 9/1999 |
| WO | WO 2001/06484 | 1/2001 |
| WO | WO 2001/27910 A1 | 4/2001 |

(56) References Cited

FOREIGN PATENT DOCUMENTS

| WO | WO 2001/63587 A2 | 8/2001 |
| --- | --- | --- |
| WO | WO 2002/067327 A | 8/2002 |
| WO | WO 2003/001496 A1 | 1/2003 |
| WO | WO 2003/034389 A | 4/2003 |
| WO | WO 2003/058594 A1 | 7/2003 |
| WO | WO 2003/063124 | 7/2003 |
| WO | WO 2003/077231 | 9/2003 |
| WO | WO 2004/003877 | 1/2004 |
| WO | WO 2004/025615 A | 3/2004 |
| WO | WO 2004/034364 | 4/2004 |
| WO | WO 2004/047058 | 6/2004 |
| WO | WO 2004/104975 A1 | 12/2004 |
| WO | WO 2005/022498 | 3/2005 |
| WO | WO 2005/022500 A | 3/2005 |
| WO | WO 2005/029455 | 3/2005 |
| WO | WO 2005/029456 | 3/2005 |
| WO | WO 2005/055185 | 6/2005 |
| WO | WO 2006/000101 A1 | 1/2006 |
| WO | WO 2006/053424 | 5/2006 |
| WO | WO 2006/063448 A | 6/2006 |
| WO | WO 2006/084360 | 8/2006 |
| WO | WO 2007/003877 A | 1/2007 |
| WO | WO 2007/079572 | 7/2007 |
| WO | WO 2007/120849 A2 | 10/2007 |
| WO | WO 2009/048618 | 4/2009 |
| WO | WO 2009/055920 | 5/2009 |
| WO | WO 2010/023270 | 3/2010 |
| WO | WO 2011/041224 A1 | 4/2011 |
| WO | WO 2011/064761 A1 | 6/2011 |
| WO | WO 2011/067729 | 6/2011 |
| WO | WO 2012/160424 A1 | 11/2012 |
| WO | WO 2012/160471 | 11/2012 |
| WO | WO 2012/164474 A2 | 12/2012 |
| WO | WO 2012/164475 A2 | 12/2012 |

OTHER PUBLICATIONS

Alexander et al.: "Pixel circuits and drive schemes for glass and elastic AMOLED displays"; dated Jul. 2005 (9 pages).

Alexander et al.: "Unique Electrical Measurement Technology for Compensation, Inspection, and Process Diagnostics of AMOLED HDTV"; dated May 2010 (4 pages).

Ashtiani et al.: "AMOLED Pixel Circuit With Electronic Compensation of Luminance Degradation"; dated Mar. 2007 (4 pages).

Chaji et al.: "A Current-Mode Comparator for Digital Calibration of Amorphous Silicon AMOLED Displays"; dated Jul. 2008 (5 pages).

Chaji et al.: "A fast settling current driver based on the CCII for AMOLED displays"; dated Dec. 2009 (6 pages).

Chaji et al.: "A Low-Cost Stable Amorphous Silicon Amoled Display with Full V~T- and V~O~L~E~D Shift Compensation"; dated May 2007 (4 pages).

Chaji et al.: "A low-power driving scheme for a-Si:H active-matrix organic light-emitting diode displays"; dated Jun. 2005 (4 pages).

Chaji et al.: "A low-power high-performance digital circuit for deep submicron technologies"; dated Jun. 2005 (4 pages).

Chaji et al.: "A novel a-Si:H AMOLED pixel circuit based on short-term stress stability of a-Si:H TFTs"; dated Oct. 2005 (3 pages).

Chaji et al.: "A Novel Driving Scheme and Pixel Circuit for AMOLED Displays"; dated Jun. 2006 (4 pages).

Chaji et al.: "A Novel Driving Scheme for High Resolution Large-area a-Si:H AMOLED displays"; dated Aug. 2005 (3 pages).

Chaji et al.: "A Stable Voltage-Programmed Pixel Circuit for a-Si:H AMOLED Displays"; dated Dec. 2006 (12 pages).

Chaji et al.: "A Sub-µA fast-settling current-programmed pixel circuit for AMOLED displays"; dated Sep. 2007.

Chaji et al.: "An Enhanced and Simplified Optical Feedback Pixel Circuit for AMOLED Displays"; dated Oct. 2006.

Chaji et al.: "Compensation technique for DC and transient instability of thin film transistor circuits for large-area devices"; dated Aug. 2008.

Chaji et al.: "Driving scheme for stable operation of 2-TFT a-Si AMOLED pixel"; dated Apr. 2005 (2 pages).

Chaji et al.: "Dynamic-effect compensating technique for stable a-Si:H AMOLED displays"; dated Aug. 2005 (4 pages).

Chaji et al.: "Electrical Compensation of OLED Luminance Degradation"; dated Dec. 2007 (3 pages).

Chaji et al.: "eUTDSP: a design study of a new VLIW-based DSP architecture"; dated My 2003 (4 pages).

Chaji et al.: "Fast and Offset-Leakage Insensitive Current-Mode Line Driver for Active Matrix Displays and Sensors"; dated Feb. 2009 (8 pages).

Chaji et al.: "High Speed Low Power Adder Design With a New Logic Style: Pseudo Dynamic Logic (SDL)"; dated Oct. 2001 (4 pages).

Chaji et al.: "High-precision, fast current source for large-area current-programmed a-Si flat panels"; dated Sep. 2006 (4 pages).

Chaji et al.: "Low-Cost AMOLED Television with IGNIS Compensating Technology"; dated May 2008 (4 pages).

Chaji et al.: "Low-Cost Stable a-Si:H AMOLED Display for Portable Applications"; dated Jun. 2006 (4 pages).

Chaji et al.: "Low-Power Low-Cost Voltage-Programmed a-Si:H AMOLED Display"; dated Jun. 2008 (5 pages).

Chaji et al.: "Merged phototransistor pixel with enhanced near infrared response and flicker noise reduction for biomolecular imaging"; dated Nov. 2008 (3 pages).

Chaji et al.: "Parallel Addressing Scheme for Voltage-Programmed Active-Matrix OLED Displays"; dated May 2007 (6 pages).

Chaji et al.: "Pseudo dynamic logic (SDL): a high-speed and low-power dynamic logic family"; dated 2002 (4 pages).

Chaji et al.: "Stable a-Si:H circuits based on short-term stress stability of amorphous silicon thin film transistors"; dated May 2006 (4 pages).

Chaji et al.: "Stable Pixel Circuit for Small-Area High-Resolution a-Si:H AMOLED Displays"; dated Oct. 2008 (6 pages).

Chaji et al.: "Stable RGBW AMOLED display with OLED degradation compensation using electrical feedback"; dated Feb. 2010 (2 pages).

Chaji et al.: "Thin-Film Transistor Integration for Biomedical Imaging and AMOLED Displays"; dated 2008 (177 pages).

European Search Report for Application No. EP 01 11 22313 dated Sep. 14, 2005 (4 pages).

European Search Report for Application No. EP 04 78 6661 dated Mar. 9, 2009.

European Search Report for Application No. EP 05 75 9141 dated Oct. 30, 2009 (2 pages).

European Search Report for Application No. EP 05 81 9617 dated Jan. 30, 2009.

European Search Report for Application No. EP 06 70 5133 dated Jul. 18, 2008.

European Search Report for Application No. EP 06 72 1798 dated Nov. 12, 2009 (2 pages).

European Search Report for Application No. EP 07 71 0608.6 dated Mar. 19, 2010 (7 pages).

European Search Report for Application No. EP 07 71 9579 dated May 20, 2009.

European Search Report for Application No. EP 07 81 5784 dated Jul. 20, 2010 (2 pages).

European Search Report for Application No. EP 10 16 6143, dated Sep. 3, 2010 (2 pages).

European Search Report for Application No. EP 10 83 4294.0/1903, dated Apr. 8, 2013, (9 pages).

European Search Report for Application No. PCT/CA2006/000177 dated Jun. 2, 2006.

European Supplementary Search Report for Application No. EP 04 78 6662 dated Jan. 19, 2007 (2 pages).

Extended European Search Report for Application No. 11 73 9485.8 dated Aug. 6, 2013(14 pages).

Extended European Search Report for Application No. EP 09 73 3076.5, dated Apr. 27, 2011 (13 pages).

Extended European Search Report for Application No. EP 11 16 8677.0, dated Nov. 29, 2012, (13 pages).

Extended European Search Report for Application No. EP 11 19 1641.7 dated Jul. 11, 2012 (14 pages).

(56) References Cited

OTHER PUBLICATIONS

Fossum, Eric R.. "Active Pixel Sensors: Are CCD's Dinosaurs?" SPIE: Symposium on Electronic Imaging. Feb. 1, 1993 (13 pages).
Goh et al., "A New a-Si:H Thin-Film Transistor Pixel Circuit for Active-Matrix Organic Light-Emitting Diodes", IEEE Electron Device Letters, vol. 24, No. 9, Sep. 2003, pp. 583-585.
International Preliminary Report on Patentability for Application No. PCT/CA2005/001007 dated Oct. 16, 2006, (4 pages).
International Search Report for Application No. PCT/CA2004/001741 dated Feb. 21, 2005.
International Search Report for Application No. PCT/CA2004/001742, Canadian Patent Office, dated Feb. 21, 2005 (2 pages).
International Search Report for Application No. PCT/CA2005/001007 dated Oct. 18, 2005.
International Search Report for Application No. PCT/CA2005/001897, dated Mar. 21, 2006 (2 pages).
International Search Report for Application No. PCT/CA2007/000652 dated Jul. 25, 2007.
International Search Report for Application No. PCT/CA2009/000501, dated Jul. 30, 2009 (4 pages).
International Search Report for Application No. PCT/CA2009/001769, dated Apr. 8, 2010 (3 pages).
International Search Report for Application No. PCT/IB2010/055481, dated Apr. 7, 2011, (3 pages).
International Search Report for Application No. PCT/IB2010/055486, dated Apr. 19, 2011, (5 pages).
International Search Report for Application No. PCT/IB2010/055541 filed Dec. 1, 2010, dated May 26, 2011; (5 pages).
International Search Report for Application No. PCT/IB2011/050502, dated Jun. 27, 2011 (6 pages).
International Search Report for Application No. PCT/IB2011/051103, dated Jul. 8, 2011, (3 pages).
International Search Report for Application No. PCT/IB2011/055135, Canadian Patent Office, dated Apr. 16, 2012 (5 pages).
International Search Report for Application No. PCT/IB2012/052372, dated Sep. 12, 2012 (3 pages).
International Search Report for Application No. PCT/IB2013/054251, Canadian Intellectual Property Office, dated Sep. 11, 2013; (4 pages).
International Search Report for Application No. PCT/JP02/09668, dated Dec. 3, 2002, (4 pages).
International Written Opinion for Application No. PCT/CA2004/001742, Canadian Patent Office, dated Feb. 21, 2005 (5 pages).
International Written Opinion for Application No. PCT/CA2005/001897, dated Mar. 21, 2006 (4 pages).
International Written Opinion for Application No. PCT/CA2009/000501 dated Jul. 30, 2009 (6 pages).
International Written Opinion for Application No. PCT/IB2010/055481, dated Apr. 7, 2011, (6 pages).
International Written Opinion for Application No. PCT/IB2010/055486, dated Apr. 19, 2011, 8 pages.
International Written Opinion for Application No. PCT/IB2010/055541, dated May 26, 2011; (6 pages).
International Written Opinion for Application No. PCT/IB2011/050502, dated Jun. 27, 2011 (7 pages).
International Written Opinion for Application No. PCT/IB2011/051103, dated Jul. 8, 2011, (6 pages).
International Written Opinion for Application No. PCT/IB2011/055135, Canadian Patent Office, dated Apr. 16, 2012 (5 pages).
International Written Opinion for Application No. PCT/IB2012/052372, dated Sep. 12, 2012 (6 pages).
International Written Opinion for Application No. PCT/IB2013/054251, Canadian Intellectual Property Office, dated Sep. 11, 2013; (5 pages).
International Written Opinion for Application No. PCT/IB2014/060879, Canadian Intellectual Property Office, dated Jul. 17, 2014; (4 pages).
International Search Report for Application No. PCT/IB2014/060879, Canadian Intellectual Property Office, dated Jul. 17, 2014; (4 pages).

Jafarabadiashtiani et al.: "A New Driving Method for a-Si AMOLED Displays Based on Voltage Feedback"; dated 2005 (4 pages).
Kanicki, J., et al. "Amorphous Silicon Thin-Film Transistors Based Active-Matrix Organic Light-Emitting Displays." Asia Display: International Display Workshops, Sep. 2001 (pp. 315-318).
Karim, K. S., et al. "Amorphous Silicon Active Pixel Sensor Readout Circuit for Digital Imaging." IEEE: Transactions on Electron Devices. vol. 50, No. 1, Jan. 2003 (pp. 200-208).
Lee et al.: "Ambipolar Thin-Film Transistors Fabricated by PECVD Nanocrystalline Silicon"; dated 2006.
Lee, Wonbok: "Thermal Management in Microprocessor Chips and Dynamic Backlight Control in Liquid Crystal Displays", Ph.D. Dissertation, University of Southern California (124 pages).
Ma E Y et al.: "organic light emitting diode/thin film transistor integration for foldable displays" dated Sep. 15, 1997(4 pages).
Matsueda yet al.: "35.1: 2.5-in. AMOLED with Integrated 6-bit Gamma Compensated Digital Data Driver"; dated May 2004.
Mendes E., et al. "A High Resolution Switch-Current Memory Base Cell." IEEE: Circuits and Systems. vol. 2, Aug. 1999 (pp. 718-721).
Nathan A. et al., "Thin Film imaging technology on glass and plastic" ICM 2000, proceedings of the 12 international conference on microelectronics, dated Oct. 31, 2001 (4 pages).
Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.
Nathan et al.: "Backplane Requirements for active Matrix Organic Light Emitting Diode Displays,"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a-Si for AMOLED—Meeting the Performance and Cost Demands of Display Applications (Cell Phone to HDTV)"; dated 2006 (4 pages).
Office Action in Japanese patent application No. JP2006-527247 dated Mar. 15, 2010. (8 pages).
Office Action in Japanese patent application No. JP2007-545796 dated Sep. 5, 2011. (8 pages).
Office Action in Japanese patent application No. JP2012-541612 dated Jul. 15, 2014. (3 pages).
Partial European Search Report for Application No. EP 11 168 677.0, dated Sep. 22, 2011 (5 pages).
Partial European Search Report for Application No. EP 11 19 1641.7, dated Mar. 20, 2012 (8 pages).
Philipp: "Charge transfer sensing" Sensor Review, vol. 19, No. 2, Dec. 31, 1999 (1999-1231), 10 pages.
Rafati et al.: "Comparison of a 17 b multiplier in Dual-rail domino and in Dual-rail D L (D L) logic styles"; dated 2002 (4 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Safavian et al.: "Three-TFT image sensor for real-time digital X-ray imaging"; dated Feb. 2, 2006 (2 pages).
Search Report for Taiwan Invention Patent Application No. 093128894 dated May 1, 2012. (1 page).
Search Report for Taiwan Invention Patent Application No. 94144535 dated Nov. 1, 2012. (1 page).
Singh, et al., "Current Conveyor: Novel Universal Active Block", Samriddhi, S-JPSET vol. I, Issue 1, 2010, pp. 41-48 (12EPPT).

(56) References Cited

OTHER PUBLICATIONS

Smith, Lindsay I., "A tutorial on Principal Components Analysis," dated Feb. 26, 2001 (27 pages).
Spindler et al., System Considerations for RGBW OLED Displays, Journal of the SID 14/1, 2006, pp. 37-48.
Stewart M. et al., "polysilicon TFT technology for active matrix oled displays" IEEE transactions on electron devices, vol. 48, No. 5, dated May 2001 (7 pages).
Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.
Yu, Jennifer: "Improve OLED Technology for Display", Ph.D. Dissertation, Massachusetts Institute of Technology, Sep. 2008 (151 pages).
International Search Report for Application No. PCT/IB2014/058244, Canadian Intellectual Property Office, dated Apr. 11, 2014; (6 pages).
International Search Report for Application No. PCT/IB2014/059753, Canadian Intellectual Property Office, dated Jun. 23, 2014; (6 pages).
Written Opinion for Application No. PCT/IB2014/059753, Canadian Intellectual Property Office, dated Jun. 12, 2014 (6 pages).
Extended European Search Report for Application No. EP 14158051.4, dated Jul. 29, 2014, (4 pages).
Third Office Action in Chinese Patent Application No. 201510293521.5, dated Sep. 21, 2020, in Chinese, 7 pages.

* cited by examiner

FIG. 17
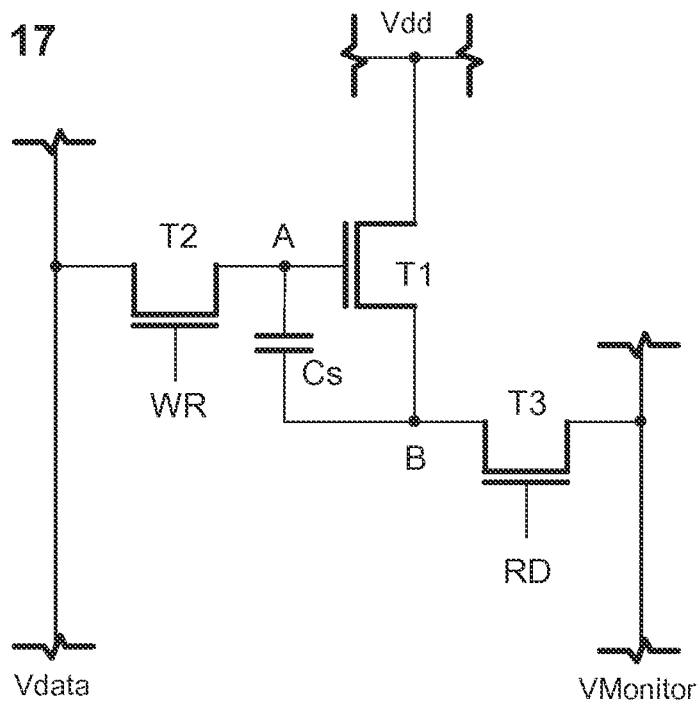
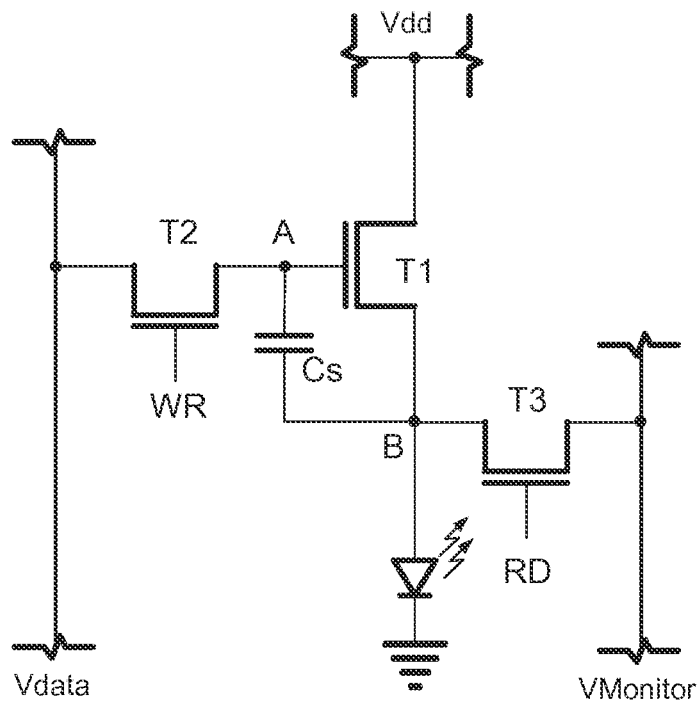
FIG. 18

DEFECT DETECTION AND CORRECTION OF PIXEL CIRCUITS FOR AMOLED DISPLAYS

CROSS REFERENCE TO RELATED APPLICATIONS

This application is a continuation-in-part of and claims the benefit of U.S. patent application Ser. No. 13/890,926, filed May 9, 2013, which is a continuation-in-part of U.S. patent application Ser. No. 13/869,399, filed Apr. 24, 2013, which is a continuation-in-part of U.S. patent application Ser. No. 12/956,842, filed Nov. 30, 2010, which claims priority to Canadian Application No. 2,688,870, filed Nov. 30, 2009, each of which is hereby incorporated by reference herein in its entirety.

This application is a continuation-in-part of and claims the benefit of U.S. patent application Ser. No. 14/257,113, filed Apr. 21, 2014, which claims priority to U.S. Provisional Application No. 61/861,614, filed Aug. 2, 2013, and U.S. Provisional Application No. 61/814,580, filed Apr. 22, 2013, each of which is hereby incorporated by reference herein in their entireties.

FIELD OF THE INVENTION

The present disclosure generally relates to active matrix organic light emitting device (AMOLED) displays, and particularly determining aging conditions requiring compensation for the pixels of such displays, and inspection systems for detecting defects and non-uniformities in such displays.

BACKGROUND

There is a need for techniques to provide accurate measurement of the display temporal and spatial information and ways of applying this information to improve display uniformity in an AMOLED display. There is also a need to determine baseline measurements of pixel characteristics accurately for aging compensation purposes.

Both the OLEDs and the thin films transistors (TFTs) used in AMOLED displays can demonstrate non-uniform behavior across display panels due to production problems. Such problems can be corrected if the defects and non-uniformities can be identified at the time the panels are produced, e.g., during or immediately following fabrication.

SUMMARY

In accordance with one embodiment, a system is provided for testing an array-based semiconductor device for defects during fabrication of the semiconductor device by (a) detecting defects in said entities forming the semiconductor device at an intermediate stage in the fabrication of multiple types of entities forming the semiconductor device, (b) determining whether the detected defects exceed preselected thresholds for the types of entities in which said detects are detected, (c) if the detected defects do not exceed said preselected thresholds, continuing the fabrication of the semiconductor device, and (d) if the detected defects exceed said preselected thresholds, identifying the types of defects detected, repairing the identified defects, and continuing the fabrication of the semiconductor device.

In one implementation, the array-based semiconductor device is an active matrix organic light emitting device (AMOLED) display panel, and the multiple types of entities include at least drive transistors, OLEDs and signal lines.

The preselected thresholds may be changed as the number of detected defects increases, and the types of defects may be identified by tests tailored according to the types of entities in which defects are detected. Defects may be detected in the entities by measuring voltages or currents in individual pixels, and comparing the measured values with preselected threshold values for said voltages or currents. The measured current may be the current flowing to a light emitting device of a pixel, and the measured voltage may be the voltage at a connection of a pixel circuit to a light emitting device for that pixel. Defects may be detected in the entities by preselecting a reference level of a current or voltage based on the lowest level of current or voltage in a normal pixel, and comparing a measured current or voltage with the corresponding preselected reference level.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

FIG. 17 is a circuit diagram of a pixel circuit used for backplane testing.

FIG. 18 is a circuit diagram of a pixel circuit used for full-display testing.

Figure 1:
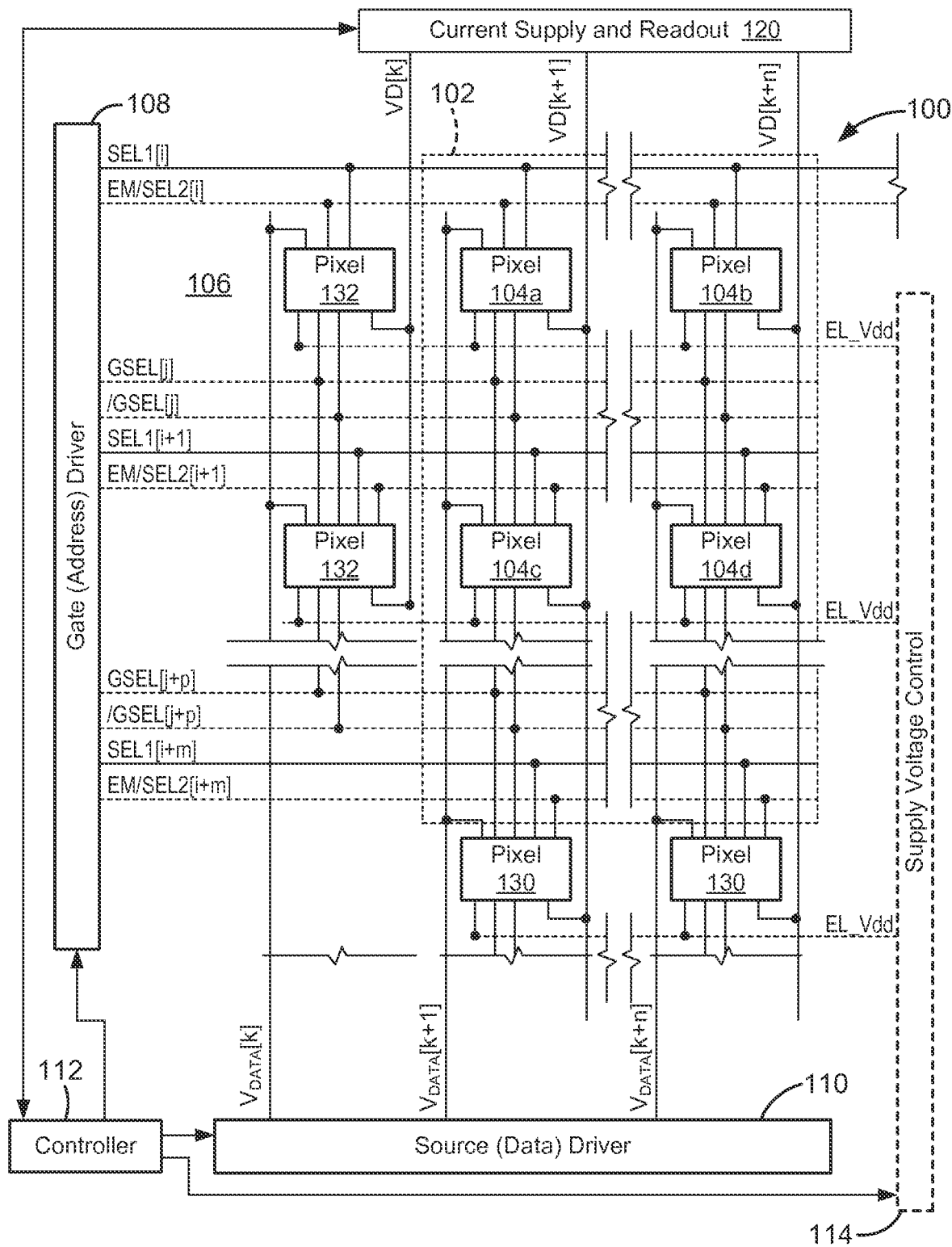
FIG. 1 is a block diagram of a AMOLED display with reference pixels to correct data for parameter compensation control.

While the present disclosure is susceptible to various modifications and alternative forms, specific embodiments have been shown by way of example in the drawings and will be described in detail herein. It should be understood, however, that the present disclosure is not intended to be limited to the particular forms disclosed. Rather, the present disclosure is to cover all modifications, equivalents, and alternatives falling within the spirit and scope of the invention as defined by the appended claims.

DETAILED DESCRIPTION

FIG. 1 is an electronic display system 100 having an active matrix area or pixel array 102 in which an array of active pixels 104$a$-$d$ are arranged in a row and column configuration. For ease of illustration, only two rows and columns are shown. External to the active matrix area which is the pixel array 102 is a peripheral area 106 where peripheral circuitry for driving and controlling the area of the pixel array 102 are disposed. The peripheral circuitry includes a gate or address driver circuit 108, a source or data driver circuit 110, a controller 112, and an optional supply voltage (e.g., Vdd) driver 114. The controller 112 controls the gate, source, and supply voltage drivers 108, 110, 114. The gate driver 108, under control of the controller 112, operates on address or select lines SEL[i], SEL[i+1], and so forth, one for each row of pixels 104 in the pixel array 102. In pixel sharing configurations described below, the gate or address driver circuit 108 can also optionally operate on global select lines GSEL[j] and optionally /GSEL[j], which operate on multiple rows of pixels 104$a$-$d$ in the pixel array 102, such as every two rows of pixels 104$a$-$d$. The source driver circuit 110, under control of the controller 112, operates on voltage data lines Vdata[k], Vdata[k+1], and so forth, one for each column of pixels 104$a$-$d$ in the pixel array 102. The voltage data lines carry voltage programming information to each pixel 104 indicative of brightness of each light emitting device in the pixel 104. A storage element, such as a capacitor, in each pixel 104 stores the voltage programming information until an emission or driving cycle turns on the light emitting device. The optional supply voltage driver 114, under control of the controller 112, controls a supply voltage (EL_Vdd) line, one for each row of pixels 104$a$-$d$ in the pixel array 102.

The display system 100 may also include a current source circuit, which supplies a fixed current on current bias lines. In some configurations, a reference current can be supplied to the current source circuit. In such configurations, a current source control controls the timing of the application of a bias current on the current bias lines. In configurations in which the reference current is not supplied to the current source circuit, a current source address driver controls the timing of the application of a bias current on the current bias lines.

As is known, each pixel 104$a$-$d$ in the display system 100 needs to be programmed with information indicating the brightness of the light emitting device in the pixel 104$a$-$d$. A frame defines the time period that includes a programming cycle or phase during which each and every pixel in the display system 100 is programmed with a programming voltage indicative of a brightness and a driving or emission cycle or phase during which each light emitting device in each pixel is turned on to emit light at a brightness commensurate with the programming voltage stored in a storage element. A frame is thus one of many still images that compose a complete moving picture displayed on the display system 100. There are at least two schemes for programming and driving the pixels: row-by-row, or frame-by-frame. In row-by-row programming, a row of pixels is programmed and then driven before the next row of pixels is programmed and driven. In frame-by-frame programming, all rows of pixels in the display system 100 are programmed first, and all of the frames are driven row-by-row. Either scheme can employ a brief vertical blanking time at the beginning or end of each frame during which the pixels are neither programmed nor driven.

The components located outside of the pixel array 102 may be disposed in a peripheral area 106 around the pixel array 102 on the same physical substrate on which the pixel array 102 is disposed. These components include the gate driver 108, the source driver 110 and the optional supply voltage control 114. Alternately, some of the components in the peripheral area can be disposed on the same substrate as the pixel array 102 while other components are disposed on a different substrate, or all of the components in the peripheral area can be disposed on a substrate different from the substrate on which the pixel array 102 is disposed. Together, the gate driver 108, the source driver 110, and the supply voltage control 114 make up a display driver circuit. The display driver circuit in some configurations may include the gate driver 108 and the source driver 110 but not the supply voltage control 114.

The display system 100 further includes a current supply and readout circuit 120, which reads output data from data output lines, VD [k], VD [k+1], and so forth, one for each column of pixels 104a, 104c in the pixel array 102. A set of column reference pixels 130 is fabricated on the edge of the pixel array 102 at the end of each column such as the column of pixels 104a and 104c. The column reference pixels 130 also may receive input signals from the controller 112 and output data signals to the current supply and readout circuit 120. The column reference pixels 130 include the drive transistor and an OLED but are not part of the pixel array 102 that displays images. As will be explained below, the column reference pixels 130 are not driven for most of the programming cycle because they are not part of the pixel array 102 to display images and therefore do not age from the constant application of programming voltages as compared to the pixels 104a and 104c. Although only one column reference pixel 130 is shown in FIG. 1, it is to be understood that there may be any number of column reference pixels although two to five such reference pixels may be used for each column of pixels in this example. Each row of pixels in the array 102 also includes row reference pixels 132 at the ends of each row of pixels 104a-d such as the pixels 104a and 104b. The row reference pixels 132 include the drive transistor and an OLED but are not part of the pixel array 102 that displays images. As will be explained the row reference pixels 132 have the function of providing a reference check for luminance curves for the pixels which were determined at the time of production.

Figure 2A:
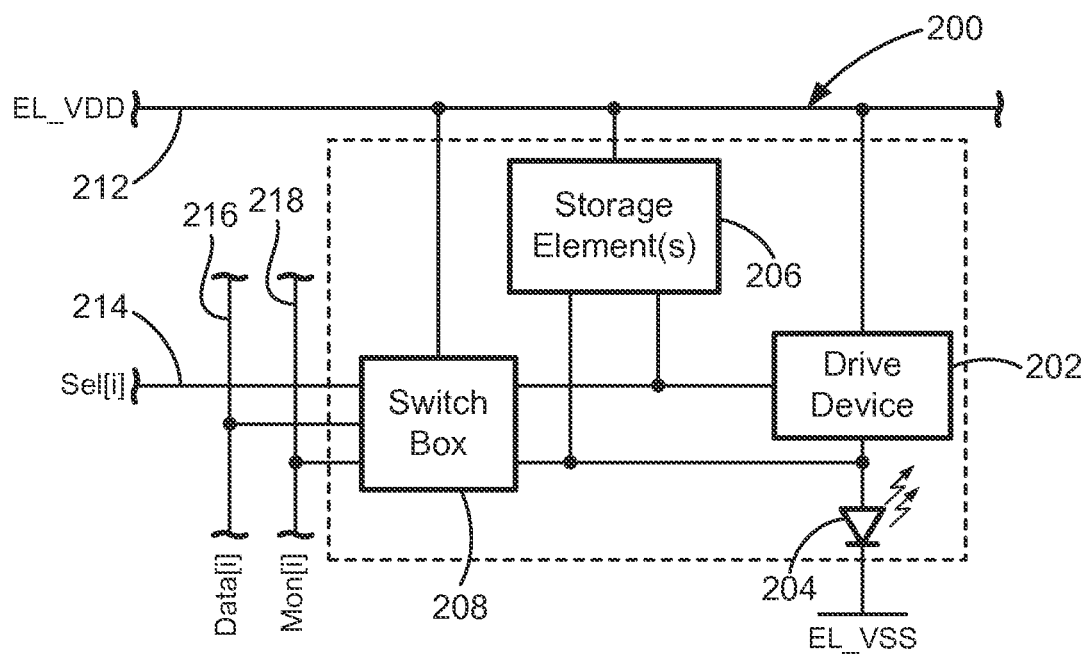
FIG. 2A is a block diagram of a driver circuit of one of the pixels of the AMOLED that may be tested for aging parameters.

FIG. 2A shows a block diagram of a driver circuit 200 for the pixel 104 in FIG. 1. The driver circuit 200 includes a drive device 202, an organic light emitting device ("OLED") 204, a storage element 206, and a switching device 208. A voltage source 212 is coupled to the drive transistor 206. A select line 214 is coupled to the switching device to activate the driver circuit 200. A data line 216 allows a programming voltage to be applied to the drive device 202. A monitoring line 218 allows outputs of the OLED 204 and or the drive device 202 to be monitored. Alternatively, the monitor line 218 and the data line 216 may be merged into one line (i.e. Data/Mon) to carry out both the programming and monitoring functions through that single line.

Figure 2B:
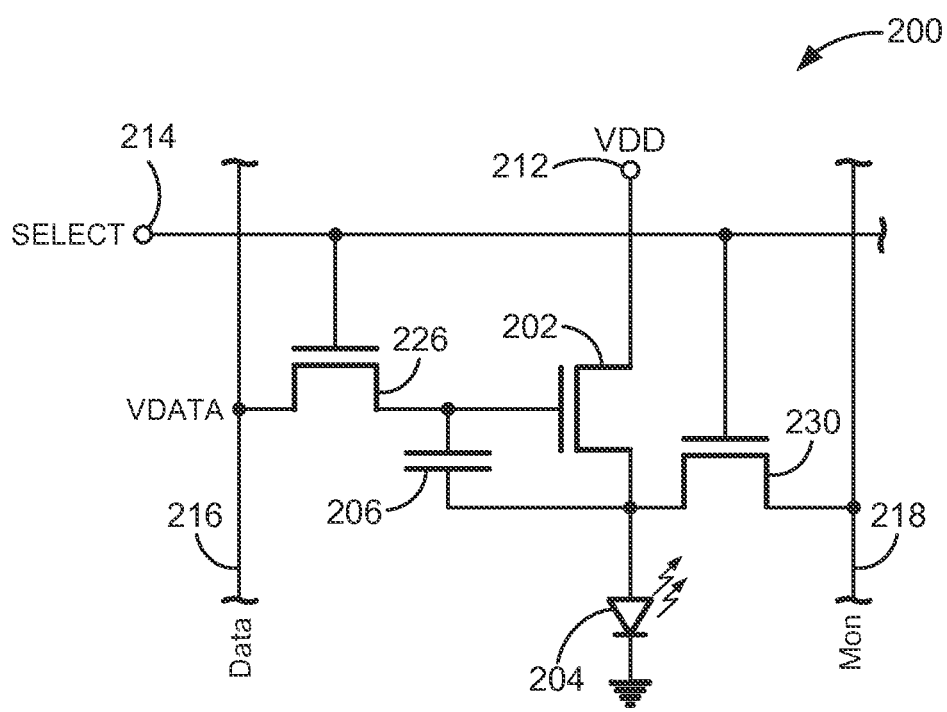
FIG. 2B is a circuit diagram of a driver circuit of one of the pixels of the AMOLED.

FIG. 2B shows one example of a circuit to implement the driver circuit 200 in FIG. 2A. As shown in FIG. 2B, the drive device 202 is a drive transistor which is a thin film transistor in this example that is fabricated from amorphous silicon. The storage element 206 is a capacitor in this example. The switching device 208 includes a select transistor 226 and a monitoring transistor 230 that switch the different signals to the drive circuit 200. The select line 214 is coupled to the select transistor 226 and the monitoring transistor 230. During the readout time, the select line 214 is pulled high. A programming voltage may be applied via the programming voltage input line 216. A monitoring voltage may be read from the monitoring line 218 that is coupled to the monitoring transistor 230. The signal to the select line 214 may be sent in parallel with the pixel programming cycle. As will be explained below, the driver circuit 200 may be periodically tested by applying reference voltage to the gate of the drive transistor.

There are several techniques for extracting electrical characteristics data from a device under test (DUT) such as the display system 100. The device under test (DUT) can be any material (or device) including (but not limited to) a light emitting diode (LED), or OLED. This measurement may be effective in determining the aging (and/or uniformity) of an OLED in a panel composed of an array of pixels such as the array 102 in FIG. 1. This extracted data can be stored in lookup tables as raw or processed data in memory in the controller 112 in FIG. 1. The lookup tables may be used to compensate for any shift in the electrical parameters of the backplane (e.g., threshold voltage shift) or OLED (e.g., shift in the OLED operating voltage). Despite using an OLED display in FIG. 1 in these examples, the techniques described herein may be applied to any display technology including but not limited to OLED, liquid crystal displays (LCD), light emitting diode displays, or plasma displays. In the case of OLED, the electrical information measured may provide an indication of any aging that may have occurred.

Current may be applied to the device under test and the output voltage may be measured. In this example, the voltage is measured with an analog to digital converter (ADC). A higher programming voltage is necessary for a device such as an OLED that ages as compared to the programming voltage for a new OLED for the same output. This method gives a direct measurement of that voltage change for the device under test. Current flow can be in any direction but the current is generally fed into the device under test (DUT) for illustration purposes.

Figure 3:
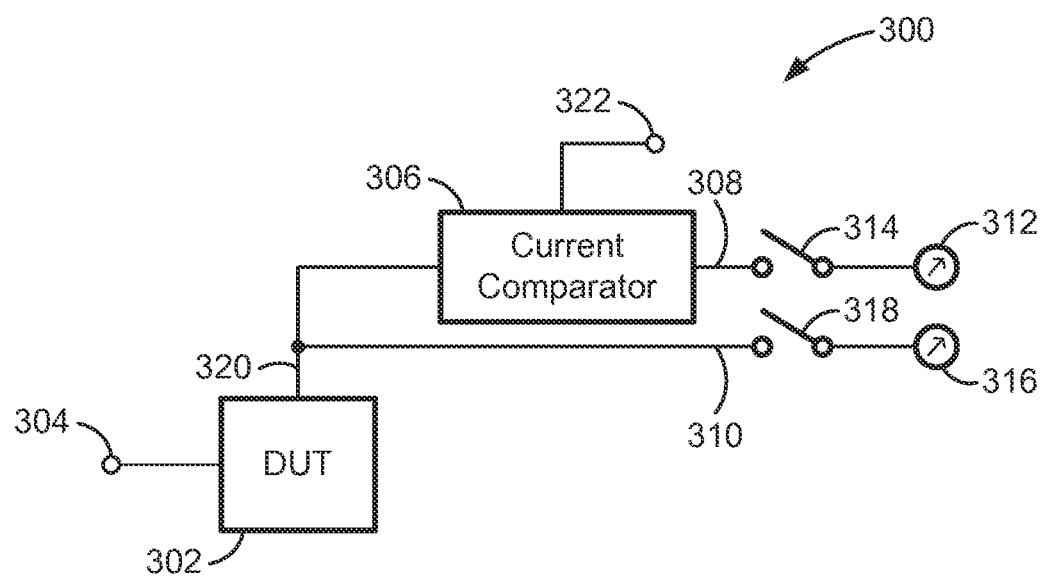
FIG. 3 is a block diagram for a system to determine one of the baseline aging parameters for a device under test.

FIG. 3 is a block diagram of a comparison system 300 that may be used to determine a baseline value for a device under test 302 to determine the effects of aging on the device under test 302. The comparison system uses two reference currents to determine the baseline current output of the device under test 302. The device under test 302 may be either the drive transistor such as the drive transistor 202 in FIG. 2B or an OLED such as the OLED 204 in FIG. 2B. Of course other types of display devices may also be tested using the system shown in FIG. 3. The device under test 302 has a programming voltage input 304 that is held at a constant level to output a current. A current comparator 306 has a first reference current input 308 and a second reference current input 310. The reference current input 308 is coupled to a first reference current source 312 via a switch 314. The second current input 310 of the comparator 306 is coupled to a second reference current source 316 via a switch 318. An output 320 of the device under test 302 is also coupled to the second current input 310. The current comparator 306 includes a comparison output 322.

By keeping the voltage to the input 304 constant, the output current of the device under test 302 is also constant. This current depends on the characteristics of the device under test 302. A constant current is established for the first reference current from the first reference current source 312 and via the switch 314 the first reference current is applied to the first input 308 of the current comparator 306. The second reference current is adjusted to different levels with each level being connected via the switch 318 to the second input 310 of the comparator 306. The second reference current is combined with the output current of the device under test 302. Since the first and second reference current levels are known, the difference between the two reference current levels from the output 322 of the current comparator 306 is the current level of the device under test 302. The resulting output current is stored for the device under test 302 and compared with the current measured based on the same programming voltage level periodically during the lifetime operation of the device under test 302 to determine the effects of aging.

The resulting determined device current may be stored in look up tables for each device in the display. As the device under test 302 ages, the current will change from the expected level and therefore the programming voltage may be changed to compensate for the effects of aging based on the base line current determined through the calibration process in FIG. 3.

Figure 4A:
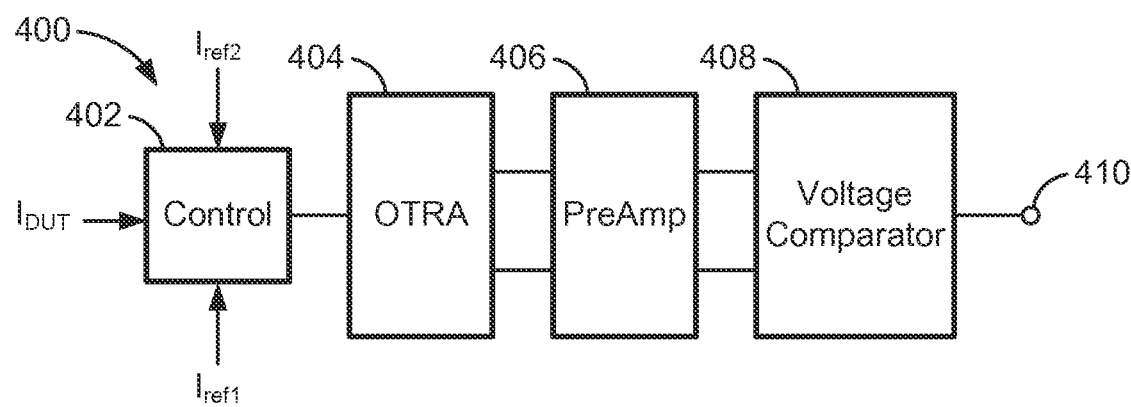
FIG. 4A is a block diagram of the current comparator in FIG. 3 for comparison of a reference current level to the device under test for use in aging compensation.

FIG. 4A is a block diagram of a current comparator circuit 400 that may be used to compare reference currents with a device under test 302 such as in FIG. 3. The current comparator circuit 400 has a control junction 402 that allows various current inputs such as two reference currents and the current of the device under test such as the pixel driver circuit 200 in FIG. 1. The current may be a positive current when the current of the drive transistor 202 is compared or negative when the current of the OLED 204 is compared. The current comparator circuit 400 also includes an operational trans-resistance amplifier circuit 404, a preamplifier 406 and a voltage comparator circuit 408 that produces a voltage output 410. The combined currents are input to the operational trans-resistance amplifier circuit 404 and converted to a voltage. The voltage is fed to the preamplifier and the voltage comparator circuit 408 determines whether the difference in currents is positive or negative and outputs a respective one or a zero value.

Figure 4B:
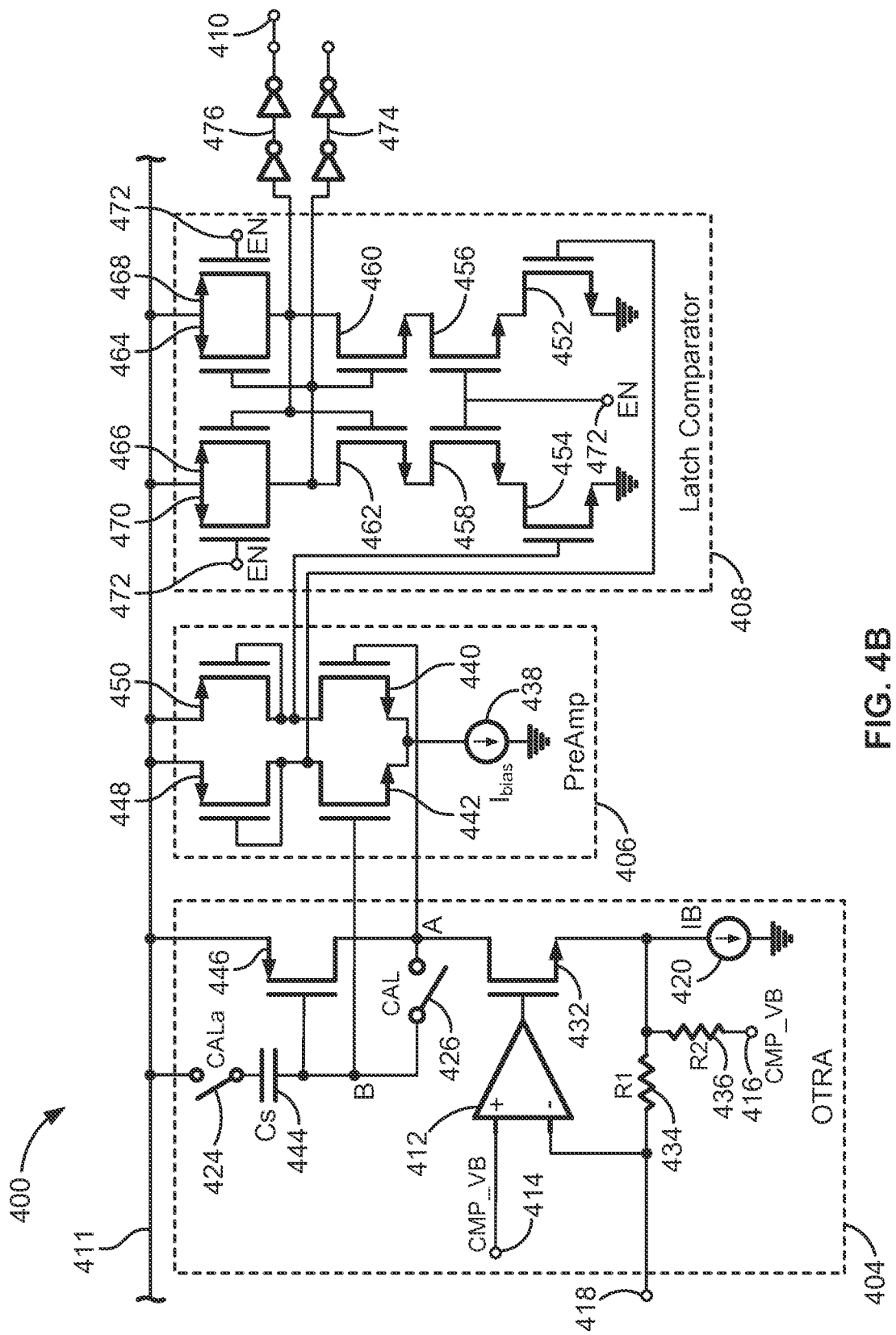
FIG. 4B is a detailed circuit diagram of the current comparator in FIG. 4A.

FIG. 4B is a circuit diagram of the components of the example current comparator system 400 in FIG. 4A that may be used to compare the currents as described in the process in FIG. 3 for a device under test such as the device 302. The operational trans-resistance amplifier circuit 404 includes an operational amplifier 412, a first voltage input 414 (CMP_VB), a second voltage input 416 (CMP_VB), a current input 418, and a bias current source 420. The operational trans-resistance amplifier circuit 404 also includes two calibration switches 424 and 426. As will be explained below, various currents such as the current of the device under test 302, a variable first reference current and a fixed second reference current as shown in FIG. 3 are coupled to the current input 418 in this example. Of course, the fixed second reference current may be set to zero if desired.

The first reference current input is coupled to the negative input of the operational amplifier 412. The negative input of the operational amplifier 412 is therefore coupled to the output current of the device under test 302 in FIG. 3 as well as one or two reference currents. The positive input of the operational amplifier 412 is coupled to the first voltage input 414. The output of the operational amplifier 412 is coupled to the gate of a transistor 432. A resistor 434 is coupled between the negative input of the operational amplifier 412 and the source of the transistor 432. A resistor 436 is coupled between the source of the transistor 432 and the second voltage input 416.

The drain of the transistor 432 is coupled directly to the drain of a transistor 446 and via the calibration switch 426 to the gate. A sampling capacitor 444 is coupled between the gate of the transistor 446 and a voltage supply rail 411 through a switch 424. The source of the 446 is also coupled to the supply rail 411. The drain and gate of the transistor 446 are coupled to the gate terminals of transistors 440 and 442, respectively. The sources of the transistors 440 and 442 are tied together and coupled to a bias current source 438. The drains of the transistors 442 and 440 are coupled to respective transistors 448 and 450 which are wired in diode-connected configuration to the supply voltage rail 411.

As shown in FIG. 4B, the transistors 440, 442, 448 and 450 and the bias current source 438 are parts of the preamplifier 406

The drains of the transistors 442 and 440 are coupled to the gates of the respective transistors 452 and 454. The drains of the transistors 452 and 454 are coupled to the transistors 456 and 458. The drains of the transistors 456 and 458 are coupled to the respective sources of the transistors 460 and 462. The drain and gate terminals of the transistors 460 and 462 are coupled to the respective drain and gate terminals of the transistors 464 and 466. The source terminals of the transistors 464 and 466 are coupled to the supply voltage rail 411. The sources and drains of the transistors 464 and 466 are tied to the respective sources and drains of transistors 468 and 470. The gates of the transistors 456 and 458 are tied to an enable input 472. The enable input 472 is also tied to the gates of dual transistors 468 and 470.

A buffer circuit 474 is coupled to the drain of the transistor 462 and the gate of the transistor 460. The output voltage 410 is coupled to a buffer circuit 476 which is coupled to the drain of the transistor 460 and the gate of the transistor 462. The buffer circuit 474 is used to balance the buffer 476. The transistors 452, 454, 456, 458, 460, 462, 464, 466, 468 and 470 and the buffer circuits 474 and 476 make up the voltage comparator circuit 408.

The current comparator system 400 may be based on any integrated circuit technology including but not limited to CMOS semiconductor fabrication. The components of the current comparator system 400 are CMOS devices in this example. The values for the input voltages 414 and 416 are determined for a given reference current level from the first current input 418 ($I_{ref}$). In this example, the voltage levels for both the input voltages 414 and 416 are the same. The voltage inputs 414 and 416 to the operational amplifier 412 may be controlled using a digital to analog converter (DAC) device which is not shown in FIG. 4. Level shifters can also be added if the voltage ranges of the DACs are insufficient. The bias current may originate from a voltage controlled current source such as a transimpedance amplifier circuit or a transistor such as a thin film transistor.

Figure 4C:
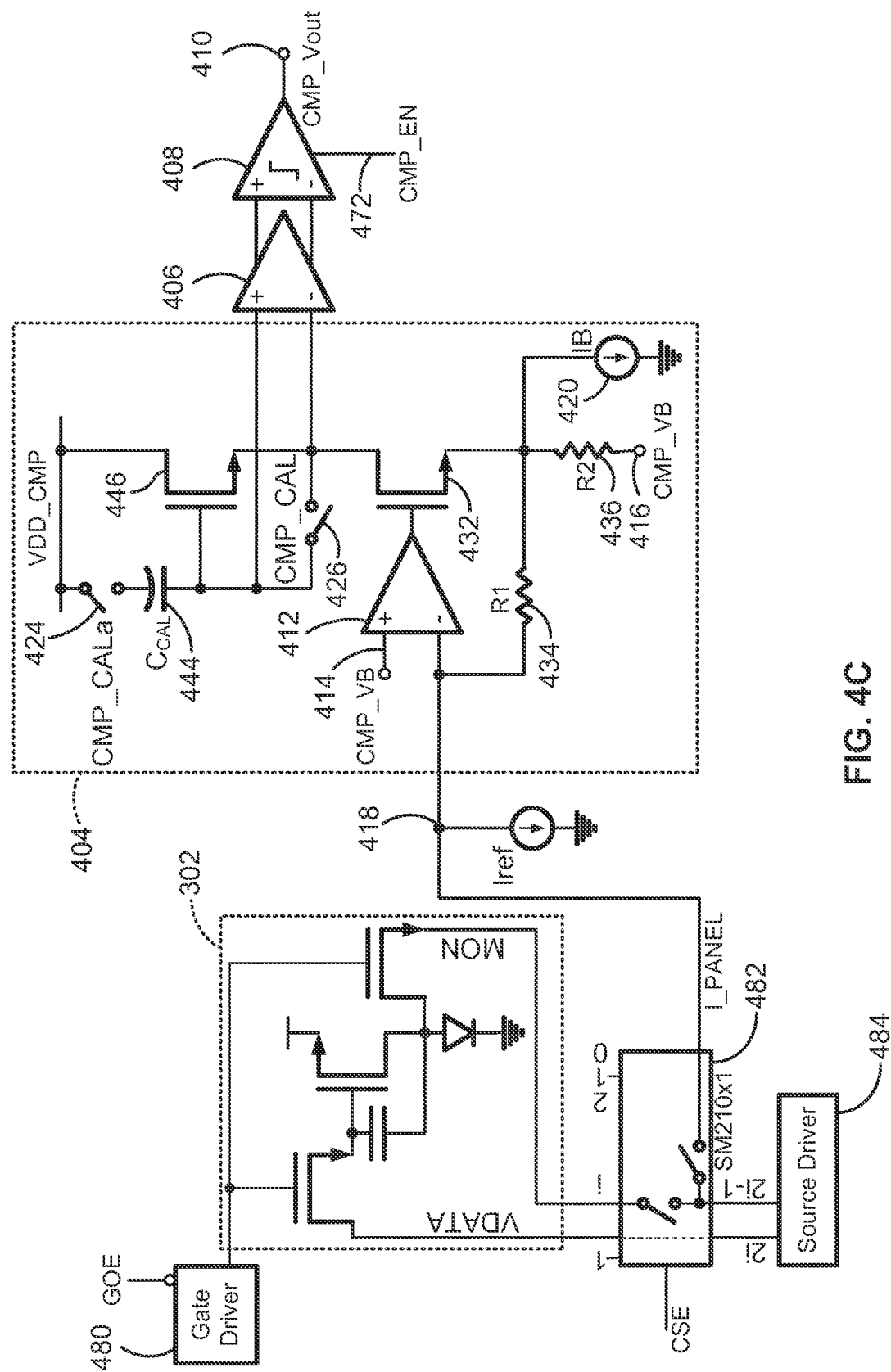
FIG. 4C is a detailed block diagram of the device under test in FIG. 3 coupled to the current comparator in FIG. 4A.

FIG. 4C shows a detailed block diagram of one example of a test system such as the system 300 shown in FIG. 3. The test system in FIG. 4C is coupled to a device under test 302 which may be a pixel driver circuit such as the pixel driver circuit 200 shown in FIG. 2. In this example, all of the driver circuits for a panel display are tested. A gate driver circuit 480 is coupled to the select lines of all of the driver circuits. The gate driver circuit 480 includes an enable input, which in this example enables the device under test 302 when the signal on the input is low.

The device under test 302 receives a data signal from a source driver circuit 484. The source circuit 484 may be a source driver such as the source driver 120 in FIG. 1. The data signal is a programming voltage of a predetermined value. The device under test 302 outputs a current on a monitoring line when the gate driver circuit 480 enables the device. The output of the monitoring line from the device under test 302 is coupled to an analog multiplexer circuit 482 that allows multiple devices to be tested. In this example, the analog multiplexer circuit 482 allows multiplexing of 210 inputs, but of course any number of inputs may be multiplexed.

The signal output from the device under test 302 is coupled to the reference current input 418 of the operational trans-resistance amplifier circuit 404. In this example a variable reference current source is coupled to the current input 418 as described in FIG. 3. In this example, there is no fixed reference current such as the first reference current source in FIG. 3. The value of first reference current source in FIG. 3 in this example is therefore considered to be zero.

Figure 5A:
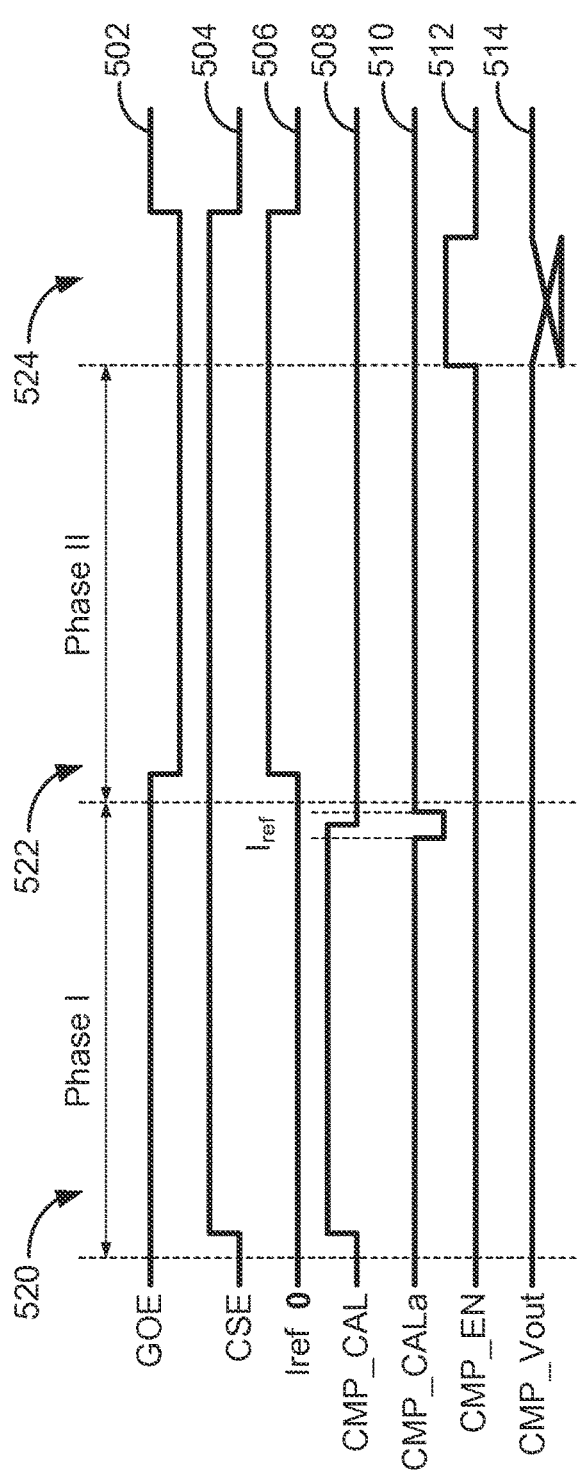
FIG. 5A is a signal timing diagram of the signals for the current comparator in FIGS. 3-4 in the process of determining the current output of a device under test.

FIG. 5A is a timing diagram of the signals for the current comparator shown in FIGS. 4A-4C. The timing diagram in FIG. 5A shows a gate enable signal 502 to the gate driver 480 in FIG. 4C, a CSE enable signal 504 that is coupled to the analog multiplexer 482, a current reference signal 506 that is produced by a variable reference current source that is set at a predetermined level for each iteration of the test process and coupled to the current input 418, a calibration signal 508 that controls the calibration switch 426, a calibration signal 510 that controls the calibration switch 424, a comparator enable signal 512 that is coupled to the enable input 472, and the output voltage 514 over the output 410. The CSE enable signal 504 is kept high to ensure that any leakage on the monitoring line of the device under test 302 is eliminated in the final current comparison.

In a first phase 520, the gate enable signal 502 is pulled high and therefore the output of the device under test 302 in FIG. 4C is zero. The only currents that are input to the current comparator 400 are therefore leakage currents from the monitoring line of the device under test 302. The output of the reference current 506 is also set to zero such that the optimum quiescent condition of the transistors 432 and 436 in FIGS. 4B and 4C is minimally affected only by line leakage or the offset of the readout circuitry. The calibration signal 508 is set high causing the calibration switch 426 to close. The calibration signal 510 is set high to cause the calibration switch 424 to close. The comparator enable signal 512 is set low and therefore the output from the voltage comparator circuit 408 is reset to a logical one. The leakage current is therefore input to the current input 418 and a voltage representing the leakage current of the monitoring line on the panel is stored on the capacitor 444.

In a second phase 522, the gate enable signal 502 is pulled low and therefore the output of the device under test 302 produces an unknown current at a set programming voltage input from the source circuit 484. The current from the device under test 302 is input through the current input 418 along with the reference current 506 which is set at a first predetermined value and opposite the direction of the current of the device under test. The current input 418 therefore is the difference between the reference current 506 and the current from the device under test 302. The calibration signal 510 is momentarily set low to open the switch 424. The calibration signal 508 is then set low and therefore the switch 426 is opened. The calibration signal 510 to the switch 424 is then set high to close the switch 424 to stabilize the voltage on the gate terminal of the transistor 446. The comparator enable signal 512 remains low and therefore there is no output from the voltage comparator circuit 408.

In a third phase 524, the comparator enable signal 512 is pulled high and the voltage comparator 408 produces an output on the voltage output 410. In this example, a positive voltage output logical one for the output voltage signal 514 indicates a positive current therefore showing that the current of the device under test 302 is greater than the predetermined reference current. A zero voltage on the voltage output 410 indicates a negative current showing that the current of the device under test 302 is less than the predetermined level of the reference current. In this manner, any difference between the current of the device under test and the reference current is amplified and detected by the current comparator circuit 400. The value of the reference current is then shifted based on the result to a second predetermined level and the phases 520, 522 and 524 are repeated. Adjusting the reference current allows the comparator circuit 400 to be used by the test system to determine the current output by the device under test 302.

Figure 5B:
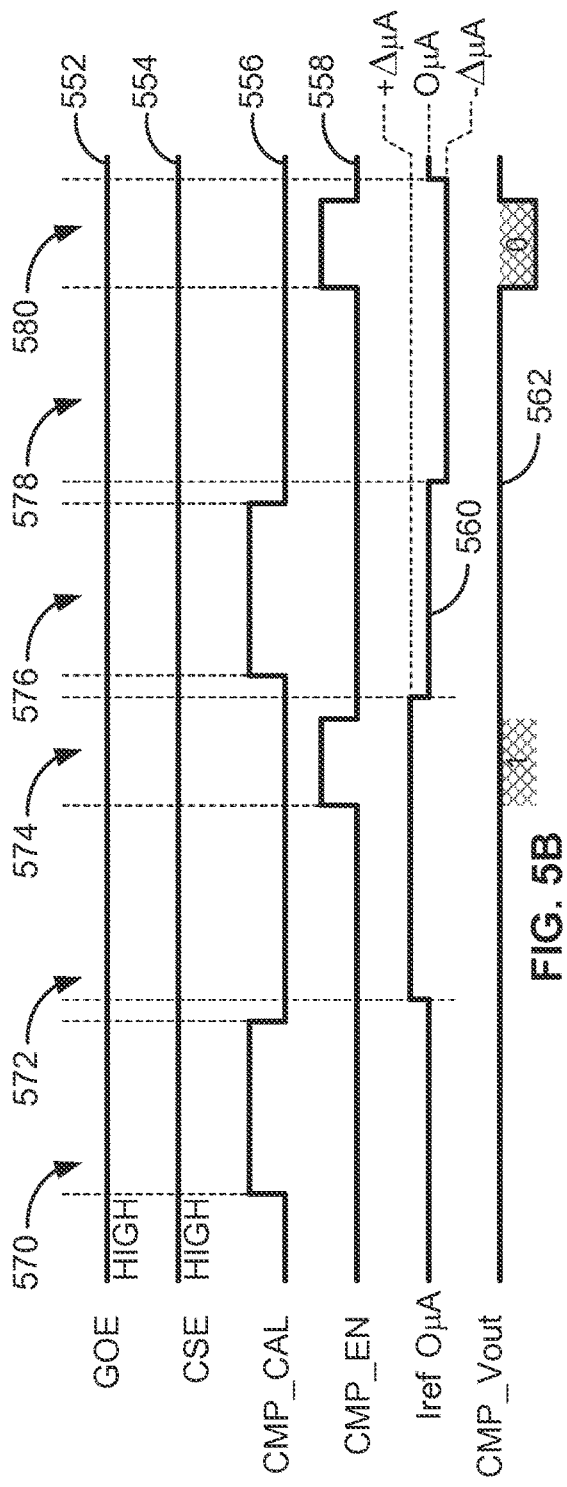
FIG. 5B is a signal timing diagram of the signals for calibrating the bias current for the current comparator in FIGS. 3-4.

FIG. 5B is a timing diagram of the signals applied to the test system shown in FIG. 4C in order to determine an optimal bias current value for the bias current source 420 in FIG. 4B for the operational trans-resistance amplifier circuit 404. In order to achieve the maximum signal-to-noise ratio (SNR) for the current comparator circuit 400 it is essential to calibrate the current comparator. The calibration is achieved by means of fine tuning of the bias current source 420. The optimum bias current level for the bias current source 420 minimizes the noise power during the measurement of a pixel which is also a function of the line leakage. Accordingly, it is required to capture the line leakage during the calibration of the current comparator.

The timing diagram in FIG. 5B shows a gate enable signal 552 to the gate driver 480 in FIG. 4C, a CSE enable signal 554 that is coupled to the analog multiplexer 482, a current reference signal 556 that is produced by a variable reference current source that is set at a predetermined level for each iteration of the calibration process and coupled to the current input 418, a calibration signal 558 that controls the calibration switch 426, a comparator enable signal 560 that is coupled to the enable input 472, and the output voltage 562 over the output 410.

The CSE enable signal 554 is kept high to ensure that any leakage on the line is included in the calibration process. The gate enable signal 552 is also kept high in order to prevent the device under test 302 from outputting current from any data inputs. In a first phase 570, the calibration signal 556 is pulled high thereby closing the calibration switch 426. Another calibration signal is pulled high to close the calibration switch 424. The comparator enable signal 558 is pulled low in order to reset the voltage output from the voltage comparator circuit 408. Any leakage current from the monitoring line of the device under test 302 is converted to a voltage which is stored on the capacitor 444.

A second phase 572 occurs when the calibration signal to the switch 424 is pulled low and then the calibration signal 556 is pulled low thereby opening the switch 426. The signal to the switch 424 is then pulled high closing the switch 424. A small current is output from the reference current source to the current input 418. The small current value is a minimum value corresponding to the minimum detectable signal (MDS) range of the current comparator 400.

A third phase 574 occurs when the comparator enable signal 560 is pulled high thereby allowing the voltage comparator circuit 408 to read the inputs. The output of the voltage comparator circuit 408 on the output 410 should be positive indicating a positive current comparison with the leakage current.

A fourth phase 576 occurs when the calibration signal 556 is pulled high again thereby closing the calibration switch 426. The comparator enable signal 558 is pulled low in order to reset the voltage output from the voltage comparator circuit 408. Any leakage current from the monitoring line of the device under test 302 is converted to a voltage which is stored on the capacitor 444.

A fifth phase 578 occurs when the calibration signal to the switch 424 is pulled low and then the calibration signal 556 is pulled low thereby opening the switch 426. The signal to the switch 424 is then pulled high closing the switch 424. A small current is output from the reference current source to the current input 418. The small current value is a minimum value corresponding to the minimum detectable signal (MDS) range of the current comparator 400 but is a negative current as opposed to the positive current in the second phase 572.

A sixth phase 580 occurs when the comparator enable signal 560 is pulled high thereby allowing the voltage comparator circuit 408 to read the inputs. The output of the voltage comparator circuit 408 on the output 410 should be zero indicating a negative current comparison with the leakage current.

The phases 570, 572, 574, 576, 578 and 580 are repeated. By adjusting the value of the bias current, eventually the rate of the valid output voltage toggles between a one and a zero will maximize indicating an optimal bias current value.

Figure 6:
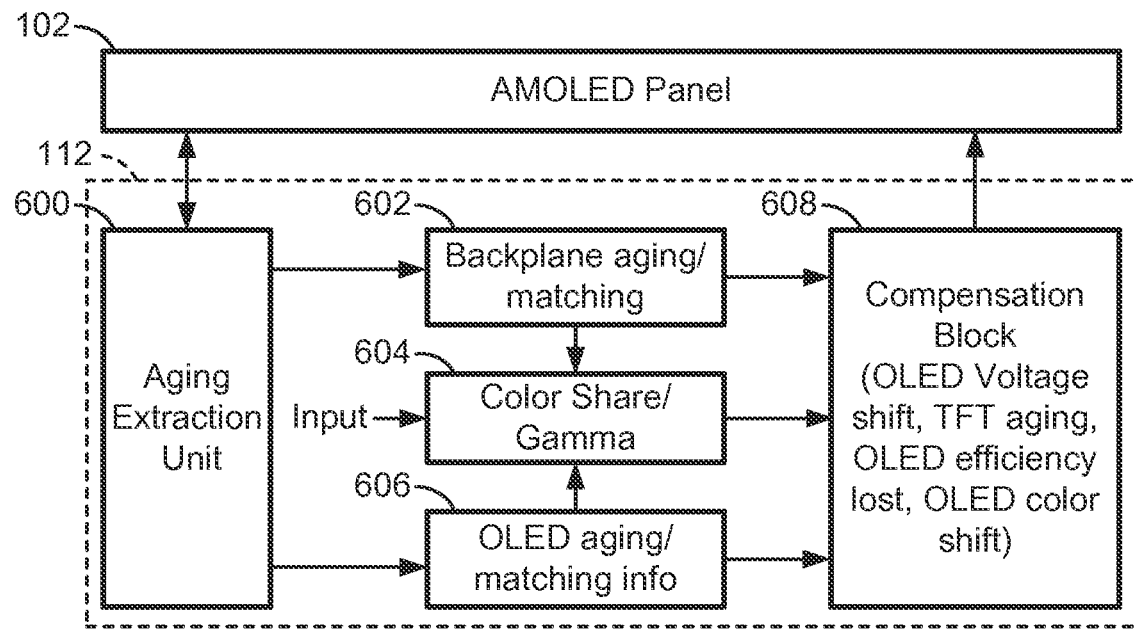
FIG. 6 is a block diagram of a reference current system to compensate for the aging of the AMOLED display in FIG. 1.

FIG. 6 is a block diagram of the compensation components of the controller 112 of the display system 100 in FIG. 1. The compensation components include an aging extraction unit 600, a backplane aging/matching module 602, a color/share gamma correction module 604, an OLED aging memory 606, and a compensation module 608. The backplane with the electronic components for driving the display system 100 may be any technology including (but not limited to) amorphous silicon, poly silicon, crystalline silicon, organic semiconductors, oxide semiconductors. Also, the display system 100 may be any display material (or device) including (but not limited to) LEDs, or OLEDs.

The aging extraction unit 600 is coupled to receive output data from the array 102 based on inputs to the pixels of the array and corresponding outputs for testing the effects of aging on the array 102. The aging extraction unit 600 uses the output of the column reference pixels 130 as a baseline for comparison with the output of the active pixels 104*a-d* in order to determine the aging effects on each of the pixels 104*a-d* on each of the columns that include the respective column reference pixels 130. Alternatively, the average value of the pixels in the column may be calculated and compared to the value of the reference pixel. The color/share gamma correction module 604 also takes data from the column reference pixels 130 to determine appropriate color corrections to compensate from aging effects on the pixels. The baseline to compare the measurements for the comparison may be stored in lookup tables on the memory 606. The backplane aging/matching module 602 calculates adjustments for the components of the backplane and electronics of the display. The compensation module 608 is provided inputs from the extraction unit 600 the backplane/matching module 602 and the color/share gamma correction module 604 in order to modify programming voltages to the pixels 104*a-d* in FIG. 1 to compensate for aging effects. The compensation module 608 accesses the look up table for the base data for each of the pixels 104*a-d* on the array 102 to be used in conjunction with calibration data. The compensation module 608 modifies the programming voltages to the pixels 104*a-d* accordingly based on the values in the look up table and the data obtained from the pixels in the display array 102.

The controller 112 in FIG. 2 measures the data from the pixels 104*a-d* in the display array 102 in FIG. 1 to correctly normalize the data collected during measurement. The column reference pixels 130 assist in these functions for the pixels on each of the columns. The column reference pixels 130 may be located outside the active viewing area represented by the pixels 104*a-d* in FIG. 1, but such reference pixels may also be embedded within the active viewing areas. The column reference pixels 130 are preserved with a controlled condition such as being un-aged, or aged in a predetermined fashion, to provide offset and cancellation information for measurement data of the pixels 104*a-d* in the display array 102. This information helps the controller 112 cancel out common mode noise from external sources such as room temperature, or within the system itself such as leakage currents from other pixels 104*a-d*. Using a weighted average from several pixels on the array 102 may also provide information on panel-wide characteristics to address problems such as voltage drops due to the resistance across the panel, i.e. current/resistance (IR) drop. Information from the column reference pixels 130 being stressed by a known and controlled source may be used in a compensation algorithm run by the compensation module 608 to reduce compensation errors occurring from any divergence. Various column reference pixels 130 may be selected using the data collected from the initial baseline measurement of the panel. Bad reference pixels are identified, and alternate reference pixels 130 may be chosen to insure further reliability. Of course it is to be understood that the row reference pixels 132 may be used instead of the column reference pixels 130 and the row may be used instead of columns for the calibration and measurement.

Figure 10:
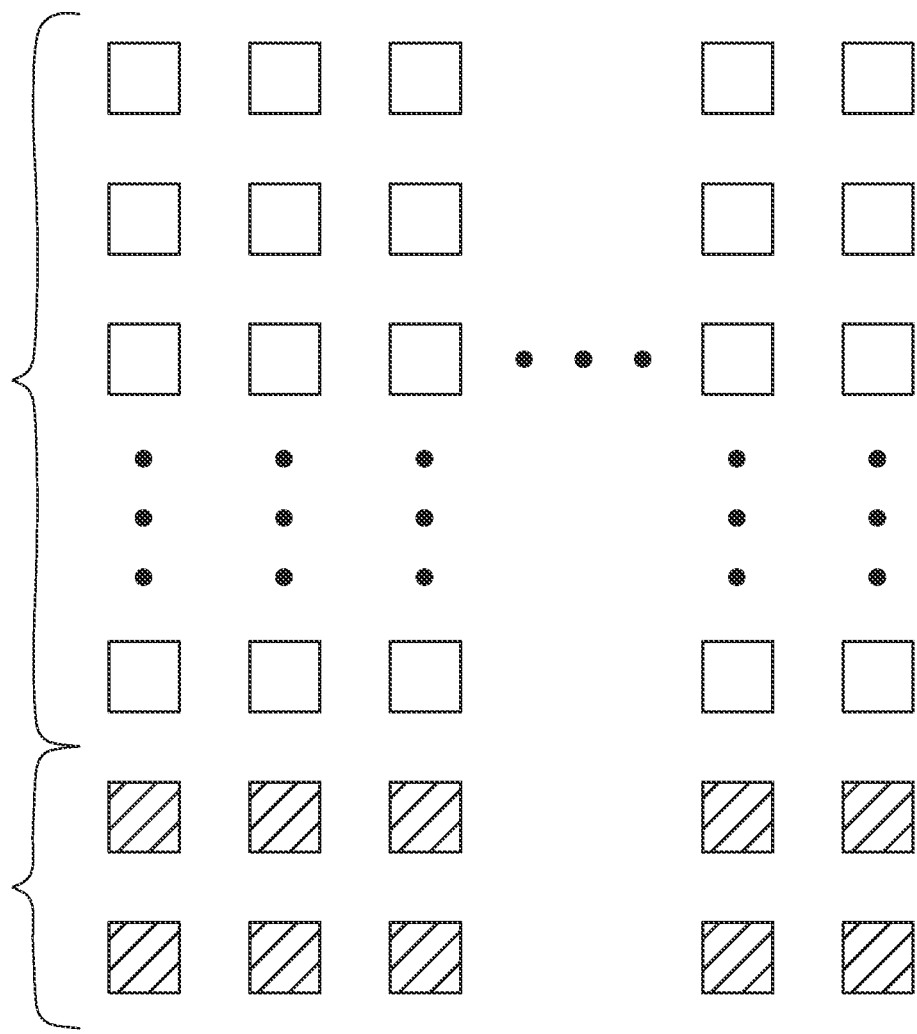
FIG. 10 is a diagrammatic illustration of a display having a matrix of pixels that includes rows of reference pixels.

In displays that use external readout circuits to compensate the drift in pixel characteristics, the readout circuits read at least one of current, voltage and charge from the pixels when the pixels are supplied with known input signals over time. The readout signals are translated into the pixel parameters' drift and used to compensate for the pixel characteristics change. These systems are mainly prone to the shift in the readout circuitry changes due to different phenomena such as temperature variation, aging, leakage and more. As depicted in FIG. 10, rows of reference pixels (the cross hatched pixels in FIG. 10) may be used to remove these effects from the readout circuit, and these reference rows may be used in the display array. These rows of reference pixels are biased in a way that they are substantially immune to aging. The readout circuits read these rows as well as normal display rows. After that, the readout values of the normal rows are trimmed by the reference values to eliminate the unwanted effects. Since each column is connected to one readout circuit, a practical way is to use the reference pixels in a column to tune its normal pixels.

The major change will be the global effects on the panel such as temperature which affects both reference pixel and normal pixel circuits. In this case, this effect will be eliminated from the compensation value and so there will be a separated compensation for such phenomena.

To provide compensation for global phenomena without extra compensation factors or sensors, the effect of global phenomena is subtracted from the reference pixels. There are different methods to calculate the effect of the global phenomena. However, the direct effects are:

Average reference value: here, the average value of the reference pixel values is used as effect of global phenomena. Then this value can be subtracted from all the reference pixels. As a result, if the reference values are modified with a global phenomenon it will be subtracted from them. Thus, when the pixel measured values are being trimmed by the reference values, the global effect in the pixel values will stay intact. Therefore, it will be able to compensate for such an effect.

Master reference pixels: another method is to use master reference pixels (the master references can be a subset of the reference pixels or completely different ones). Similar to the pervious method, the average value of master references is subtracted from the reference pixel circuits resulting in leaving the effect of global phenomena in the pixel measured values.

There are various compensation methods that may make use of the column reference pixels 130 in FIG. 1. For example in thin film transistor measurement, the data value required for the column reference pixel 130 to output a current is subtracted from the data value of a pixel 104a-d in the same column of pixels in the active area (the pixel array 102) to output the same current. The measurement of both the column reference pixels 130 and pixels 104a-d may occur very close in time, e.g. during the same video frame. Any difference in current indicates the effects of aging on the pixels 104a-d. The resulting value may be used by the controller 112 to calculate the appropriate adjustment to programming voltage to the pixels 104a-d to maintain the same luminance during the lifetime of the display. Another use of a column reference pixel 130 is to provide a reference current for the other pixels 104 to serve as a baseline and determine the aging effects on the current output of those pixels. The reference pixels 130 may simplify the data manipulation since some of the common mode noise cancellation is inherent in the measurement because the reference pixels 130 have common data and supply lines as the active pixels 104. The row reference pixels 132 may be measured periodically for the purpose of verifying that luminance curves for the pixels that are stored for use of the controller for compensation during display production are correct.

A measurement of the drive transistors and OLEDs of all of the driver circuits such as the driver circuit 200 in FIG. 2 on a display before shipping the display take 60-120 seconds for a 1080p display, and will detect any shorted and open drive transistors and OLEDs (which result in stuck or unlit pixels). It will also detect non-uniformities in drive transistor or OLED performance (which result in luminance non-uniformities). This technique may replace optical inspection by a digital camera, removing the need for this expensive component in the production facility. AMOLEDs that use color filters cannot be fully inspected electrically, since color filters are a purely optical component. In this case, technology that compensates for aging such as MAXLIFE™ from Ignis may be useful in combination with an optical inspection step, by providing extra diagnostic information and potentially reducing the complexity of optical inspection.

These measurements provide more data than an optical inspection may provide. Knowing whether a point defect is due to a short or open driver transistor or a short or open OLED may help to identify the root cause or flaw in the production process. For example, the most common cause for a short circuit OLED is particulate contamination that lands on the glass during processing, shorting the anode and cathode of the OLED. An increase in OLED short circuits could indicate that the production line should be shut down for chamber cleaning, or searches could be initiated for new sources of particles (changes in processes, or equipment, or personnel, or materials).

A relaxation system for compensating for aging effects such as the MAXLIFE™ system may correct for process non-uniformities, which increases yield of the display. However the measured current and voltage relationships or characteristics in the TFT or OLED are useful for diagnostics as well. For example, the shape of an OLED current-voltage characteristic may reveal increased resistance. A likely cause might be variations in the contact resistance between the transistor source/drain metal and the ITO (in a bottom emission AMOLED). If OLEDs in a corner of a display showed a different current-voltage characteristic, a likely cause could be mask misalignment in the fabrication process.

A streak or circular area on the display with different OLED current-voltage characteristics could be due to defects in the manifolds used to disperse the organic vapor in the fabrication process. In one possible scenario, a small particle of OLED material may flake from an overhead shield and land on the manifold, partially obstructing the orifice. The measurement data would show the differing OLED current-voltage characteristics in a specific pattern which would help to quickly diagnose the issue. Due to the accuracy of the measurements (for example, the 4.8 inch display measures current with a resolution of 100 nA), and the measurement of the OLED current-voltage characteristic itself (instead of the luminance), variations can be detected that are not visible with optical inspection.

This high-accuracy data may be used for statistical process control, identifying when a process has started to drift outside of its control limits. This may allow corrective action to be taken early (in either the OLED or drive transistor (TFT) fabrication process), before defects are detected in the finished product. The measurement sample is maximized since every TFT and OLED on every display is sampled.

If the drive transistor and the OLED are both functioning properly, a reading in the expected range will be returned for the components. The pixel driver circuit requires that the OLED be off when the drive transistor is measured (and vice-versa), so if the drive transistor or OLED is in a short circuit, it will obscure the measurement of the other. If the OLED is a short circuit (so the current reading is MAX), the data will show the drive transistor is an open circuit (current reading MIN) but in reality, the drive transistor could be operational or an open circuit. If extra data about the drive transistor is needed, temporarily disconnecting the supply voltage (EL_VSS) and allowing it to float will yield a correct drive transistor measurement indicating whether the TFT is actually operational or in an open circuit.

In the same way, if the drive transistor is a short circuit, the data will show the OLED is an open circuit (but the OLED could be operational or an open circuit). If extra data about the OLED is needed, disconnecting the supply voltage (EL_VDD) and allowing it to float will yield a correct OLED measurement indicating whether the OLED is actually operational or in an open circuit.

If both the OLED and TFT in a pixel behave as a short circuit, one of the elements in the pixel (likely the contact between TFT and OLED) will quickly burn out during the measurement, causing an open circuit, and moving to a different state. These results are summarized in Table 1 below.

TABLE 1

| | | OLED | | |
| --- | --- | --- | --- | --- |
| | | Short | OK | Open |
| Drive transistor (TFT) | Short | n/a | TFT max OLED min | TFT max OLED min |
| | OK | TFT min OLED max | TFT OK OLED OK | TFT OK OLED min |
| | Open | TFT min OLED max | TFT min OLED OK | TFT min OLED min |

Figure 7:
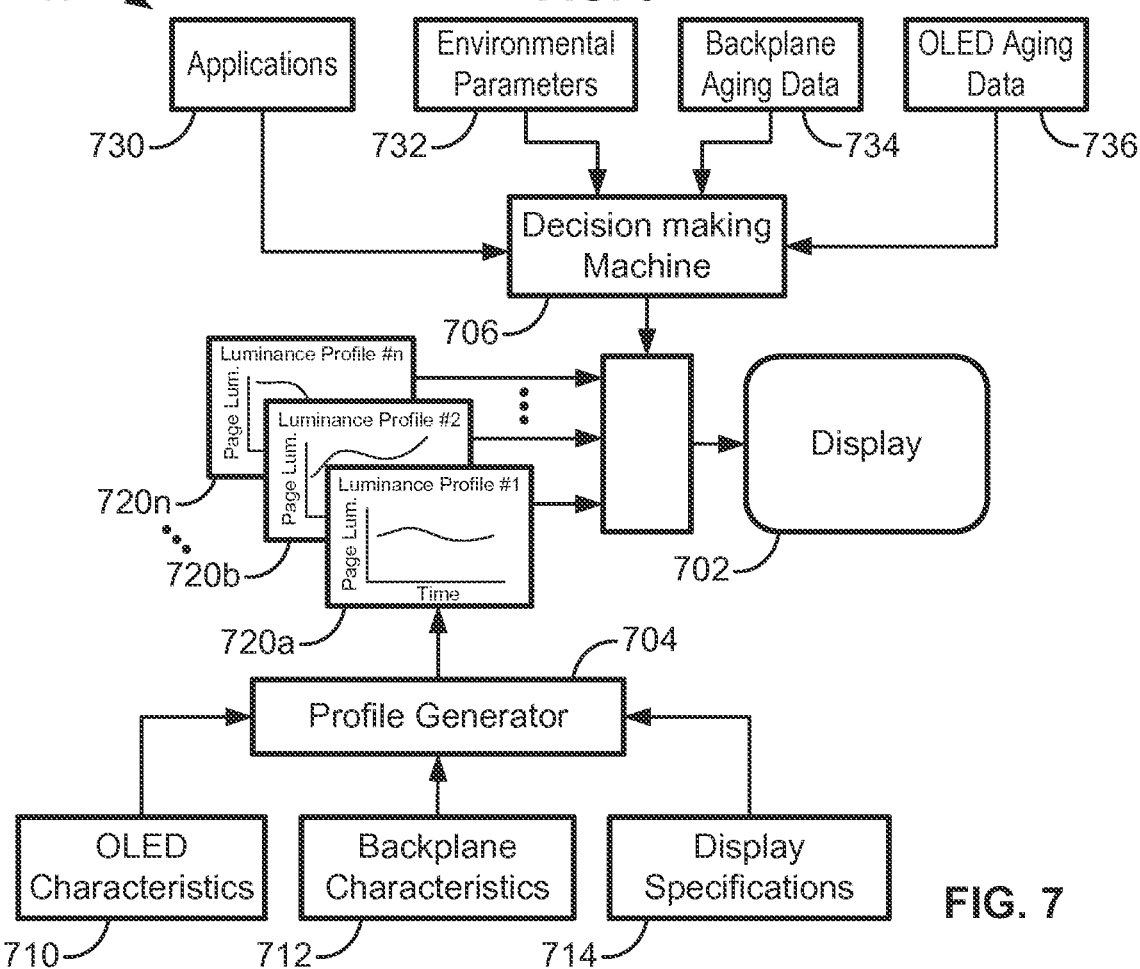
FIG. 7 is a block diagram of a system for the use of multiple luminance profiles for adjustment of a display in different circumstances.

FIG. 7 shows a system diagram of a control system 700 for controlling the brightness of a display 702 over time based on different aspects. The display 702 may be composed of an array of OLEDs or other pixel based display devices. The system 700 includes a profile generator 704 and a decision making machine 706. The profile generator 704 receives characteristics data from an OLED characteristics table 710, a backplane characteristics table 712 and a display specifications file 714. The profile generator 704 generates different luminance profiles 720a, 720b . . . 720n for different conditions. Here, to improve the power consumption, display lifetime, and image quality, the different brightness profiles 720a, 720b . . . 720n may be defined based on OLED and backplane information. Also, based on different applications, one can select different profiles from the luminance profiles 720a, 720b . . . 720n. For example, a flat brightness vs. time profile can be used for displaying video outputs such as movies whereas for brighter applications, the brightness can be drop at a defined rate. The decision making machine 706 may be software or hardware based and includes applications inputs 730, environmental parameter inputs 732, backplane aging data inputs 734 and OLED aging data inputs 736 that are factors in making adjustments in programming voltage to insure the proper brightness of the display 702.

To compensate for display aging perfectly, the short term and long term changes are separated in the display characteristics. One way is to measure a few points across the display with faster times between the measurements. As a result, the fast scan can reveal the short term effects while the normal aging extraction can reveal the long term effects.

Figure 8:
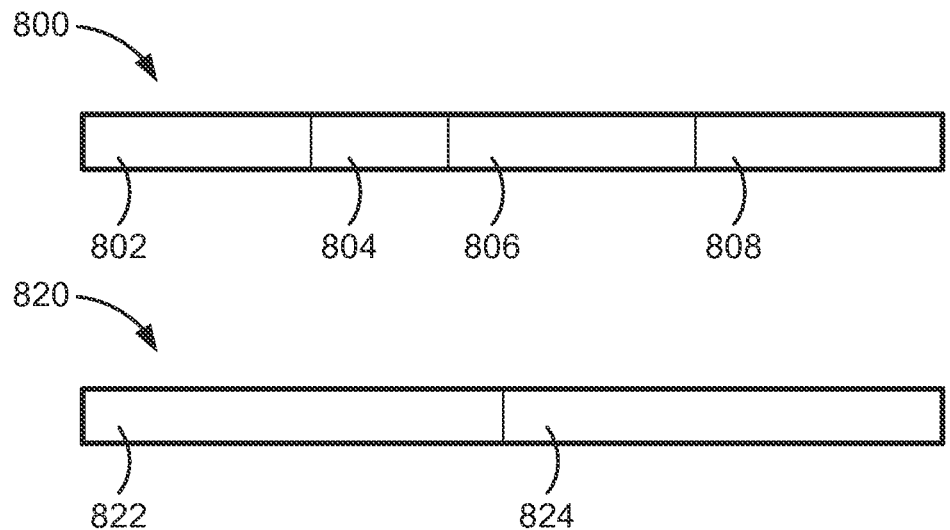
FIG. 8 are frame diagrams of video frames for calibration of pixels in a display.

The previous implementation of compensation systems uses a normal driving scheme, in which there was always a video frame shown on the panel and the OLED and TFT circuitries were constantly under electrical stress. Calibration of each pixel occurred during a video frame by changing the grayscale value of the active pixel to a desired value which caused a visual artifact of seeing the measured sub-pixel during the calibration. If the frame rate of the video is X, then in normal video driving, each video frame is shown on the pixel array 102 in FIG. 1 for 1/X of second and the panel is always running a video frame. In contrast, the relaxation video driving in the present example divides the frame time into four sub-frames as shown in FIG. 8. FIG. 8 is a timing diagram of a frame 800 that includes a video sub-frame 802, a dummy sub-frame 804, a relaxation sub-frame 806 and a replacement sub-frame 808.

The video sub-frame 802 is the first sub-frame which is the actual video frame. The video frame is generated the same way as normal video driving to program the entire pixel array 102 in FIG. 1 with the video data received from the programming inputs. The dummy sub-frame 804 is an empty sub-frame without any actual data being sent to the pixel array 102. The dummy sub-frame 804 functions to keep the same video frame displayed on the panel 102 for some time before applying the relaxation sub-frame 806. This increases the luminance of the panel.

The relaxation sub-frame 806 is the third sub-frame which is a black frame with zero gray scale value for all of the red green blue white (RGBW) sub-pixels in the pixel array 102. This makes the panel black and sets all of the pixels 104 to a predefined state ready for calibration and next video sub-frame insertion. The replacement sub-frame 808 is a short sub-frame generated solely for the purpose of calibration. When the relaxation sub-frame 806 is complete and the panel is black the data replacement phase starts for the next video frame. No video or blank data is sent to the pixel array 102 during this phase except for the rows with replacement data. For the non-replacement rows only the gate driver's clock is toggled to shift the token throughout the gate driver. This is done to speed up the scanning of the entire panel and also to be able to do more measurement per each frame.

Another technique is used to further alleviate the visual artifact of the measured sub-pixel during the replacement sub-frame 808. This has been done by re-programming the measured row with black as soon as the calibration is done. This returns the sub-pixel to the same state as it was during the relaxation sub-frame 806. However, there is still a small current going through the OLEDs in the pixels, which makes the pixel light up and become noticeable to the outside world. Therefore to re-direct the current going through the OLED, the controller 112 is programmed with a non-zero value to sink the current from the drive transistor of the pixel and keep the OLED off.

Having a replacement sub-frame 808 has a drawback of limiting the time of the measurement to a small portion of the entire frame. This limits the number of sub-pixel measurements per each frame. This limitation is acceptable during the working time of the pixel array 102. However, for a quick baseline measurement of the panel it would be a time-consuming task to measure the entire display because each pixel must be measured. To overcome this issue a baseline mode is added to the relaxation driving scheme. FIG. 8 also shows a baseline frame 820 for the driving scheme during the baseline measurement mode for the display. The baseline measurement frame 820 includes a video sub-frame 822 and a replacement sub-frame 824. If the system is switched to the baseline mode, the driving scheme changes such that there would only be two sub-frames in a baseline frame such as the frame 820. The video sub-frame 822 includes the normal programming data for the image. In this example, the replacement (measurement sub-frame) 824 has a longer duration than the normal replacement frame as shown in FIG. 8. The longer sub-frame drastically increases the total number of measurements per each frame and allows more accurate measurements of the panel because more pixels may be measured during the frame time.

The steep slope of the $\Delta V$ shift (electrical aging) at the early OLED stress time results in a curve of efficiency drop versus $\Delta V$ shift that behaves differently for the low value of $\Delta V$ compared to the high $\Delta V$ ranges. This may produce a highly non-linear $\Delta \eta$-$\Delta V$ curve that is very sensitive to initial electrical aging of the OLED or to the OLED pre-aging process. Moreover, the shape (the duration and slope) of the early $\Delta V$ shift drop can vary significantly from panel to panel due to process variations.

The use of a reference pixel and corresponding OLED is explained above. The use of such a reference pixel cancels the thermal effects on the $\Delta V$ measurements since the thermal effects affect both the active and reference pixels equally. However, instead of using an OLED that is not aging (zero stress) as a reference pixel such as the column reference pixels 130 in FIG. 1, a reference pixel with an OLED having a low level of stress may be used. The thermal impact on the voltage is similar to the non-aging OLED, therefore the low stress OLED may still be used to remove the measurement noise due to thermal effects. Meanwhile, due to the similar manufacturing condition with the rest of OLED based devices on the same panel the slightly stressed OLED may be as a good reference to cancel the effects of process variations on the $\Delta \eta$-$\Delta V$ curve for the active pixels in a column. The steep early $\Delta V$ shift will also be mitigated if such an OLED is used as a reference.

To use a stressed-OLED as a reference, the reference OLED is stressed with a constant low current (⅕ to ⅓ of full current) and its voltage (for a certain applied current) must be used to cancel the thermal and process issues of the pixel OLEDs as follows:

$$W = \frac{V_{pixelOLED} - V_{refOLED}}{V_{refOLED}}$$

Figure 9:
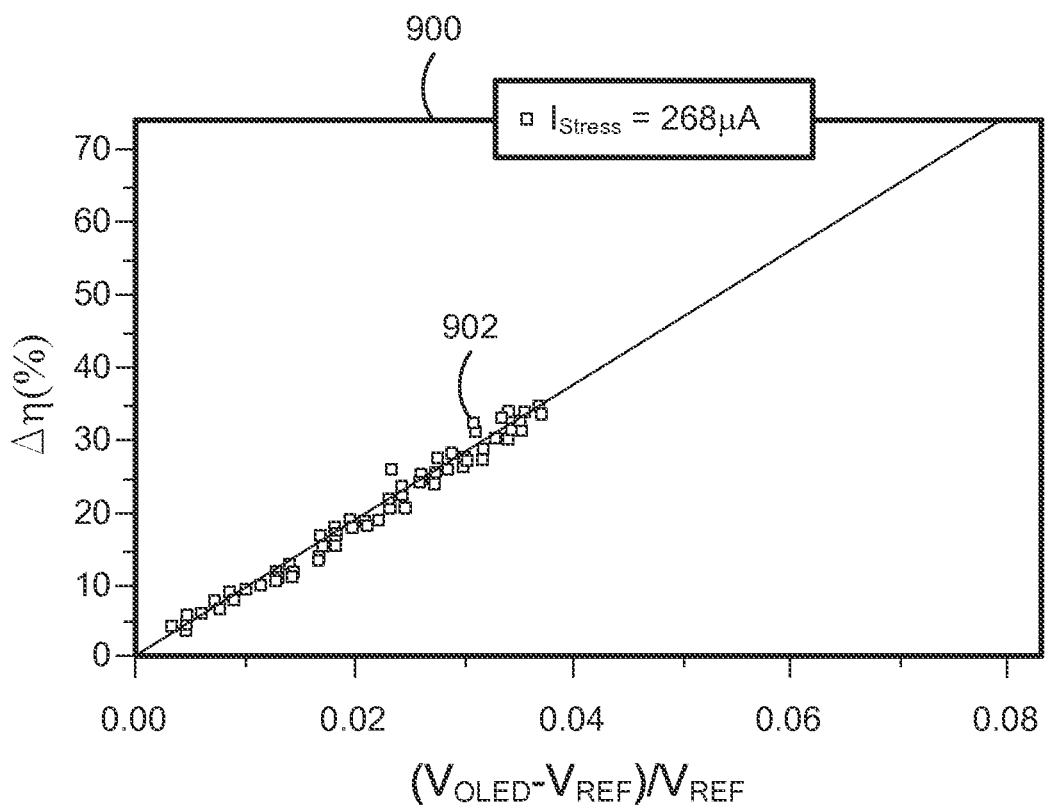
FIG. 9 is a graph showing the use of a small current applied to a reference pixel for more accurate aging compensation.

In this equation, W is the relative electrical aging based on the difference between the voltage of the active pixel OLED and the reference pixel OLED is divided by the voltage of the reference pixel OLED. FIG. 9 is a graph 900 that shows a plot 902 of points for a stress current of 268 uA based on the W value. As shown by the graph 900, the W value is a close-to-linear relation with the luminance drop for the pixel OLEDs as shown for a high stress OLED.

Figure 11:
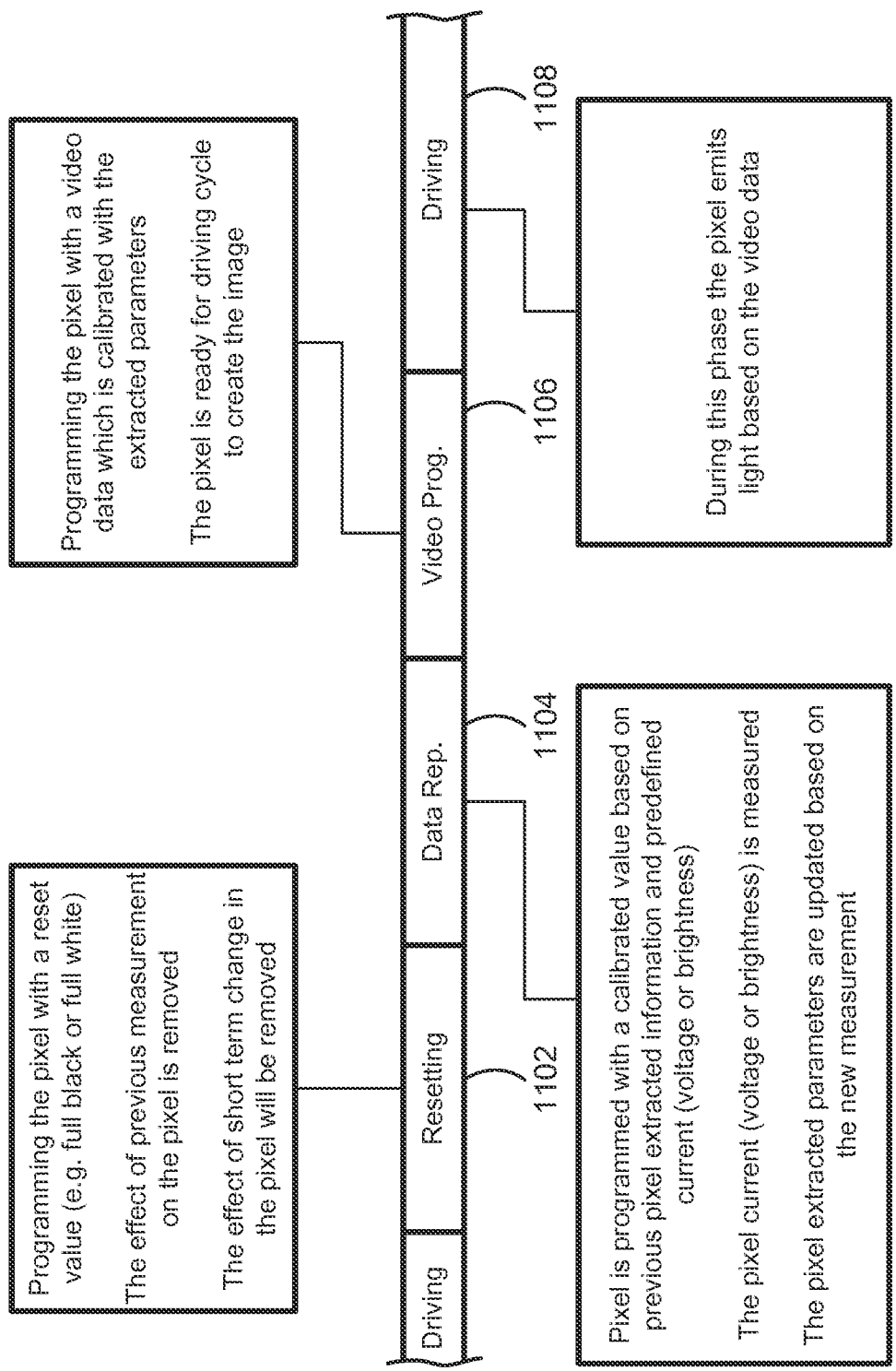
FIG. 11 is a timing diagram for aging compensation by applying a resetting cycle before programming during which the pixel is programmed with a reset value.

In FIG. 11 a timing diagram 1100 for pixel compensation that involves resetting the pixel circuit before programming. Depending on the process parameters, the pixel circuits after being driven can suffer from adverse artifacts such as charge trapping or fast light transitions. For example, amorphous or poly-silicon processes can lead to charge trapping in which the pixel circuit retains residual amounts of charge in the storage capacitor following the driving cycle. Metal oxide processes can cause the pixel circuits to be more susceptible to light transitions, during which the pixel changes rapidly, such as during fast video sequences. Before the pixel current is measured (to compensate for aging, process non-uniformities, or other effects), these artifacts can affect the calibration of the pixel circuits. To compensate for these artifacts, the timing sequence 1100 has a resetting cycle 1102. During the resetting cycle 1102, the pixel circuit to be measured is programmed with a reset voltage value corresponding to a maximum or a minimum voltage value, which is dependent upon the process used to fabricate the display array. For example, in a display array fabricated according to an amorphous or poly-silicon process, the reset voltage value can correspond to a full black value (a value that causes the pixel circuit to display black). For example, in a display fabricated using a metal oxide process, the reset voltage value can correspond to a full white value (a value that causes the pixel circuit to display white).

During the resetting cycle 1102, the effect of the previous measurement on the pixel circuit (e.g., remnant charge trapping in the pixel circuit) is removed as well as any effects due to short term changes in the pixel circuit (e.g., fast light transitions). Following the resetting cycle 1102, during a calibration cycle 1104, the pixel circuit is programmed with a calibration voltage based on previously extracted data or parameters for the pixel circuit. The calibration voltage can also be based on a predefined current, voltage, or brightness. During the calibration cycle 1104, the pixel current of the pixel circuit is then measured, and the extracted data or parameters for the pixel circuit is updated based on the measured current.

During a programming cycle 1106 following the calibration cycle 1104, the pixel circuit is programmed with a video data that is calibrated with the updated extracted data or parameters. Then, the pixel circuit is driven, during a driving cycle 1108 that follows the programming cycle 1106, to emit light based on the programmed video data.

Figure 12A:
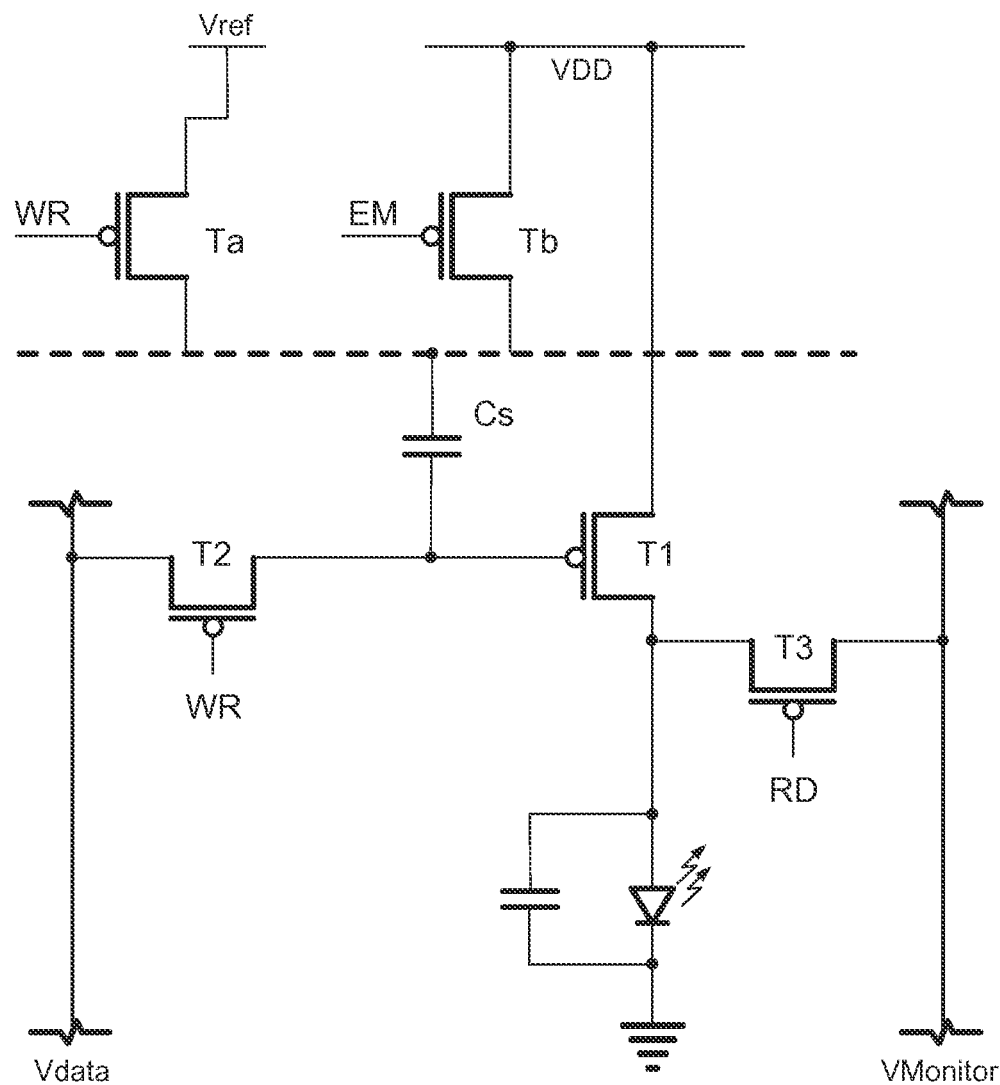
FIG. 12A is a circuit diagram of a pixel circuit with IR drop compensation.

FIG. 12A illustrates a pixel circuit with IR drop compensation. $V_{monitor}$ and $V_{data}$ can be the same line (or connected together) because $V_{monitor}$ has no role during programming and $V_{data}$ has no role during measurement cycle. Transistors Ta and Tb can be shared between rows and columns. Signal line EM (emission) can be shared between columns.

Figure 12B:
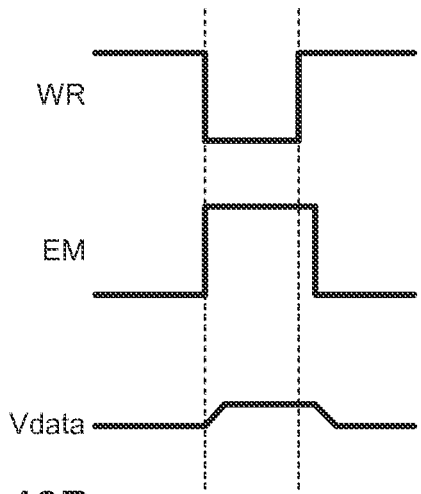
FIG. 12B is a timing diagram for normal operation of the pixel circuit of FIG. 12A.

FIG. 12B is a timing diagram illustrating normal operation of the pixel circuit shown in FIG. 12A. The signal WR is active and the programming data ($V_P$) is written into the capacitor $C_S$. At the same time, the signal line EM is off and so the other side of the capacitor $C_S$ is connected to a reference voltage, $V_{ref}$. Thus the voltage stored in the capacitor $C_S$ is ($V_{ref}$-$V_P$). During the driving (emission) cycle, the signal line EM is active and WR is off. Thus, the gate-source voltage of becomes $V_{ref}$-$V_P$ and independent of $V_{DD}$.

Figure 12C:
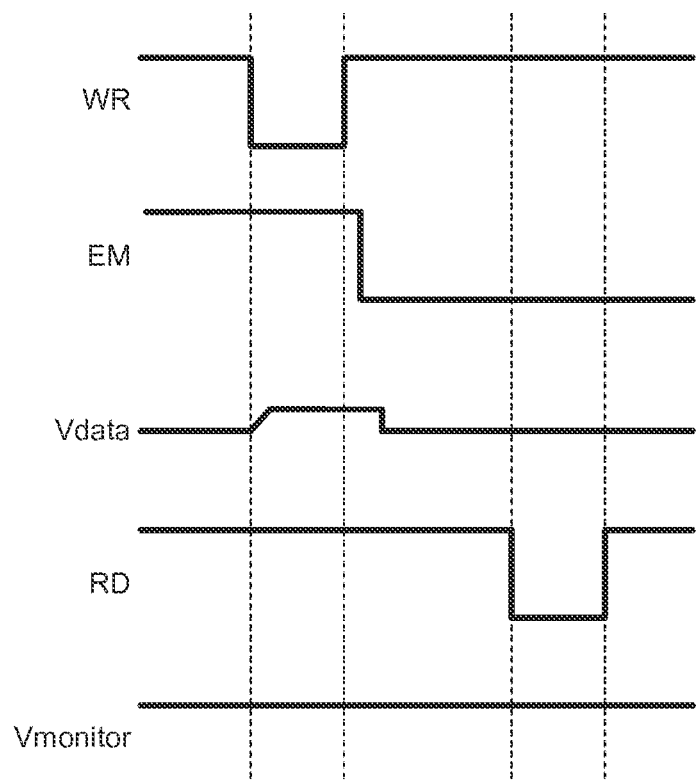
FIG. 12C is a timing diagram for a direct TFT readout from the pixel circuit of FIG. 12A.

FIG. 12C is a timing diagram for a direct TFT readout of the circuit of FIG. 12A. The pixel circuit is programmed with a calibrated voltage for a known target current. During the second cycle, RD is active and the pixel current is read through $V_{monitor}$. The $V_{monitor}$ voltage during the second cycle should be low enough that the OLED does not turn ON. The calibrated voltage is modified until the pixel current becomes the same as the target current. The modified calibrated voltage is used as a point in TFT current-voltage characteristics to extract its parameter. One can also apply a current to the pixel through $V_{monitor}$ while WR is active and the $V_{data}$ is set to a fixed voltage. At this point, the created voltage on $V_{monitor}$ is the TFT gate voltage for the corresponding current.

Figure 12D:
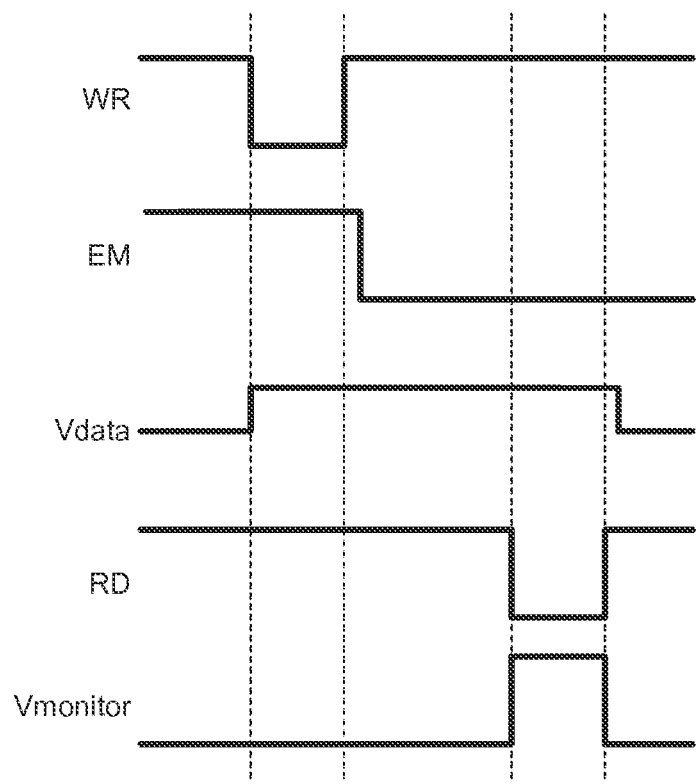
FIG. 12D is a timing diagram for a direct OLED readout from the pixel circuit of FIG. 12A.

FIG. 12D is a timing diagram for a direct OLED readout in the circuit of FIG. 12A. The pixel circuit is programmed with an off voltage so that TFT does not provide any current. During the second cycle, RD is active and the OLED current is read through $V_{monitor}$. The $V_{monitor}$ voltage during the second cycle is pre-calibrated based for a known target current. The $V_{monitor}$ voltage is modified until the OLED current becomes the same as the target current. The modified $V_{monitor}$ voltage is used as a point in the OLED current-voltage characteristic to extracts its parameter. One can extend the signal line EM off all the way to the end of the readout cycle while keeping the write line WR active. In this case, the remaining pixel operations for reading the OLED will be the same as the previous steps. One can also apply a current to the OLED through $V_{monitor}$. At this point the created voltage on $V_{monitor}$ is the TFT gate voltage for the corresponding current.

Figure 13A:
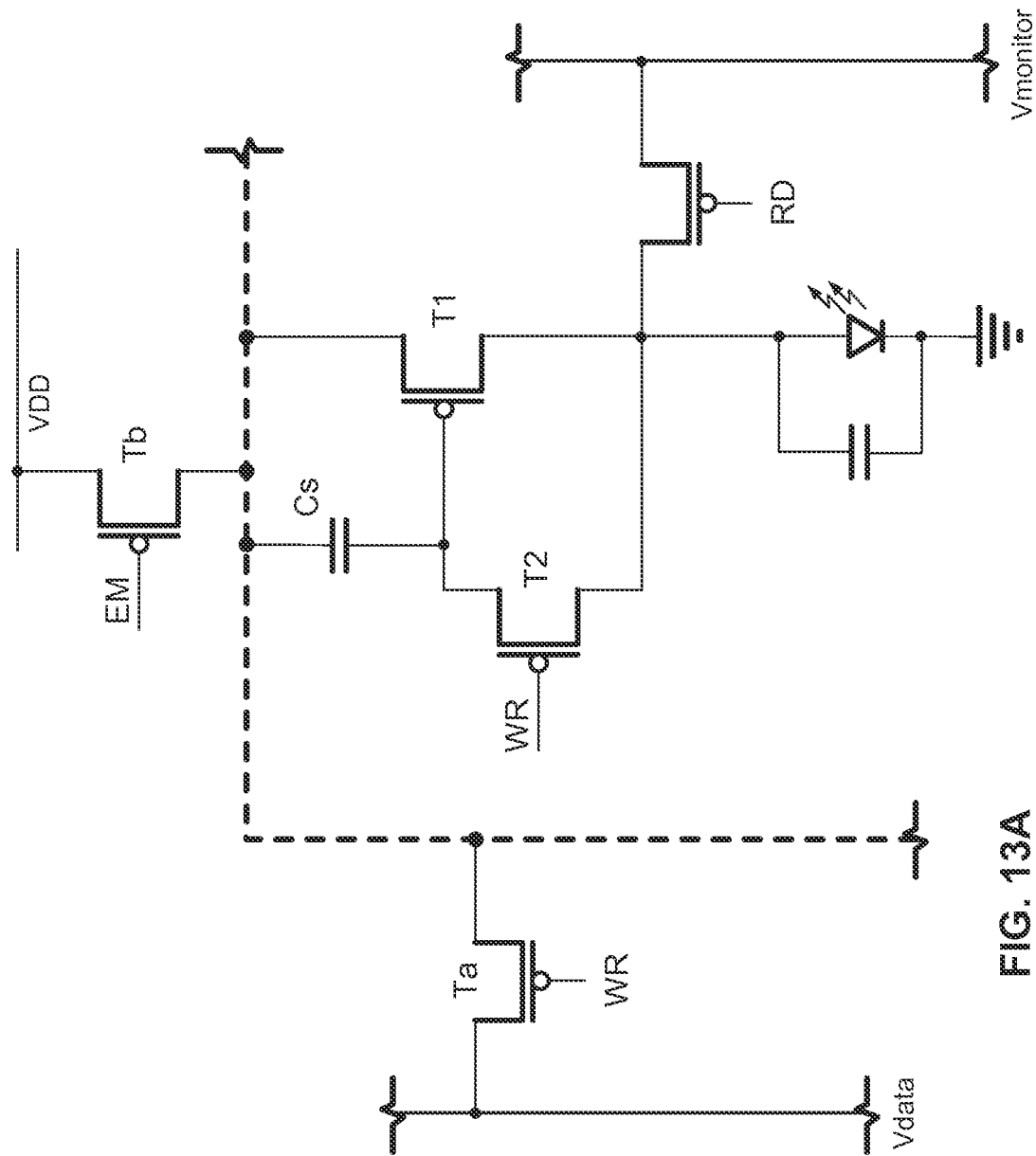
FIG. 13A is a circuit diagram of a pixel circuit with charge-based compensation.

FIG. 13A illustrates a pixel circuit with charge-based compensation. The $V_{monitor}$ readout line can be shared between adjacent columns, and the transistors Ta and Tb can be shared between rows. The $V_{monitor}$ line can be or connected to the same line as the $V_{data}$ line as well. In this case, the $V_{data}$ line can be a fixed voltage ($V_{ref}$).

Figure 13B:
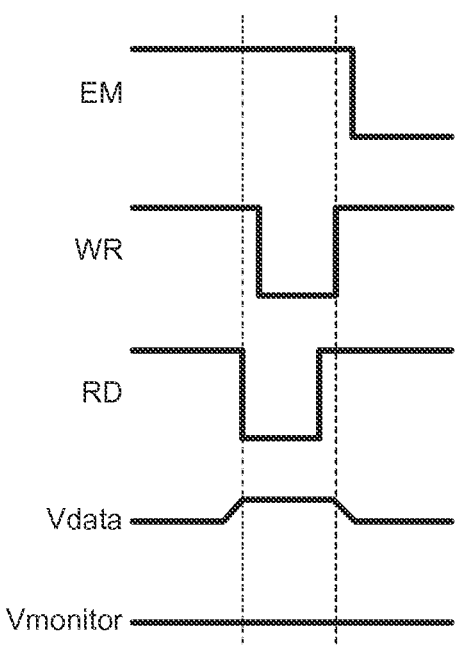
FIG. 13B is a timing diagram for normal operation of the pixel circuit of FIG. 13A.

FIG. 13B is a timing diagram illustrating a normal operation of the pixel circuit shown in FIG. 13A. While the WR (write) and RD (readout) lines are active, the programming voltage $V_P$ and the reference voltage $V_{ref}$ are applied to the pixel circuit through the $V_{data}$ lines and the $V_{monitor}$ line. The reference voltage $V_{ref}$ should be low enough so that OLED does not turn on. The readout line RD can turn off sooner than the write line WR. During this time gap, the transistor T1 will start to charge the $V_{OLED}$ and so compensate for part of the TFT variation because the charge generated will be a function of a TFT parameter. The pixel is also independent of IR drop because the source of the transistor T1 is disconnected from the power supply voltage $V_{dd}$ during the programming cycle.

Figure 13C:
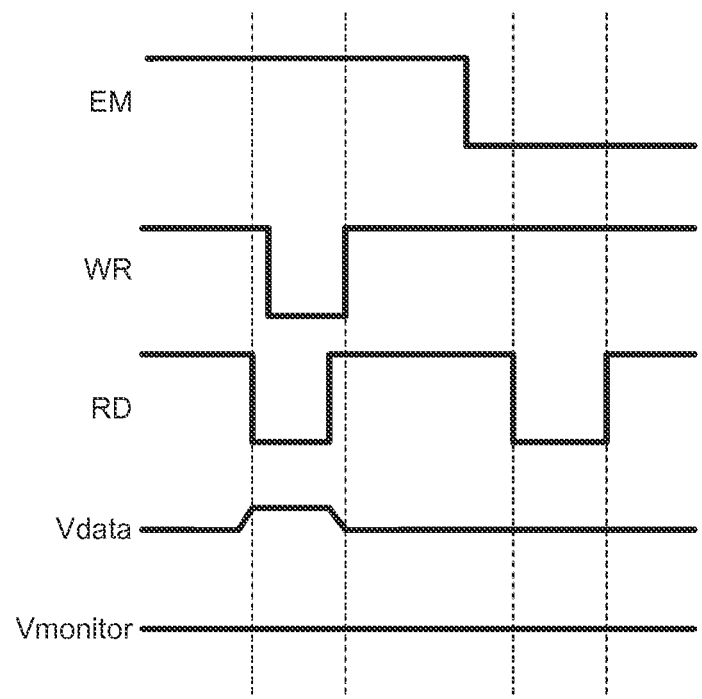
FIG. 13C is a timing diagram for a direct TFT readout from the pixel circuit of FIG. 13A.

A TFT direct readout is depicted in the timing diagram of FIG. 13C. The pixel circuit is programmed with a calibrated voltage for a known target current. During the second cycle, RD is active and the pixel current is read through the $V_{monitor}$ line. The $V_{monitor}$ voltage during the second cycle should be low enough that the OLED does not turn on. The calibrated voltage is modified until the pixel current becomes the same as the target current. The modified calibrated voltage is used as a point in the TFT current-voltage characteristics to extracts its parameter. One can also apply a current to the pixel through $V_{monitor}$ while the write line WR is active and the data line $V_{data}$ is set to a fixed voltage. At this point the created voltage on $V_{monitor}$ is the TFT gate voltage for the corresponding current.

Figure 13D:
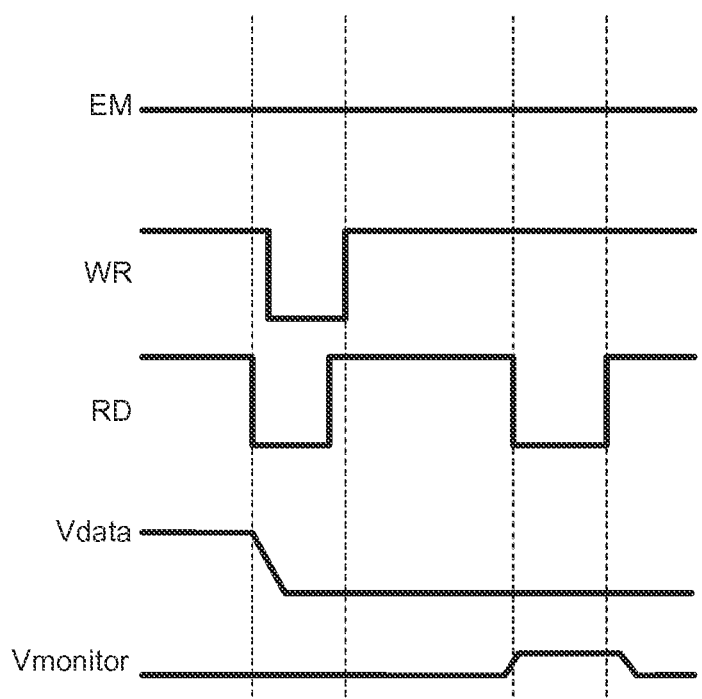
FIG. 13D is a timing diagram for a direct OLED readout from the pixel circuit of FIG. 13A.

A direct OLED readout cycle is depicted in the timing diagram of FIG. 13D. The pixel circuit is programmed with an off voltage so that TFT T1 does not provide any current. During the second cycle, the readout line RD is active and the OLED current is read through the $V_{monitor}$ line. The $V_{monitor}$ voltage during the second cycle is pre-calibrated for a known target current. The $V_{monitor}$ voltage is modified until the OLED current becomes the same as the target current. The modified $V_{monitor}$ voltage is used as a point in the OLED current-voltage characteristics to extracts its parameter. One can extend the emission line EM off all the way to the end of the readout cycle and keep the WR active. In this case, the remaining pixel operations for reading OLED will be the same as previous steps. One can also apply a current to the OLED through $V_{monitor}$. At this point the created voltage on $V_{monitor}$ is the TFT gate voltage for the corresponding current.

Figure 13E:
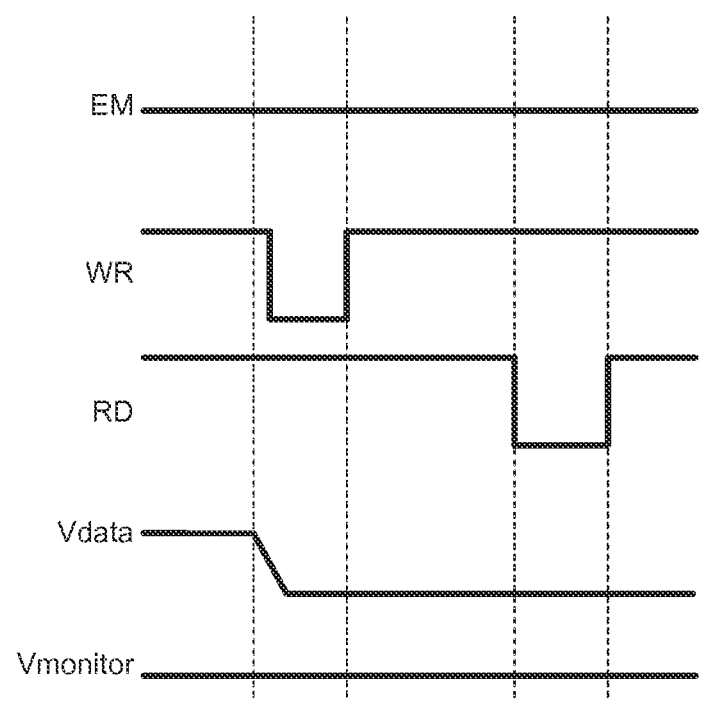
FIG. 13E is a timing diagram for an indirect OLED readout from the pixel circuit of FIG. 13A.

An indirect OLED readout is depicted in the timing diagram of FIG. 13E. Here the pixel current is read out in a manner similar to the operation depicted in FIG. 12. The only difference is that during the programming RD is off and so the gate voltage of the transistor T1 is set to the OLED voltage. Thus, the calibrated voltage needs to consider the effect of the OLED voltage and the TFT parameter to make the pixel current equal to the target current. One can use this calibrated voltage and the voltage extracted from the direct TFT readout to extract the OLED voltage. For example, subtracting the calibrated voltage extracted by this process from the calibrated voltage extracted by the TFT direct readout will result to the effect of OLED if the two target currents are the same.

Figure 14:
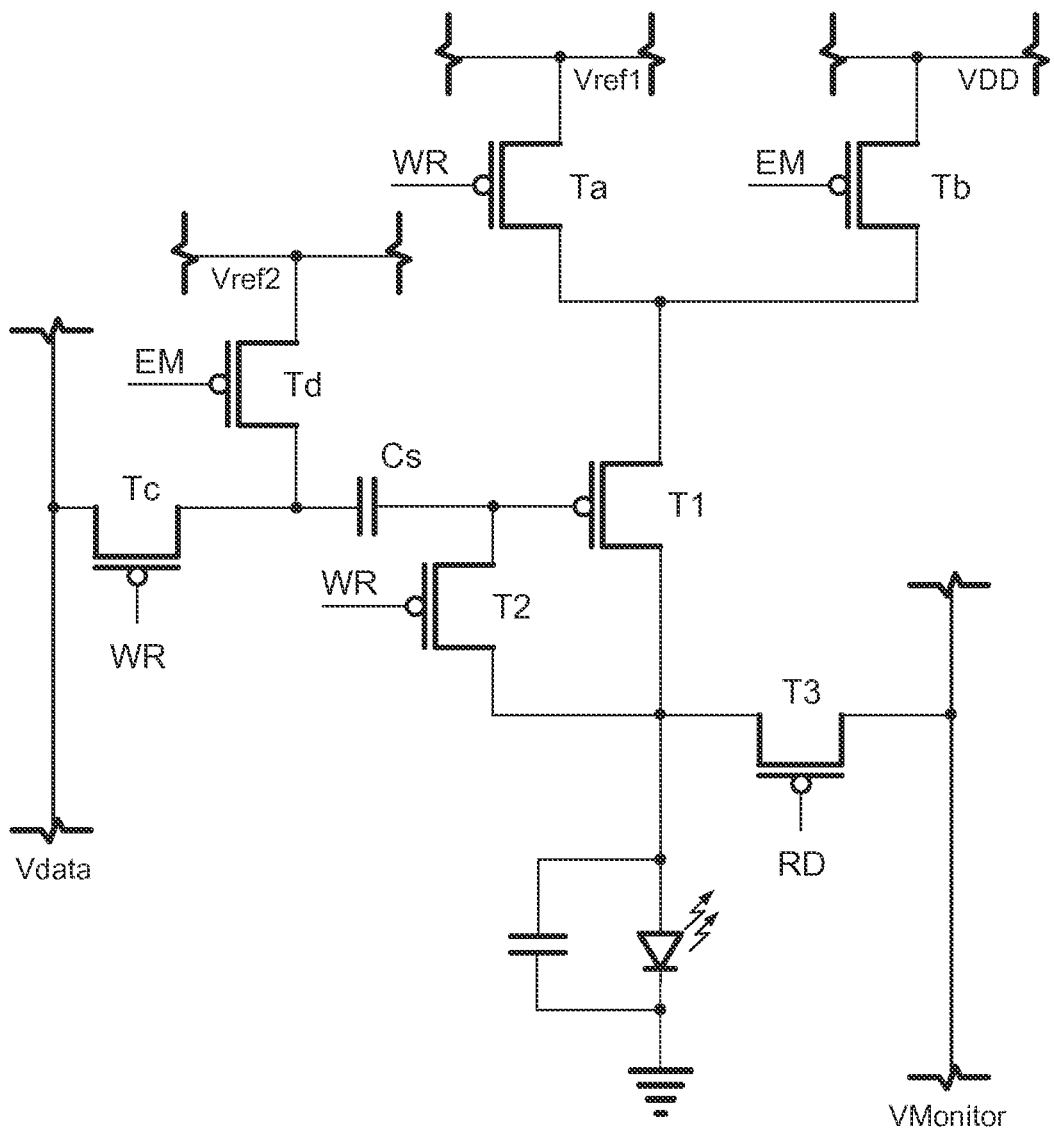
FIG. 14 is a circuit diagram of a biased pixel circuit.

FIG. 14 illustrates a biased pixel circuit in which a second reference voltage Vref2 can be the same as the power supply voltage $V_{dd}$, the transistors Ta and Tb can be shared with columns and rows, the transistors Td and Tc can be shared with rows, and the pixel monitor line $V_{monitor}$ can be shared with columns. In normal operation, the write line WR and the readout line RD are active and the emission line EM is disabled, the pixel voltage monitoring line $V_{monitor}$ is connected to a reference current Iref and the data line $V_{data}$ is connected to a programming voltage from the source driver. The gate of T1 is charged to a bias voltage related to the reference current and so that the voltage stored in the capacitor $C_S$ is a function of $V_P$ and a bias voltage.

One can use the systems described herein to analyze panels during different stage of fabrication to detect defects. The major detection steps can be carried out after backplane fabrication, after OLED fabrication, and/or after full assembly. At each stage the information provided by the systems described above can be used to identify the defects which can then be repaired with different methods, such as laser repair.

Figure 15B:
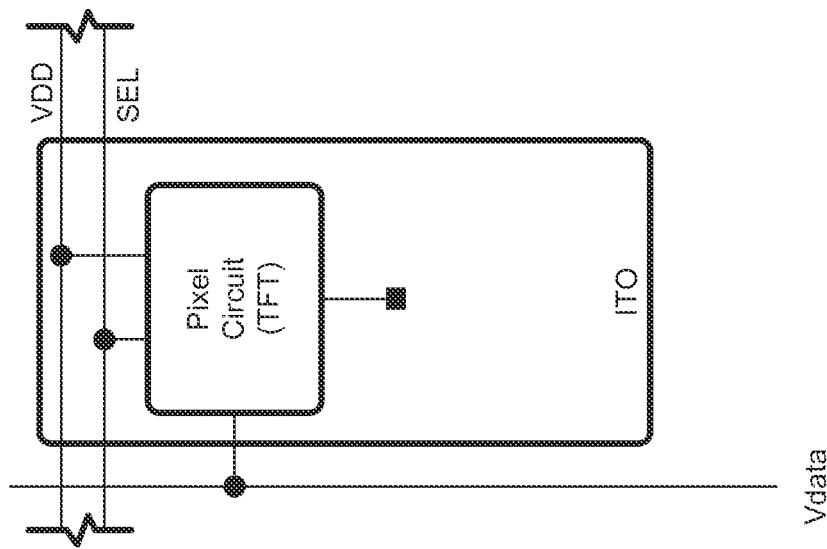
FIG. 15B is a circuit diagram of a pixel circuit with an ITO electrode patterned as a signal line.
Figure 15A:
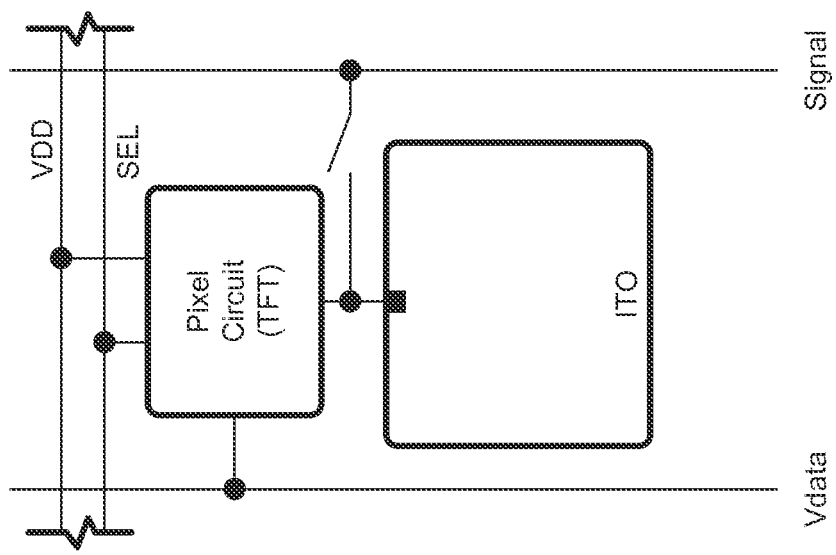
FIG. 15A is a circuit diagram of a pixel circuit with a signal line connected to an OLED and pixel circuit.

FIG. 15A illustrates a pixel circuit with a Signal line connected to the OLED and the TFT, and FIG. 15B illustrates a pixel circuit and an ITO electrode patterned as a signal line. To be able to measure the panel, there should be either a direct path to each pixel to measure the pixel current, as depicted in FIG. 15A, or one can use a partial electrode patterning for the measurement path. In the latter case, the electrode (e.g., ITO or any other material) is patterned to vertical lines first, as depicted in FIG. 15B, and then the electrode is patterned to pixels after the measurement is finished.

Figure 16:
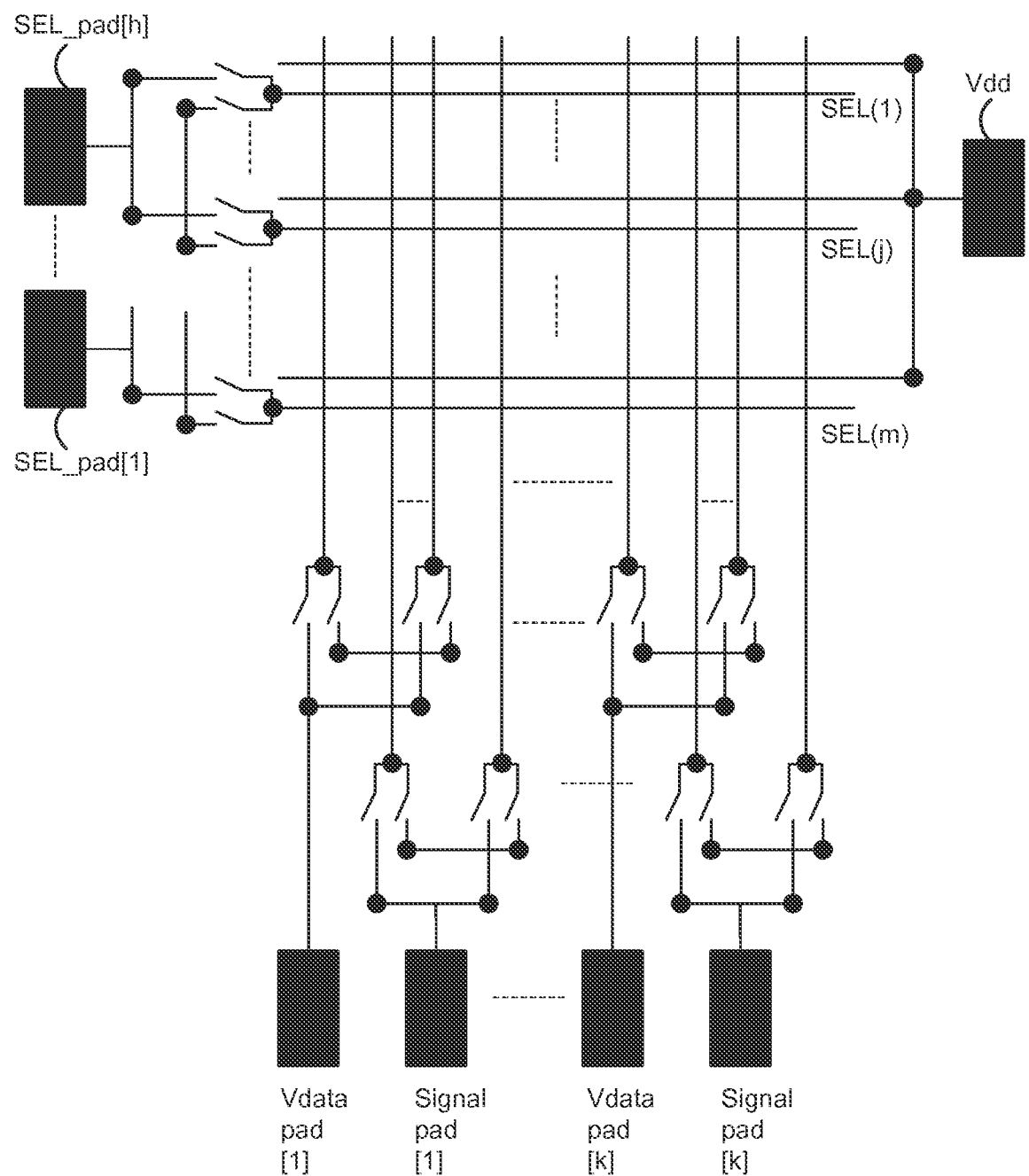
FIG. 16 is a schematic diagram of a pad arrangement for the probing of a panel.

FIG. 16 illustrates a typical arrangement for a panel and its signals during a test. Every other signal is connected to one pad through a multiplexer having a default stage that connects the signal to a default value. Every signal can be selected through the multiplexer to either program the panel or measure the current/voltage/charge from the pixel.

FIG. 17 illustrates a pixel circuit that can be used for a factory test to identify defects in the pixels after backplane fabrication. The following tests are defined based on the pixel circuit illustrated in FIG. 17, but similar tests can be conducted with different pixel circuits.

In a first test:
WR is high (Data=high and Data=low and Vdd=high).

|  | $I_{data\_high} < I_{th\_high}$ | $I_{data\_high} > I_{th\_high}$ |
|---|---|---|
| $I_{data\_low} > I_{th\_low}$ | NA | T1: short <br> ‖ B: stock at high <br> (if data current is high, B is stuck at high) |
| $I_{data\_low} < I_{th\_low}$ | T1: open <br> ‖ T3: open | T1: OK <br> && T2: ? <br> && T3: OK |

Here, $I_{th\_low}$ is the lowest acceptable current allowed for the Data=low, and $I_{th\_high}$ is the highest acceptable current for Data=high.

In a second test:
Static: WR is high (Data=high and Data=low);
Dynamic: WR goes high and after programming it goes to low (Data=low to high and Data=high to low).

|  | $I_{static\_high} < I_{th\_high\_st}$ | $I_{static\_high} > I_{th\_high\_st}$ |
|---|---|---|
| $I_{dyn\_high} > I_{th\_high\_dyn}$ | ? | T2: OK |
| $I_{dyn\_high} < I_{th\_high\_dyn}$ | T2: open | T2: short |

$I_{th\_high\_dyn}$ is the highest acceptable current for data high with dynamic programming.

$I_{th\_high\_low}$ is the highest acceptable current for data high with static programming.

One can also use the following pattern:
Static: WR is high (Data=low and Data=high);
Dynamic: WR goes high and after programming it goes to low (Data=high to low).

FIG. 18 is an example pixel circuit that can be used for testing the full display. In a test of the full display:
T1 and OLED current are measured through the $V_{monito}r$ line;
Condition 1: T1 is OK from the backplane test.

|  | $I_{oled} > I_{oled\_high}$ | $I_{oled} < I_{oled\_low}$ | $I_{oled}$ is OK |
|---|---|---|---|
| $I_{tft} > I_{tft\_high}$ | x | x | x |
| $I_{tft} < I_{tft\_low}$ | OLED: short | OLED: open <br> ‖ T3: open | OLED: open |
| $I_{tft}$ is OK | x | OLED: open | OLED: ok |

$I_{tft\_high}$ is the highest possible current for TFT current for a specific data value.

$I_{tft\_high}$ is the lowest possible current for TFT current for a specific data value.

$I_{oled\_high}$ is the highest possible current for OLED current for a specific OLED voltage.

Ioled_low is the lowest possible current for OLED current for a specific OLED voltage.

In another test:
Measuring T1 and OLED current through monitor;
Condition 2: T1 is open from the backplane test.

|  | $I_{oled} > I_{oled\_high}$ | $I_{oled} < I_{oled\_low}$ | $I_{oled}$ is OK |
|---|---|---|---|
| $I_{tft} > I_{tft\_high}$ | X | X | X |
| $I_{tft} < I_{tft\_low}$ | OLED: short | OLED: open \|\| T3: open | OLED: open |
| $I_{tft}$ is OK | x | x | x |

In a further test:
Measuring T1 and OLED current through monitor;
Condition 3: T1 is short from the backplane test.

|  | $I_{oled} > I_{oled\_high}$ | $I_{oled} < I_{oled\_low}$ | $I_{oled}$ is OK |
|---|---|---|---|
| $I_{tft} > I_{tft\_high}$ | X | X | X |
| $I_{tft} < I_{tft\_low}$ | OLED: short | OLED: open \|\| T3: open | OLED: open |
| $I_{tft}$ is OK | x | x | x |

Detected defects can be corrected by making compensating adjustments in the display. For defects that are darker than the sounding pixels, one can use surrounding pixels to provide the extra brightness required for the video/images. There are different methods to provide this extra brightness, such as:

(1) Using all immediate surrounding pixels, divide the extra brightness between each of them. The challenge with this method is that in most of the cases, the portion assigned to each pixel will not be generated by that pixel accurately. Since the error generated by each surrounding pixel will be added to the total error, the error will be very large, reducing the effectiveness of the correction.

(2) Using one or two of the surrounding pixels to generate the extra brightness required by defective pixel, one can switch the position of the active pixels in compensation to minimize the localized artifact.

During the lifetime of the display, some soft defect can create stuck-on (always bright) pixels, which tends to be very annoying for the user. The real-time measurement of the panel can identify the newly generated stuck-on pixel, and then extra voltage can be applied through the monitor line to kill the OLED, turning it to a dark pixel. Also, the compensation method described above can be used to reduce the visual effect of the dark pixels.

The above described methods of extracting baseline measurements of the pixels in the array may be performed by a processing device such as the 112 in FIG. 1 or another such device which may be conveniently implemented using one or more general purpose computer systems, microprocessors, digital signal processors, micro-controllers, application specific integrated circuits (ASIC), programmable logic devices (PLD), field programmable logic devices (FPLD), field programmable gate arrays (FPGA) and the like, programmed according to the teachings as described and illustrated herein, as will be appreciated by those skilled in the computer, software and networking arts.

In addition, two or more computing systems or devices may be substituted for any one of the controllers described herein. Accordingly, principles and advantages of distributed processing, such as redundancy, replication, and the like, also can be implemented, as desired, to increase the robustness and performance of controllers described herein.

The operation of the example baseline data determination methods may be performed by machine readable instructions. In these examples, the machine readable instructions comprise an algorithm for execution by: (a) a processor, (b) a controller, and/or (c) one or more other suitable processing device(s). The algorithm may be embodied in software stored on tangible media such as, for example, a flash memory, a CD-ROM, a floppy disk, a hard drive, a digital video (versatile) disk (DVD), or other memory devices, but persons of ordinary skill in the art will readily appreciate that the entire algorithm and/or parts thereof could alternatively be executed by a device other than a processor and/or embodied in firmware or dedicated hardware in a well-known manner (e.g., it may be implemented by an application specific integrated circuit (ASIC), a programmable logic device (PLD), a field programmable logic device (FPLD), a field programmable gate array (FPGA), discrete logic, etc.). For example, any or all of the components of the baseline data determination methods could be implemented by software, hardware, and/or firmware. Also, some or all of the machine readable instructions represented may be implemented manually.

Figure 19:
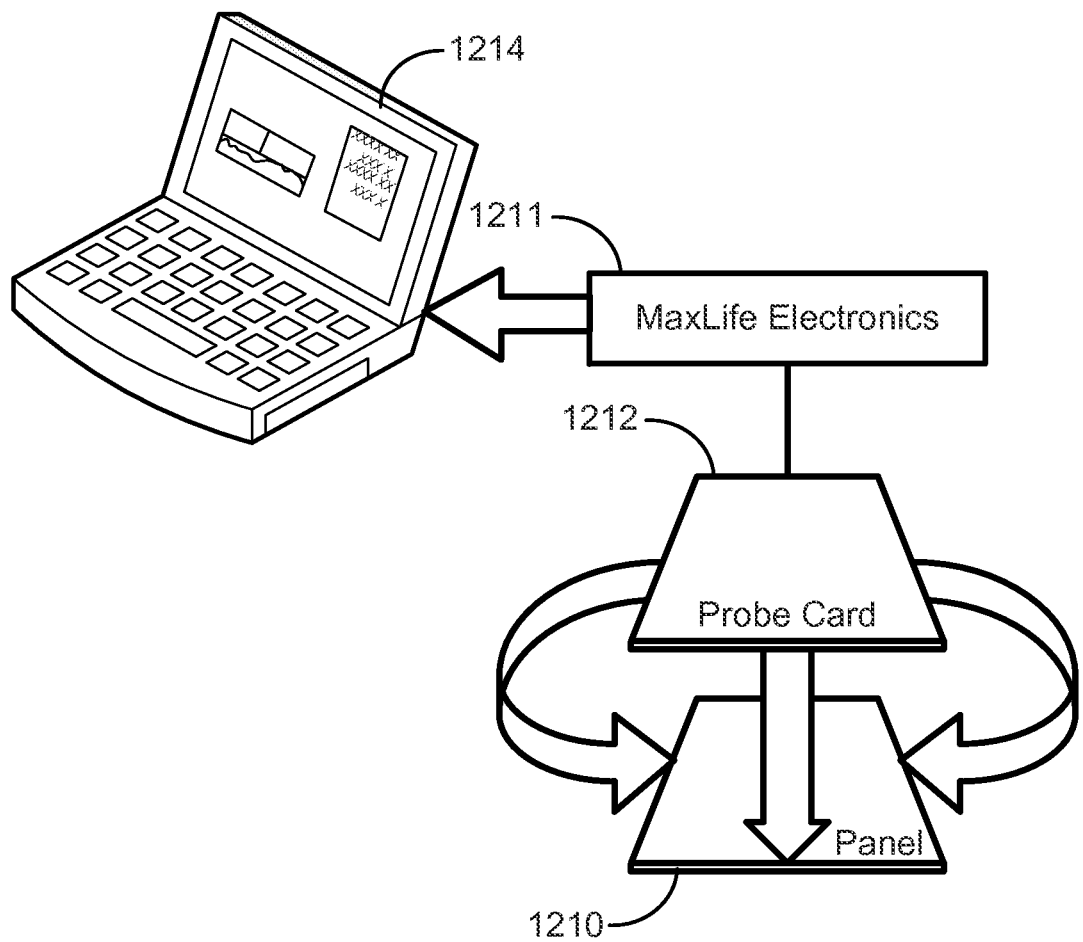
FIG. 19 is a diagrammatic perspective illustration of a display panel adapted to receive a probe card.

FIG. 19 illustrates a system for inspecting an OLED display panel 1210 at one or more stages of the fabrication of the panel 1210 (e.g., a TFT backplane, a fully fabricated panel, or a fully completed and sealed panel). The display panel 1210 is coupled to a computer 1214 through measurement electronics 1211 and a probe card 1212, to provide the capability of testing and verifying the panel at each processing step. For example, after finishing the TFT backplane, the probe card system can be used to measure the performance of the TFT backplane by itself. If the TFT backplane is acceptable, then the panel 1210 is passed to the next step which can be the OLED deposition stage. After the OLED deposition is completed, the panel 1210 can be measured for proper OLED deposition before sealing. After sealing, the panel 1210 can be measured again before it is sent to an assembly process.

Figure 20:
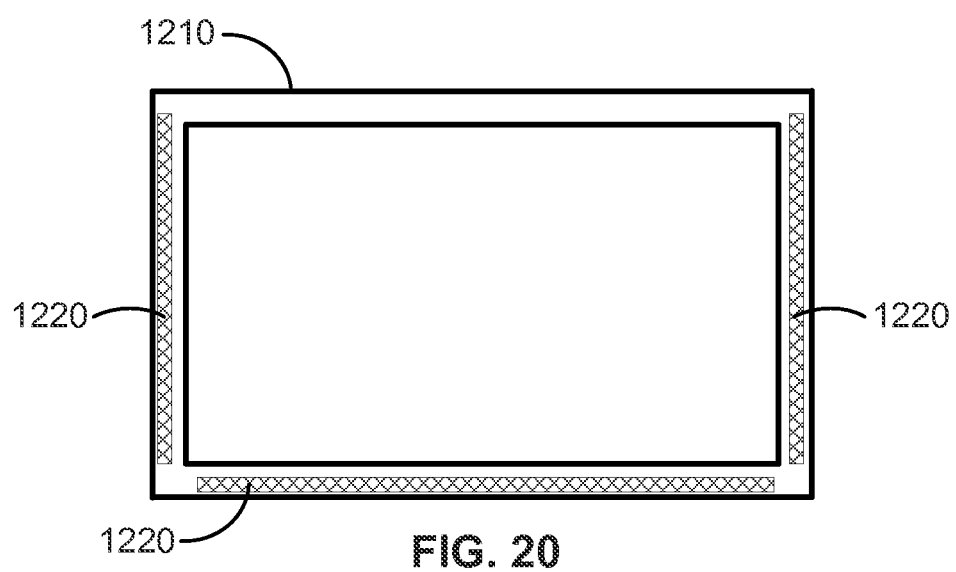
FIG. 20 is a diagrammatic front elevation of the display panel shown in FIG. 1, showing the locations of probe pads for receiving probe cards.

As can be seen in FIG. 20, the illustrative display panel 1210 has probe pads 1220 formed along three of the four edges of the panel. Probe pads can also be formed inside the panel, preferably before the OLED deposition stage. The probe pads 1220 are used to supply test signals to the numerous pixel circuits on the display panel 1210, via bonding pads 1230 formed at the outer ends of the various signal lines leading to the pixel circuits.

Figure 21:
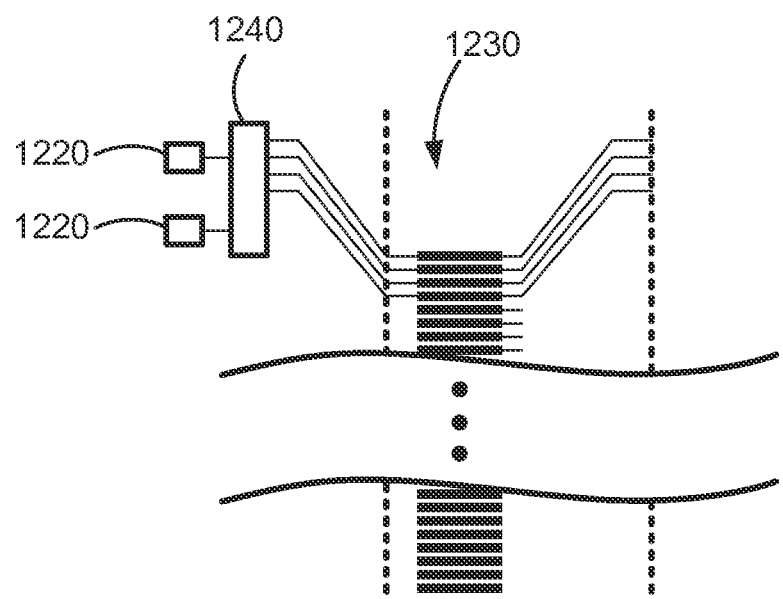
FIG. 21 is a diagram of a pair of probe pads connected to a multiplexer used to supply probe signals to the probe pads.

FIG. 21 illustrates the connection of the probe pads 1220 to the bonding pads 1230 through a multiplexer (MUX) 1240, to reduce the required number of probe pads, which in turn permits the pad pitch to be increased. To ensure that the other signals connected to the probe pads 1220 are biased properly, the MUX 1240 needs to be capable of connecting each probe pad 1220 to a common signal (Vcom) for each group of signals (e.g., source signals, gate signals, etc.).

Figure 22:
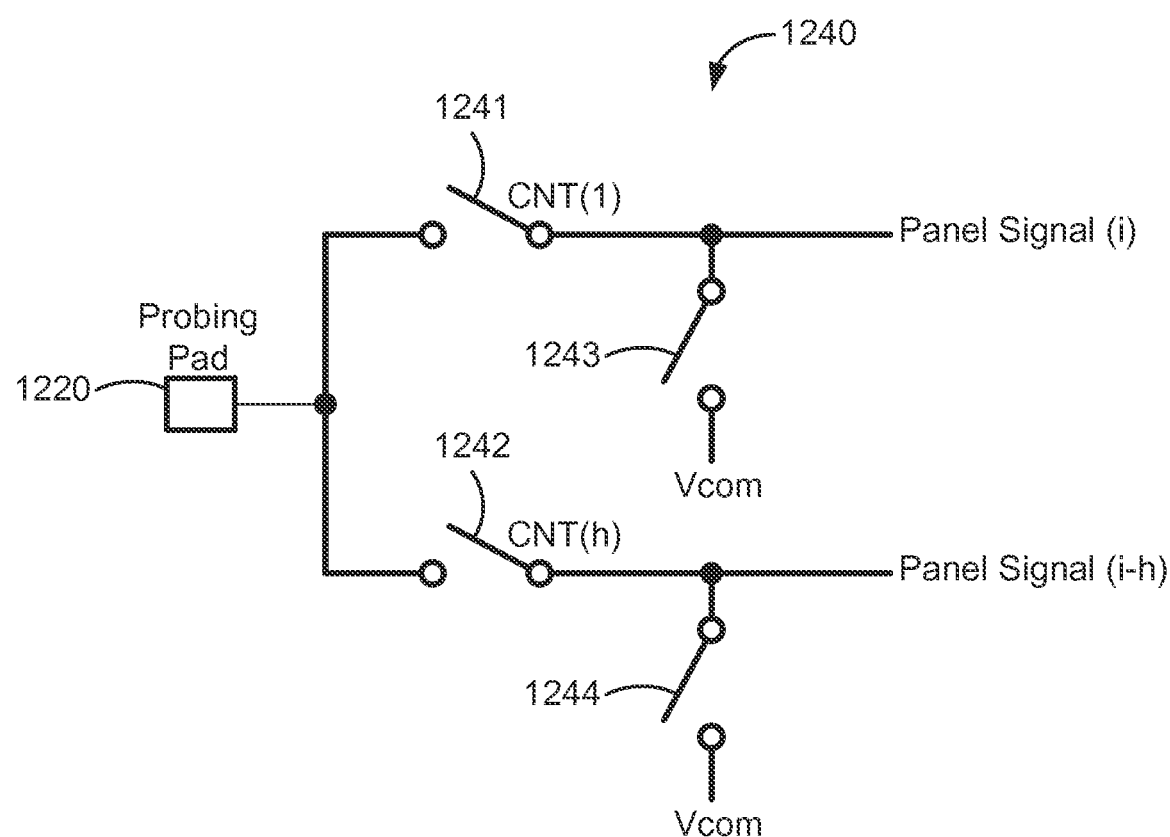
FIG. 22 is a schematic circuit diagram of one of the probe pads illustrated in FIG. 3 connected to receive the display signals.

FIG. 22 illustrates a MUX 1240 with common signal control and two or more panels signals for each probe pad 1220. FIG. 22 illustrates h panel signals connected to one probe pad 1220, thus requiring 2h controlling signals for connection to the probe pads 1220 or connection to the common signals. The connections of the panel signals to the probe pad 1220 are controlled by first switches 1241 and 1242, and the connections of the common signals Vcom to the panel signal lines are controlled by second switches 1243 and 1244.

The proper pad pitch for full panel probing is typically about 150 µm. As illustrated by the data in Table 1, the pad pitch for most conventional configurations meets the minimum pad pitch requirements. However, using multiplexing ratios of 2:1 or greater permits the pad pitch to be increased, resulting in much simpler probe cards, as also illustrated by the data in Table 1:

TABLE 1

Pad pitch for different display sizes and resolutions.

| Panel | MUX | Gate Pad Pitch (µm) | Source Pad Pitch (µm) | EIC Pad Pitch (µm) |
|---|---|---|---|---|
| 55" HD | 1:1 | 295 | 330 | 330 |
| 55" HD | 2:1 | 592 | 661 | 661 |
| 55" HD | 8:1 | 2370 | 2645 | 2645 |
| 55" UD | 1:1 | 148 | 165 | 165 |
| 55" UD | 2:1 | 295 | 330 | 330 |
| 55" UD | 8:1 | 1185 | 1132 | 1132 |
| 78" UD | 1:1 | 222 | 222 | 222 |
| 78" UD | 2:1 | 444 | 445 | 445 |
| 78" UD | 8:1 | 1777 | 1781 | 1781 |

Figure 23:
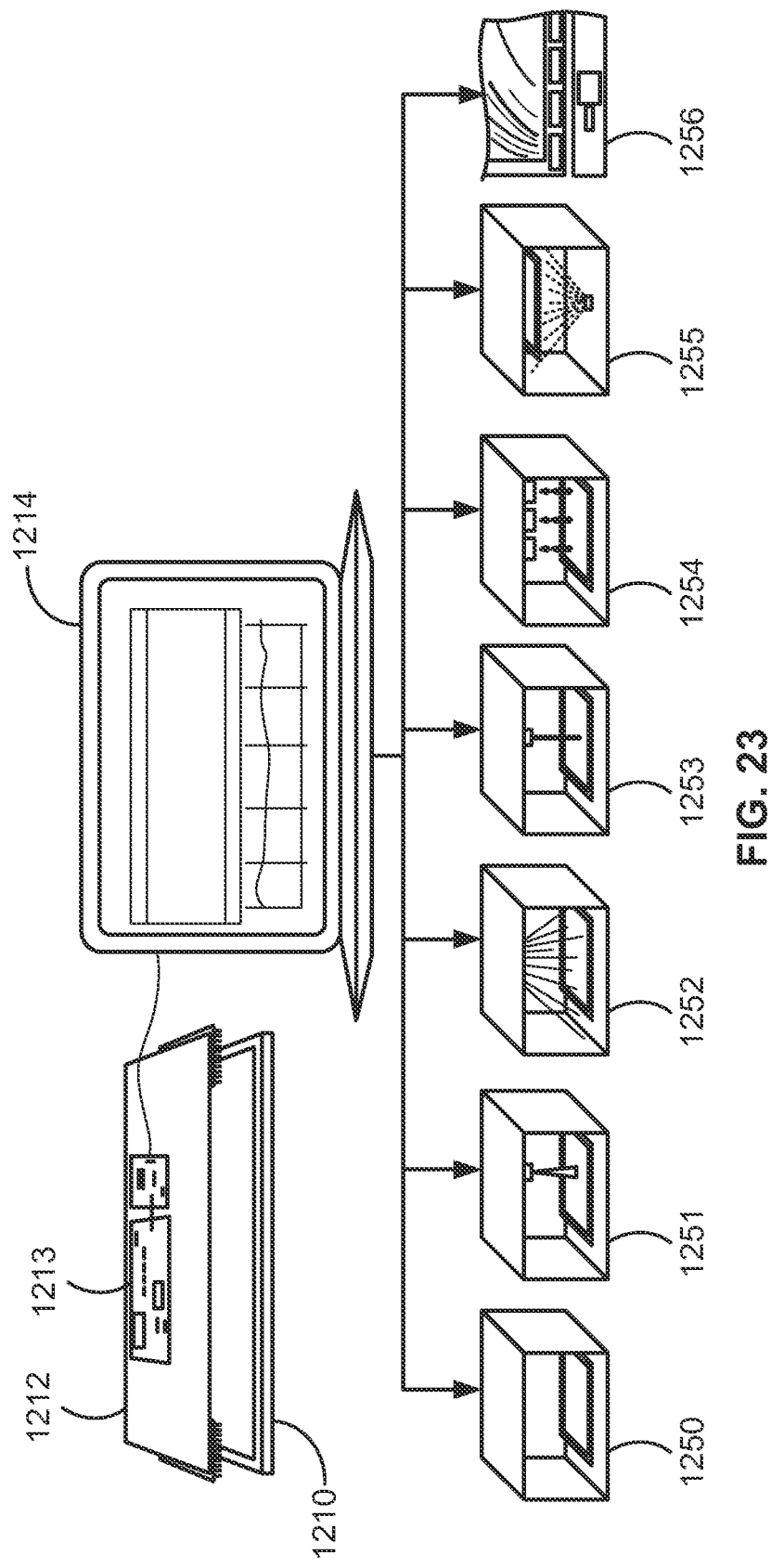
FIG. 23 is a diagrammatic illustration of an inspection system for taking measurements of an AMOLED panel, and various corrective actions that can be taken to fix defects identified by analysis of the measurements.

As depicted in FIG. 23, an electronic measuring system 1213 mounted on the probe card 1212 can measure the electrical characteristics of every TFT and every OLED device in a display panel 1210 and identify defects and non-uniformities. This data is supplied to a GUI 1214, where the data can be used to fine-tune every process step, to achieve higher yields, faster process ramp-up, and lower line monitoring costs. Examples of the various process steps that can be fine tuned are illustrated in FIG. 23, namely, a sputtering and PECVD module 1250, a process annealing module 1251, a patterning module 1252, a laser repair module 1253, an inkjet printing module 54 and an evaporation module 1255. The end result is a complete display panel 1256.

The circuitry depicted in FIG. 23 takes data from the measurement electronics 1213, analyzes that data, and displays it in a wide variety of reports, tables, and pictures. Some of the views are described in the following table:

| View | Description |
|---|---|
| TFT Absolute LUT | View the absolute measurement replacement values for each pixel on the panel. |
| TFT Filtered LUT | View the filtered replacement values used to calculate delta values. |
| TFT Base LUT | View the factory shipment values of the panel to determine how much the pixels have aged (baseline). |
| TFT Delta LUT | View the difference between the current average measured value and the baseline values (used to determine compensation). |
| TFT Histogram LUT | View the number of times a pixel has been measured since the last time the histogram was reset. This lookup table is primarily used for priority scan algorithm. |
| TFT Pixel State LUT | View either the current state of the measurement state machine or the last comparison values for each pixel. |
| TFT Region Priority | Show the priority of each region in the priority scan algorithm. |
| OLED Absolute LUT | View the absolute measurement replacement values for each pixel on the panel OLED layer. |
| OLED Filtered LUT | View the filtered replacement values used to calculate delta values. |
| OLED Base LUT | View the factory shipment values of the panel to determine how much the pixels have aged (baseline). |
| OLED Histogram | View the number of times a pixel has been measured since the last time the histogram was reset. |
| OLED Pixel State | View either the current state of the measurement state machine or the last comparison values for each pixel. |
| OLED Region Priority | Show the priority of each region in the priority scan algorithm. |
| Dead Pixels LUT | Show which pixels were either dead at point of manufacture or have since been determined to be unresponsive. Note that dead pixels are not compensated. |
| Combine Delta LUT | The combined TFT and OLED delta values used to determine the final compensation. |
| Scratch LUT | A temporary LUT View to allow users to manipulate the data without making modifications to the system tables or to simply "backup" a table. |
| Statistics | Reports the performance statistics and the current frame rate. Use these statistics to compare the time required to process and display the current data in MaxLife Viewer vs. the time it would actually take if the display was not required. |
| Pixel Trends | View the pixel state to determine if there are unsettled pixels and view comparative levels. Allows you to obtain a visual representation of uncertainty zones and look at specific defective pixels. Use this option to obtain active measurements over time; determine how many times a pixel was measured before it settled. |
| Uniformity Report Offset | Select a LUT table, then analyze the uniformity. |
| Characterization | Plots the V-to-I voltage DAC code to the probability of a comparator result flip. |
| Hardware Configuration | View the current hardware configuration parameters. |
| Display Controls | Adds the Display Controls to the bottom of the current tab. These options allow you to set the frame refresh rate in frames per second. Drag the slider to the left or right to speed up or slow down the refresh rate. Slower speeds are more visible to the naked eye. |
| CLI View | Issues commands from MaxLife Viewer to the system. |

A wide variety of different circuitry and algorithms may be used for extracting measurements of different parameters from the display panel at different stages of its fabrication, such as the extraction systems described in U.S. patent application Ser. No. 13/835,124 filed Mar. 15, 2013 and entitled "Systems and Methods for Extraction of Threshold and Mobility Parameters in AMOLED Displays," which is incorporated by reference herein in its entirety.

The inspection system can identify many potential defects and problems (e.g., with sputtering and PECVD steps, that can be used to identify the likely cause of the defect or problem so that the fabricating process can be immediately fine-tuned to correct the problem). Examples of such issues and their likely causes are the following:

| Issue identified by MaxLife ™ inspection system | Likely cause |
|---|---|
| Line defect (open circuit on metal lines) | Particle defect during deposition, poor adhesion, contaminated substrate and poor step coverage. |
| High resistance or non-uniform resistance on metal lines | Non-uniform sputtering process, contaminated sputter gas or process chamber. |

-continued

| Issue identified by MaxLife ™ inspection system | Likely cause |
| --- | --- |
| Non-uniform TFT contact resistance | Problem with n+ layer PECVD step, incomplete via etch or photoresist stripping process. |
| Vt or mobility of TFTs out of specification | Problem with a-Si layer PECVD step (contamination during deposition, process parameter drift or film stress) |
| Open TFT channel | Problem with a-Si or n+ layer deposition (particle contamination during deposition/contaminated substrate) |
| Gate shorted to fixed voltage | Incomplete metal patterning and/or damaged dielectric layers from particles or ESD |
| Source or gate shorted to drain | Damaged dielectric layers (pinholes) from particles or ESD |
| Open or high resistance contacts | Incomplete via etching. |
| Out of spec capacitance | Non-uniform dielectric layer deposition or drift in deposition process parameters. |
| Line defect (crossover short) | Pinhole in the dielectric layers from particles or ESD |

For defects that cannot be directly identified by a single measurement of the inspection system, the first measurement can reveal that a problem exists, and specify additional tests that will conclusively identify the exact defect. One example is the identification of line defects, which can be detected by any of the following procedures:
1. Measuring the current of different lines: if the current is higher than a threshold, the pixel is shorted.
2. Applying pulse to measure the charge transfer: if the amount of charge transfer is smaller than a threshold, the line is open.
3. For a signal with connection to DC current (e.g., Vdd and Vmonitor), the current can be measured to detect the open defect Defects in the thin film transistors (TFTs) can also be detected. For example, in the situation where the pixel circuit in FIG. 24 has a signal WR measured as high (while Vdata=high, and also while Vdata=low, and Vdd=high), an additional test needs to be performed. Table 1 shows the different conditions and what the results mean.

To detect problems with process annealing, the exact Vt and mobility of each TFT can be used to adjust process annealing parameters, as follows:

| Issue identified by MaxLife ™ inspection system | Likely cause |
| --- | --- |
| Vt and/or mobility of TFTs is higher or lower than specification | Laser power drift |
| Small scale non-uniformity of Vt and/or mobility of TFTs | Intermittent laser power output |
| Large scale non-uniformity of Vt and/or mobility of TFTs | Laser repeatability |

The number and types of defects can be used to identify problems in patterning (particles, under/over exposure, etc.), as follows:

| Issue identified by MaxLife ™ inspection system | Likely cause |
| --- | --- |
| High-resistance metal lines | Pattern definition or metal etch process. Poor line width control. |
| Open or high resistance contacts | Poor via pattern definition/photoresist residue |
| Gate shorted to fixed voltage | Pinholes in the dielectric layers. |
| Abnormal capacitance or resistance in corners of panel | Mask alignment error (rotation), photoresist thickness non-uniformity. |
| Large scale capacitance or resistance, non-uniformity | Pattern alignment error or exposure power fluctuation. |
| Adjacent metal lines shorted | Particles in photoresist/pattern definition. |
| Pattern stitching defects | Stepper alignment failure |
| Repetitive defect | Exposure masks damage or contaminated. |

The defect location and defect type can be used to pinpoint areas suitable for laser repair (removing material) or ion beam deposition (adding material), as follows:

| Issue identified by MaxLife ™ inspection system | Repair Step |
| --- | --- |
| Gate shorted to fixed voltage | Give exact pixel location to laser repair system |
| Short on metal lines | Identify the metal lines that are shorted. |
| Open circuit on metal lines | Identify the metal lines that are open. |
| Open or high resistance TFT contacts | Quickly identify the number and location of the defective pixels. |

The uniformity data can also be used to continuously calibrate each print head used for inkjet printing, in real-time. The system knows which print head was used to print each pixel, and thus problems with individual print heads can be detected. The print head used to print those pixels can then be immediately adjusted, as follows:

| Issue identified by MaxLife ™ inspection system | Likely cause |
| --- | --- |
| Dead pixels | Printhead occasionally putting down too little material, causing shorts |
| Stuck-on pixel | Printhead occasionally putting down too little material |
| High-resistance pixels | The printhead printing those pixels may be putting down too much material |
| Uniformity of OLED's voltage is poor | Flow control of printhead malfunctioning |

The exact failure mode of every OLED device can be used to tune the evaporation process, as follows:

| Issue identified by MaxLife ™ inspection system | Likely cause |
| --- | --- |
| All pixels from one printhead are too high (or too low) resistance | Problem with calibration of printhead |
| Short-circuit OLED | Too little organic material being deposited, causing shorts |
| High-resistance pixels | Too much organic material being deposited |
| OLED voltage too high | Too much organic material being deposited |

-continued

| Issue identified by MaxLife ™ inspection system | Likely cause |
|---|---|
| Long-range Uniformity of OLED's voltage is poor | Problem with substrate rotation or evaporator too close to substrate |
| Short-range uniformity of OLED's voltage is poor | Problem with thermal evaporation temperature control |
| Open-circuit OLED | Particles during evaporation |
| Short to cathode or anode | Particles during evaporation |
| Partial short (low resistance) | Too little organic material being deposited |

The electrical characteristics (collected during TFT and OLED inspection) can be loaded into a lookup table, and used to correct for all TFT and OLED non-uniformities.

Additional defects can be identified once both the OLEDs and TFTs have been deposited. The first measurement can identify that a problem exists, and specify additional tests that will conclusively identify the exact defect.

If test samples are created around the periphery of the panel, then more details about the global process parameters can be extracted. Typically this is done by cutting off the test samples from a small percentage of displays and putting them in a separate characterization system. However, with the present inspection system, this can be done as part of panel characterization, for every panel, as follows:

- Metal lines can be created and resistance measured. This can test both metal deposition steps and etching.
- Semiconductor layers to be annealed can have their characteristics and uniformity tested.
- Structures can be used at different locations around the panel to test alignment.
- OLED structures can be used to test evaporation and inkjet printing steps.

The traditional diagnostic tools used in light modulating displays (e.g. AMLCD) are not useful for emissive displays (e.g. AMOLED). This is mainly due to the significant difference between modulating pixels and emissive pixel structure. In addition, emissive pixel circuits are more complicated and so using traditional optical diagnostic tools cannot identify the details.

Although for repair and defect analysis multiple tests are needed, to avoid the delay required for a detailed scan on all the semiconductor device, a quick scan is done to identify the faulty entities (in an array case, the entities are pixels and signal lines). If the detected defects are within acceptable preselected thresholds, the fabrication process is continued. If at least one defect category passes an acceptable threshold, a more detailed scan is conducted to identify the defects in more detail to determine whether the detected defects can be repaired. If the answer is affirmative, the defects are repaired, and then the fabrication process is continued.

The thresholds can be dynamic. For example, if two different defects are detected, the threshold of each defect can be different from when only one defect is detected in the panel.

The detailed scan can be optimized based on the results of the quick scan. For example, if the quick scan has not detected any line defects, the line tests can be avoided in the detailed scan.

In the quick scan, one (or more than one) voltage or one (or more than one) current from a pixel is measured. If the measured values of a pixel are within acceptable ranges, the pixel passes the quick scan. If the measured values of a pixel are outside the acceptable range the pixel is tagged as faulty.

The measured voltages or currents are preferably affected by most of the possible defects. For example, the current supplied to a light emissive element and/or the voltage at the connection between a pixel circuit and an emissive element are good candidates for the quick scan measurement.

One example of a quick scan begins by defining a reference current or voltage that is the lowest level encountered in a normal pixel. Alternatively, the reference current or voltage may be lower than the lowest level encountered in a normal pixel, by a defined margin. The measured pixel current or voltage is then compared with the reference level. If the measured value is larger than the reference value, the pixel passes this test. If the measured level is smaller than the reference level, the pixel fails this test. The result of the test can be different based on the measured parameter. For example, if the measured value is the drive TFT current, the TFT can be open, whereas if the measured value is the OLED current, the OLED can be shorted.

Alternatively, the pixel may pass the test if the measured value is smaller than the reference value. If the measured level is larger than the reference level, the pixel fails this test. Here again, the result of the test can be different based on the measured parameter. For example, if the measured value is the drive TFT current, the TFT can be open, whereas if the measured value is the OLED current, the OLED can be shorted.

A combination of the two tests can reveal more defects.

Figure 24:
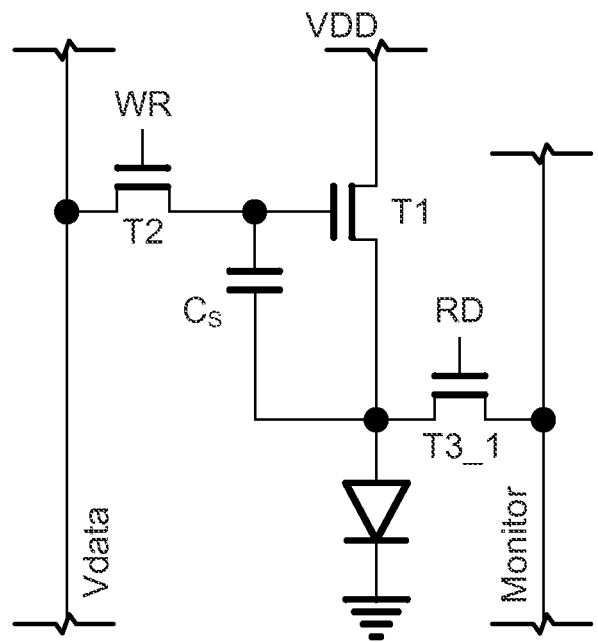
FIG. 24 is a schematic circuit diagram of a pixel circuit having a signal WR.
Figure 25:
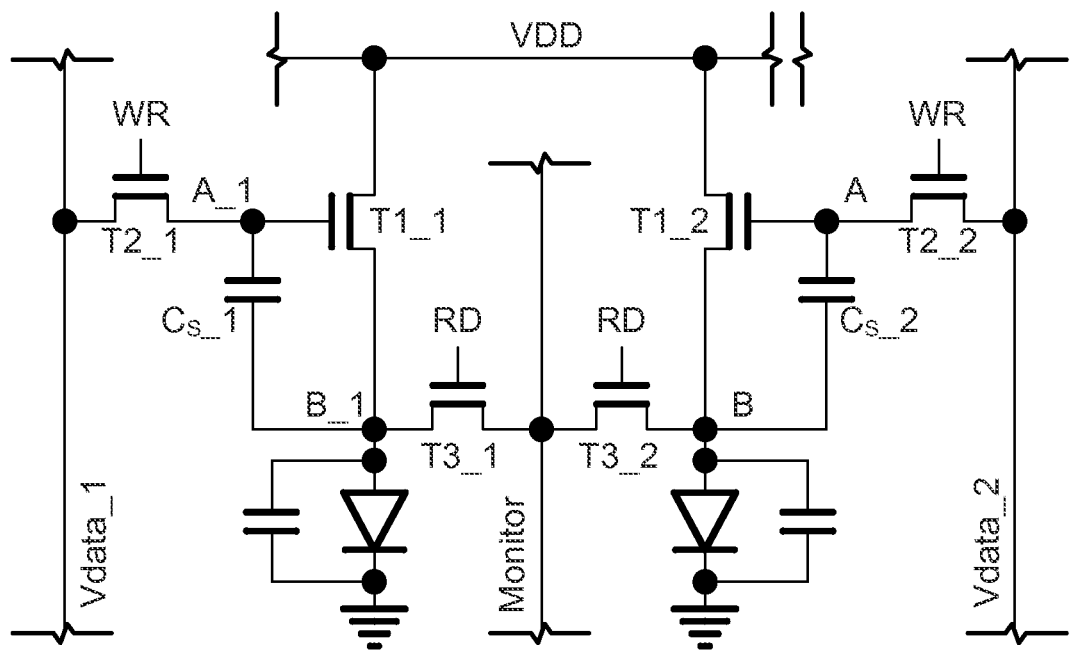
FIG. 25 is a circuit diagram of a pair of pixel circuits suitable for inspection.

The detailed scan may be carried out with either a separate bias (monitor) line, as depicted in FIG. 24, or with a shared bias (monitor) line, as depicted in FIG. 25.

When conducting a line scan with a separate monitor line, if the number of faulty pixels in a column or row is more than a threshold, that row or column is tagged with a possible faulty line. Other examples of identifying defective columns are the following:

1. If a column or row is shorted to another column or row, one can measure the current of the two of them (or the driver) while all the column (or row) has the same voltage and measure the current when at least one of the lines has a different voltage. In the case of a short, the current needed to drive the two lines will be higher.

2. If the two columns are shorted, programming one pixel in a row will affect the other pixel current/voltage (despite programming the said other pixel for a different current/voltage such as zero). In this case, measuring the current/voltage of the adjacent pixel can identify the shorted column (or row).

3. The static current (voltage) going to each line can be measured under different biasing conditions. This static current (voltage) can be measured indirectly through its effect on the driver currents. For example, if the driver operating current changes dramatically with changes in the biasing condition of one line (or is higher than a threshold), that means the line is shorted.

4. The transient current (voltage) is measured. If the measured current is not within a threshold range, the line can be tagged as open. For example, if a transient voltage (current) signal is applied to the monitor line, it will create a transient current (voltage) as a function of parasitic capacitance. Knowing the range of parasitic capacitance, the range of current (voltage) can be calculated. If the current (voltage) is out of that range, one can tag the line as open. Another method to estimate the signal range is to do the measurement for the entire panel, and the outliers can be detected and tagged as open (if smaller than the range) or shorted (if larger than the range).

5. A line is charged to a voltage. Knowing the range of parasitic capacitance of the line, one can estimate the range of charge stored in the line. Measuring the line charge stored in the line and comparing it to the range can indicate whether the line is short, open or normal. If the charge is smaller than the estimated range, the line is open. If the charge is within the range, the line is normal. And if the charge does not change, the line is shorted. Another method to estimate the charge range is to do the measurement for the entire panel, and the outliers can be detected and tagged as open (if smaller than the range) or shorted (if larger than the range).

When testing the transistor T2 and T3 with a separate monitor line as depicted in FIG. 24, the test procedure can be used for other generally-OFF biasing switches which connect a bias line to the signal during programming cycles. Here, the signal can be the signal from Vdd or a signal through the monitor line. Both static and dynamic test procedurse can be used, as follows:

Static:
1. switch is ON
2. bias voltage is high or bias is low
3. switch turns off
4. bias voltage keeps its (if it is high during programming goes low and vice versa)

Dynamic: switch goes high and after programming it goes to off (bias voltage=low) to:
1. switch is ON
2. bias voltage is high or bias is low
3. switch turns off
4. bias voltage is changed its (if it is high during programming goes low and vice versa).

If at least one measured current or one measured voltage is typically affected by bias voltages, and the switch performance is the same for high and low bias voltage in a static case, the switch is likely open. If this is not the case, and the current or voltage is not the same for the corresponding cases in static and dynamic operation, then the switch is likely shorted.

A detailed scan procedure for a drive transistor (e.g., T1) is as follows:

Measure the current or voltage of the TFT at at least one operation point.
1. If the currents (voltages) are high at all the points, T1 (drive TFT) is shorted.
2. If the currents (voltages) are normal at all the points, T1 (drive TFT) is normal.
3. If the currents (voltages) do not change and are similar to a zero operation point, and the switch test is working, T1 (drive TFT) is open.
4. If the currents are negative (or different direction of the TFT) (or voltages are low), the OLED is shorted.

Some of the conclusions can be made with measurement at just one point.

A detailed scan procedure for an OLED is as follows:

Measure the current or voltage of the OLED at at least one operation point.
1. If the currents are high (or voltage is low) (in OLED direction), the OLED is shorted.
2. If the currents (voltages) are normal, the OLED is normal.
3. If the currents (voltages) do not change and are similar to a zero operation point, and the switch test is working, the OLED is open.
4. If the currents are positive (or different direction of the OLED) (or voltages are high), the TFT is shorted.

When using a shared monitor line as depicted in FIG. 25, the test procedures described above for a line scan can be applied. In addition, if the data lines are shorted between two pixels with shared monitor lines, the two pixels will result in the same current (or voltage) independent of which data line is used to program the two pixels. This can be used to identify the short data line defect. If the line used for measurement is shared with a plurality of pixels and it is not possible to separate it from the element under test with any switch for some pixels, different approaches are needed for measuring different defects.

For group tests, any of the above tests on a drive TFT and/or an OLED can be used for groups of TFTs and/or OLEDs. The only difference is that the results will show the collective performance of the devices. For example, it can identify that one of the drive TFTs or OLEDs in a group is defective.

For discriminating tests, the following examples use a monitor line shared between a small number of adjacent pixels in a row (controlled with the same RD and WR signals), and they can be applied to other similar structures.

To measure a device that can be turned off with other control signals (e.g., drive TFT through Vdata), the device of one pixel stays active, and the devices in other pixels are turned off. In this case, tests similar to those used for pixels with separated lines can be performed. For example, measuring a drive TFT in a pixel can be done as follows:

1. Measure the current (voltage) of a drive TFT (T1) at one (or more) operational points while the drive TFT of other pixels connected to the same monitor lines are off.
2. Repeat step (1) for all the drive TFTs of the pixel connected to the same monitor line.
3. If the currents (voltages) are within normal range, all the drive TFTs are fine.
4. If the measured currents (voltages) of a pixel connected to the monitor line are not changing and are similar to a zero operation point, the drive TFT of that pixel is likely open (assuming the switch TFT tests passed).
5. If the measured currents (voltages) are high and their level is not changed by a pixel sharing the monitor line, the drive TFT of that pixel is likely shorted. For example, if T1_1 is shorted, when the current of T1_1 is measured (T1_2 is off), the current will be $I_{short}$. When T1_2 is measured, the current will be $I_{short} + I_{T1\_2}$. As can be seen, only a change in the operation point of T1_2 can affect the measured current.
6. If the currents (voltages) are low for all the sub-pixels but the current changes slightly at different operation points, the OLED is likely shorted. For example, if the OLED connected to T1_1 is shorted, the current measured for T1_1 and T1_2 will be $I_{short} - I_{T1\_1}$ and $I_{short} - I_{T1\_2}$, respectively. The measured current will change by changing the operation points of the TFTs, but the current will be much lower than the normal case.

When testing biasing switches as analog devices, the ON voltages of the switches are set to voltages that push the switches into the saturation regime of operation. As a result, if the drive TFT or OLED is shorted to a fixed voltage, the current (or voltage) will not saturate the measurement device, and the effect of adding the current (or voltage) of other pixels into the line will be more substantial. For example if T1_1 is shorted, the voltage at B1_1 will be almost Vdd. When measuring T1_1, the current will be $I_{T3\_1}$ since T3_1 is in saturation and controls the current. When measuring T1_2 (the voltage at node A_2 can be high enough to make T1_2 full ON), the current will be $I_{T3\_1} + I_{T3\_2}$. Therefore, T1_1 is likely shorted, based on the two measured results. The same operation can be used to determine whether an OLED is shorted.

To reduce the effect of one of the biases of the devices that might be shorted, the voltage connected to an OLED, such as Vss, may be set close to the voltage of a monitor line so that it has minimal effect on the TFT measurement. Similar settings can be done for TFT shorts, by setting Vdd close to the voltage of a monitor line.

The effect of an OLED (or TFT) may be transferred on another device (e.g., a drive TFT). For example:

1. All the drive TFTs in pixels sharing a bias line (monitor line) are off except for one pixel.
2. The voltage of at the electrode of the OLED is allowed to be set by the OLED (e.g., the switches that affect the voltage are off, for example, in the case of the pixel in FIG. 2, T3_1 and T3_2 are OFF).
3. Then the current of the drive TFT is measured.
4. If the OLED is open, the current of the drive TFT will be close to zero (or the voltage at drive TFT terminal connected to the OLED will be high).
5. If the OLED is normal, the pixel current will be within a normal range.
6. If the OLED is shorted, another test may be needed (e.g., biasing switches to act as analog devices).

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of fabricating a plurality of active matrix organic light emitting device (AMOLED) display panels, each display panel to include a plurality of pixel circuits each including an organic light emitting device (OLED) and a pixel driver circuit, the plurality of display panels including first functionally defective display panels with acceptable functionally defective OLEDs or pixel driver circuits not exceeding preselected functional defect thresholds, and including second functionally defective display panels each with at least one functionally defective OLED or pixel driver circuit exceeding said preselected functional defect thresholds, the method comprising during an intermediate stage in the fabrication of said OLEDs and pixel driver circuits of each first functionally defective display panel, based on currents or voltages resulting from a first functional test scan of said first functionally defective display panel for functional defects not exceeding preselected current or voltage thresholds corresponding to said preselected functional defect thresholds, refraining from repairing an acceptable functional defect of the first functionally defective display panel and refraining from conducting a second functional test scan of said first functionally defective display panel, the second functional test scan different from and more detailed than the first functional test scan of said first functionally defective display panel, the currents or voltages received during the intermediate stage over a monitor line of the first functionally defective display panel from the OLEDs or pixel driver circuits of the first functionally defective display panel;
subsequent to said intermediate stage in the fabrication of said OLEDs and pixel driver circuits of each first functionally defective display panel, continuing fabrication of the first functionally defective display panel;
during an intermediate stage in the fabrication of said OLEDs and pixel driver circuits of each second functionally defective display panel, based on current or voltage resulting from a first functional test scan of said second functionally defective display panel for functional defects exceeding preselected current or voltage thresholds corresponding to said preselected functional defect thresholds, conducting a second functional test scan of said second functionally defective display panel, the second functional test scan different from and more detailed than the first functional test scan of said second functionally defective display panel and repairing a functional defect of a functionally defective OLED or pixel driver circuit of the second functionally defective display panel, the current or voltage received during the intermediate stage over a monitor line of the second functionally defective display panel from the functionally defective OLED or pixel driver circuit of the second functionally defective display panel; and
subsequent to said intermediate stage in the fabrication of said OLEDs and pixel driver circuits of each second functionally defective display panel, continuing fabrication of the second functionally defective display panel.

2. The method of claim 1 further comprising
during said intermediate stage in the fabrication of said OLEDs and pixel driver circuits of each second functionally defective display panel and prior to said repairing, receiving a plurality of currents or voltages from a plurality of functionally defective OLEDs or pixel driver circuits of the second functionally defective display panel which exceed the preselected current or voltage thresholds, in which said preselected current or voltage thresholds are changed as the number of currents or voltages of the plurality of functionally defective OLEDs or pixel driver circuits of the second functionally defective display panel which exceed the preselected current or voltage thresholds received increases.

3. The method of claim 1 further comprising identifying the types of functional defects of the functionally defective OLED or pixel driver circuit of the second functionally defective display panel by driving the functionally defective OLED or pixel driver circuit to cause the generation of the current or voltage received over the monitor line during said conducting of said second functional test scan.

4. The method of claim 1 in which during said intermediate stage in the fabrication of said OLEDs and pixel driver circuits of each second functionally defective display panel, said functional defect is repaired with use of voltage received over a monitor line of the second functionally defective display panel from the functionally defective OLED or pixel driver circuit of a pixel circuit at a node of the pixel circuit connecting the pixel driving circuit of the pixel circuit to the OLED of the pixel circuit.

5. The method of claim 1 further comprising during the intermediate stage in the fabrication of said OLEDs and pixel driver circuits of each second functionally defective display panel, and prior to said repairing
receiving said current or voltage
from a functionally defective pixel driver circuit, when the OLED of the corresponding pixel circuit is off, to identify functional defects in the pixel driver circuits, or
from a functionally defective OLED, when a driving transistor of the pixel driver circuit for the corresponding pixel circuit is off, to identify functional defects in the OLED.

6. The method of claim 5 wherein the preselected current or voltage thresholds include preselected thresholds for the pixel driver circuits, the method further comprising subsequent to receiving said current or voltage from a functionally defective pixel driver circuit, determining whether the received current or voltage exceeds preselected thresholds for the pixel driver circuits.

7. The method of claim 5 wherein the preselected current or voltage thresholds include preselected thresholds for the OLEDs, the method further comprising subsequent to receiving said current or voltage from a functionally defective OLED, determining whether the received current or voltage exceeds preselected thresholds for the OLEDs.

8. The method of claim 6 wherein the preselected current or voltage thresholds include preselected thresholds for the OLEDs, the method further comprising subsequent to receiving said current or voltage from a functionally defective OLED, determining whether the received current or voltage exceeds preselected thresholds for the OLEDs.

\* \* \* \* \*